United States Patent
Fukui et al.

(10) Patent No.: US 7,843,014 B2
(45) Date of Patent: Nov. 30, 2010

(54) SMALL SIZE TRANSISTOR SEMICONDUCTOR DEVICE CAPABLE OF WITHSTANDING HIGH VOLTAGE

(75) Inventors: Yuji Fukui, Fukuyama (JP); Kazuhiko Yoshino, Fukuyama (JP); Satoshi Hikida, Nara (JP); Shuhji Enomoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/085,669

(22) PCT Filed: Nov. 29, 2006

(86) PCT No.: PCT/JP2006/323835
§ 371 (c)(1),
(2), (4) Date: Jul. 10, 2008

(87) PCT Pub. No.: WO2007/063908
PCT Pub. Date: Jun. 7, 2007

(65) Prior Publication Data
US 2008/0277723 A1    Nov. 13, 2008

(30) Foreign Application Priority Data
Nov. 29, 2005 (JP) .............................. 2005-344660
Mar. 23, 2006 (JP) .............................. 2006-081407

(51) Int. Cl.
*H01L 23/62* (2006.01)
*H01L 23/48* (2006.01)

(52) U.S. Cl. .................. 257/382; 257/754; 257/756
(58) Field of Classification Search ............... 257/754, 257/756, 382
See application file for complete search history.

(56) References Cited

U.S. PATENT DOCUMENTS

| | | | |
|---|---|---|---|
| 6,066,894 A * | 5/2000 | Yokozeki | 257/754 |
| 6,504,217 B1 | 1/2003 | Yokozeki | |
| 6,541,327 B1 | 4/2003 | Chan et al. | |
| 2005/0067662 A1 | 3/2005 | Lee et al. | |

FOREIGN PATENT DOCUMENTS

| | | |
|---|---|---|
| EP | 1 223 610 | 7/2002 |
| JP | 59-119045 | 7/1984 |
| JP | 04-056280 | 2/1992 |

(Continued)

*Primary Examiner*—Long Pham
*Assistant Examiner*—Steven H Rao
(74) *Attorney, Agent, or Firm*—Harness, Dickey & Pierce, P.L.C.

(57) ABSTRACT

In one embodiment of the present invention, a high withstand voltage transistor is disclosed having small sizes including an element isolating region. The semiconductor device is provided with the element isolating region formed on a semiconductor substrate; an active region demarcated by the element isolating region; a gate electrode formed on the semiconductor substrate in the active region by having a gate insulating film in between; a channel region arranged in the semiconductor substrate under the gate electrode; a source region and a drain region positioned on the both sides of the gate electrode; and a drift region positioned between one of or both of the source region and the drain region and the channel region. One of or both of the source region and the drain region are at least partially positioned on the element isolating region, and are connected with the channel region through the drift region.

26 Claims, 33 Drawing Sheets

FOREIGN PATENT DOCUMENTS

| | | |
|---|---|---|
| JP | 04-078170 | 3/1992 |
| JP | 04-158531 | 6/1992 |
| JP | 04-215480 | 8/1992 |
| JP | 08-078671 | 3/1996 |
| JP | 08-097411 | 4/1996 |
| JP | 10-200106 | 7/1998 |
| JP | 10-284730 | 10/1998 |
| JP | 2002-217130 | 8/2002 |
| JP | 2002-280551 | 9/2002 |
| JP | 2005-109479 | 4/2005 |
| KR | 1020050031120 | 4/2005 |
| TW | 489393 | 4/2001 |

* cited by examiner (a)

(b)

(c)

Figure 2-1
(a)
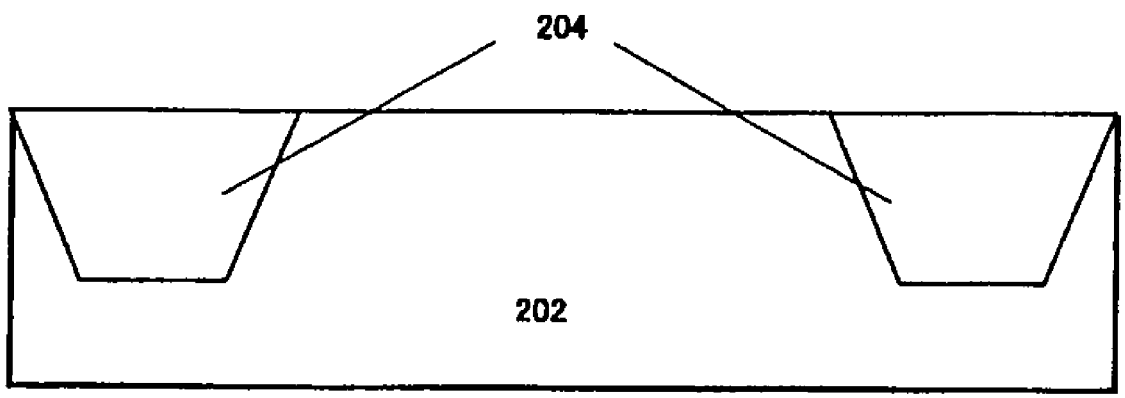
(b)
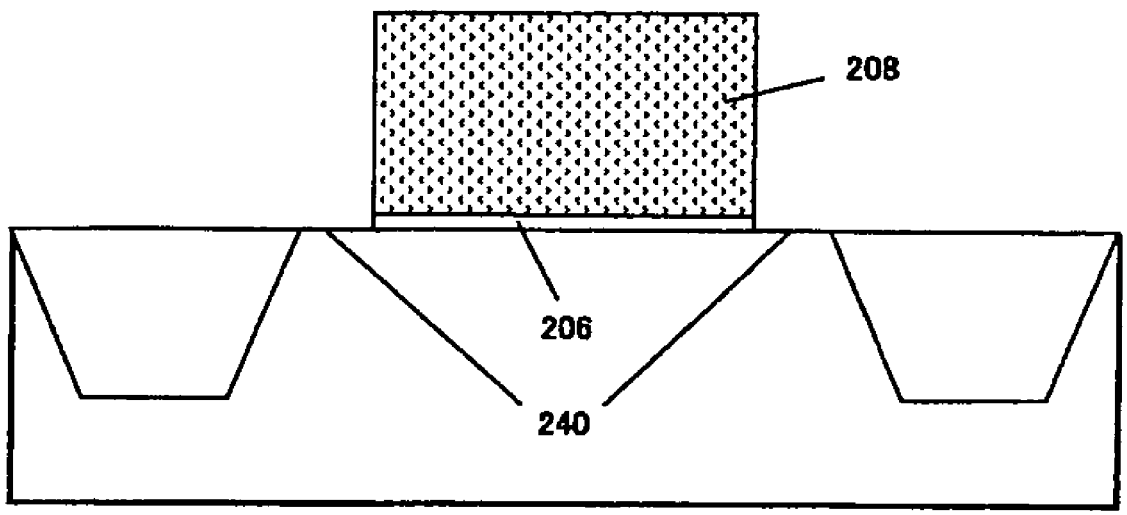
(c)
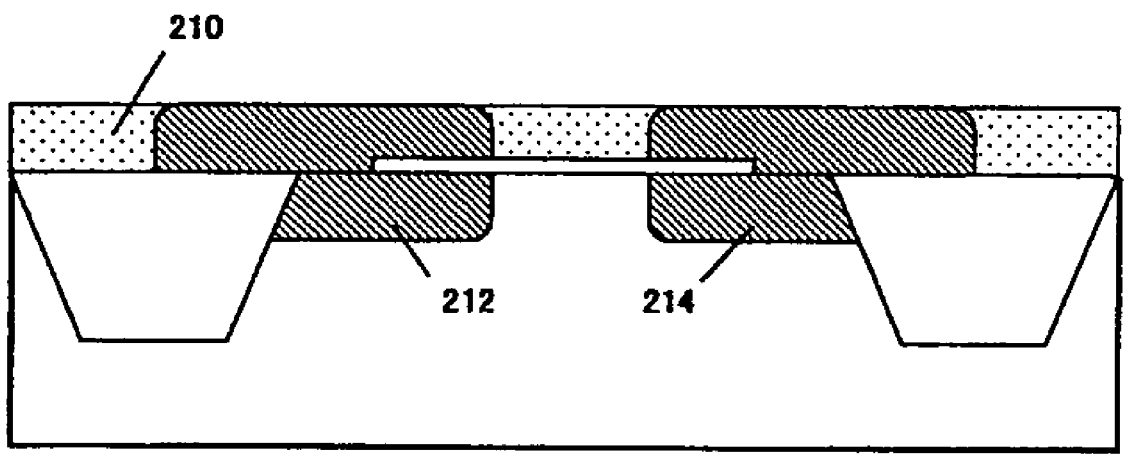

(d)

(e)

(f)

Figure 3-1
(a)
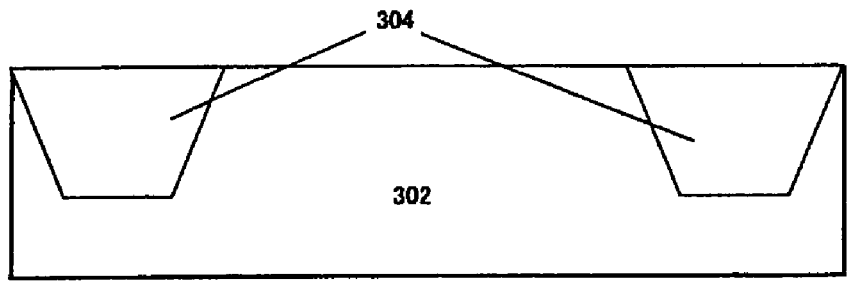
(b)
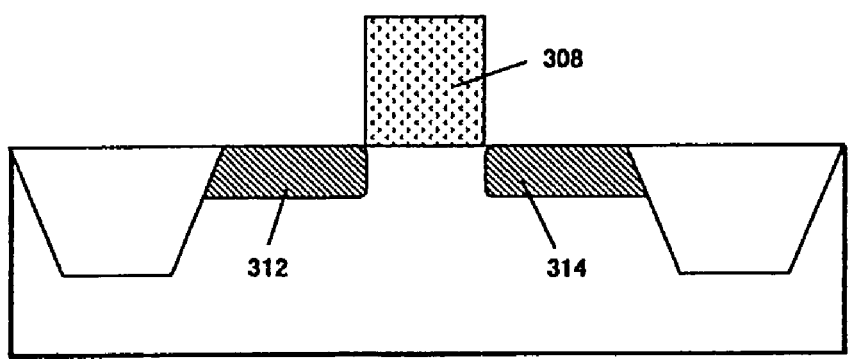
(c)
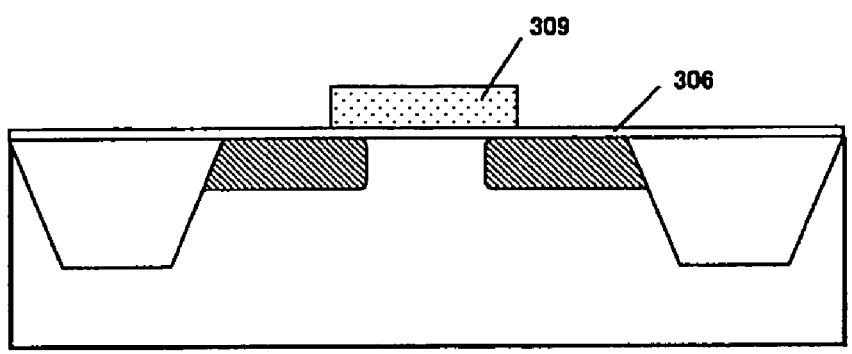
(d)
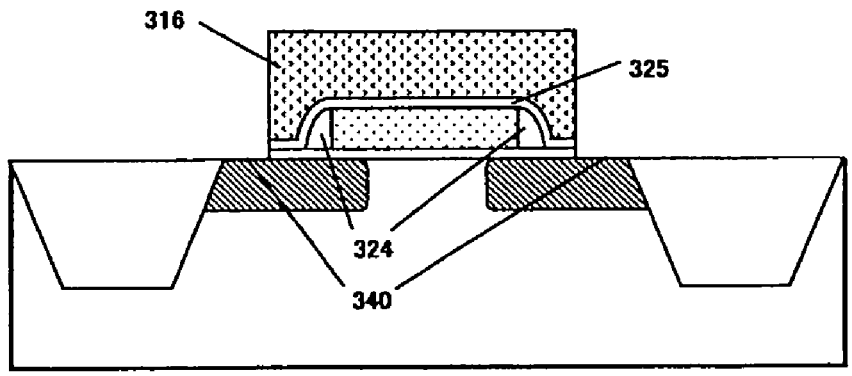

Figure 3-2
(e)
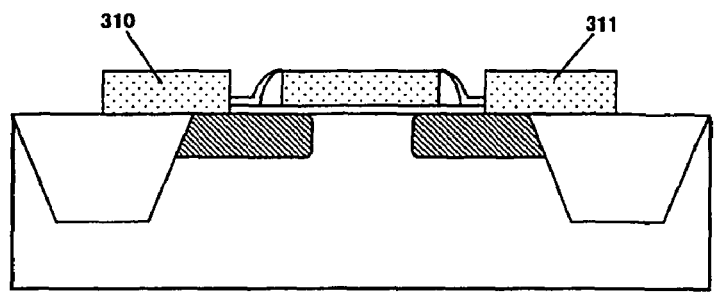
(f)
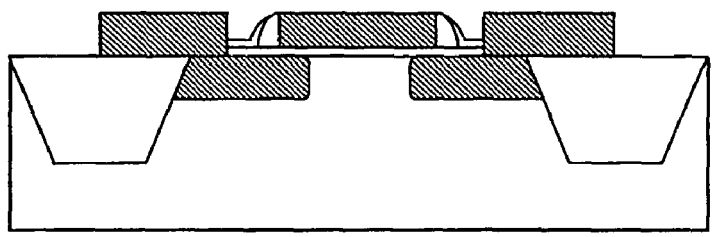
(g)
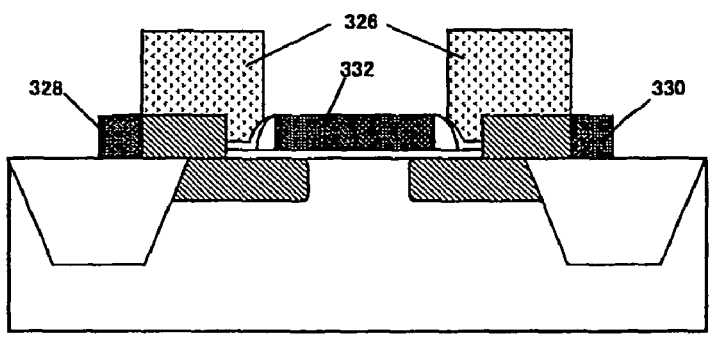
(h)
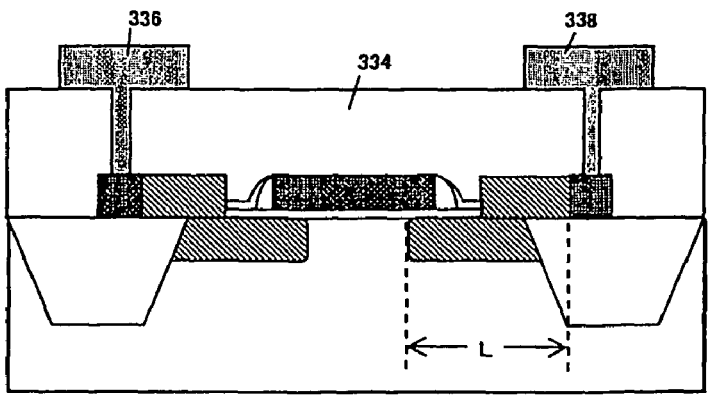

Figure 4-1
(a)
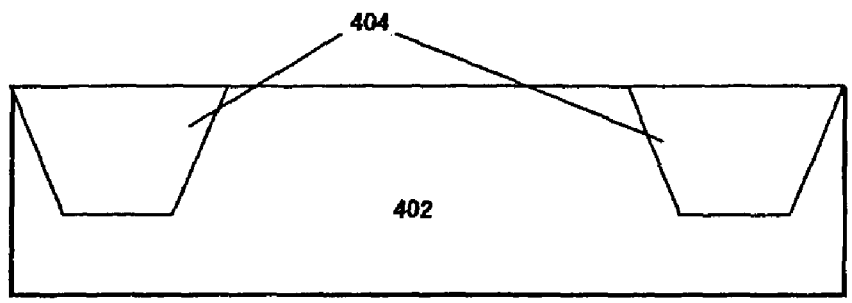
(b)
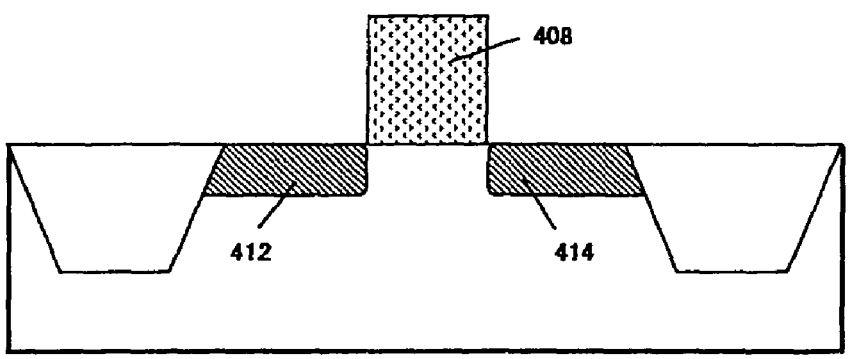
(c)
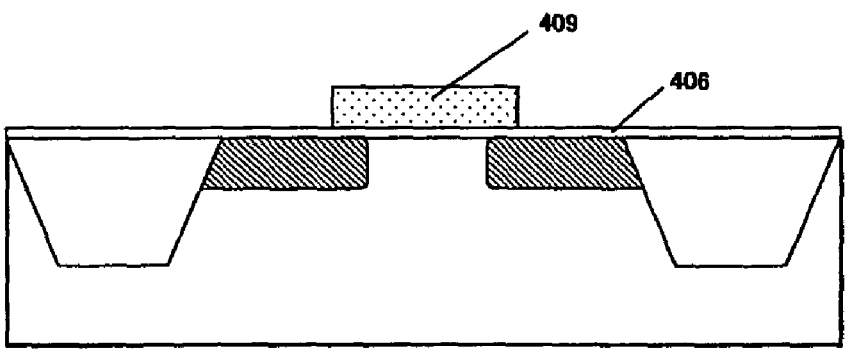
(d)
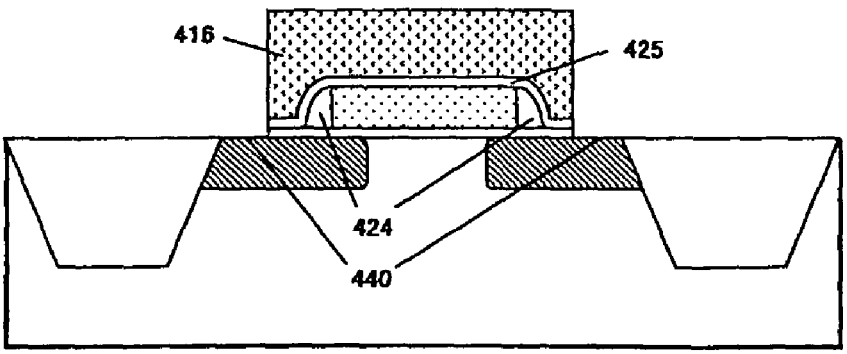

Figure 4-2
(e)
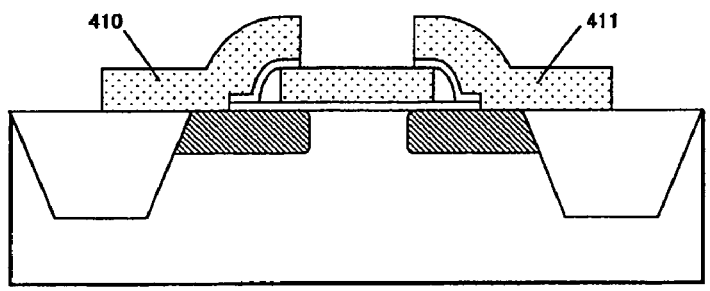
(f)
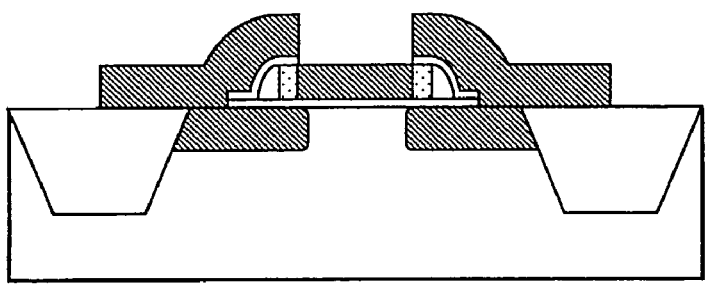
(g)
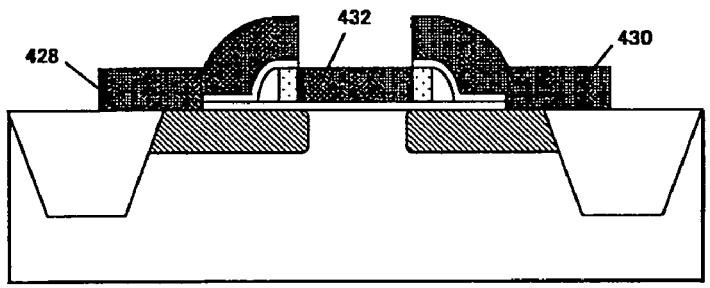
(h)
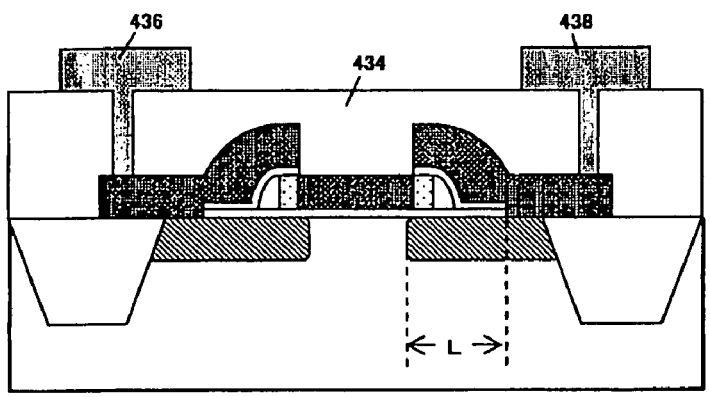

Figure 5-1
(a)
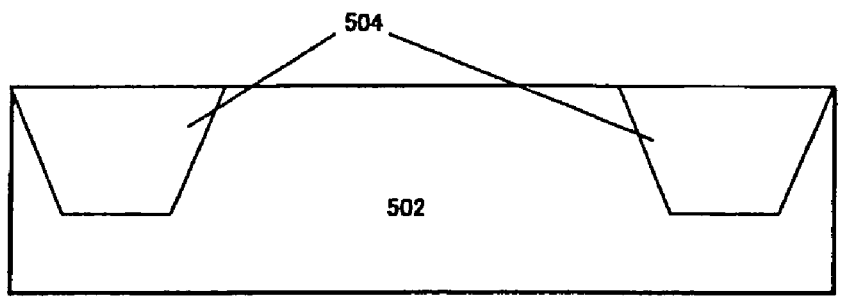
(b)
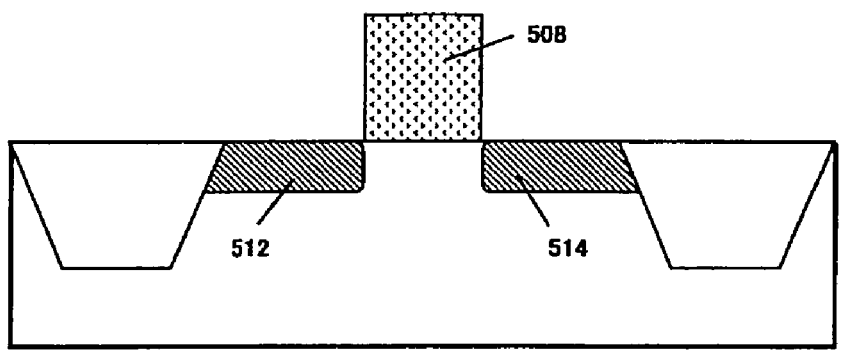
(c)
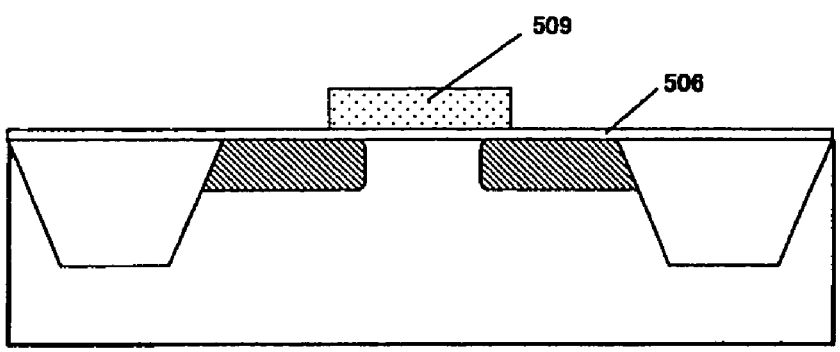
(d)
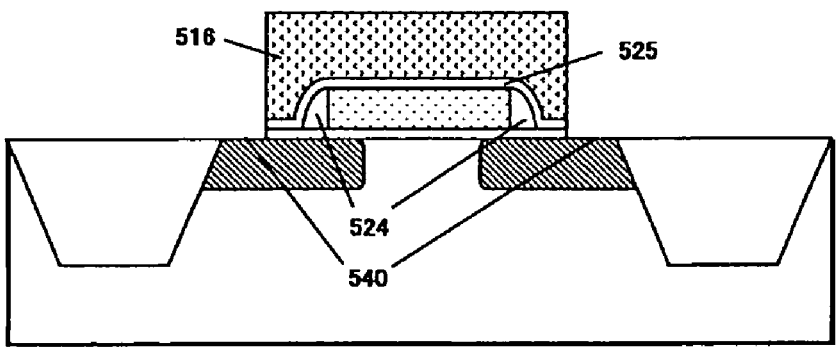

Figure 5-2
(e)
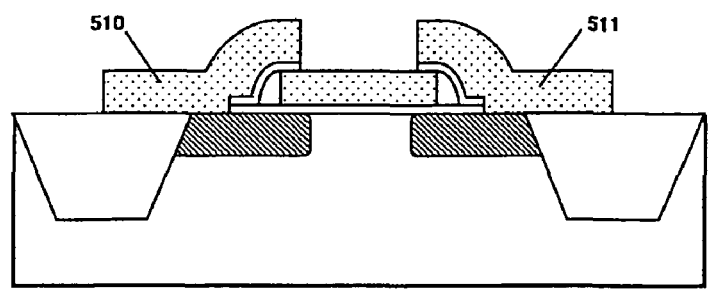
(f)
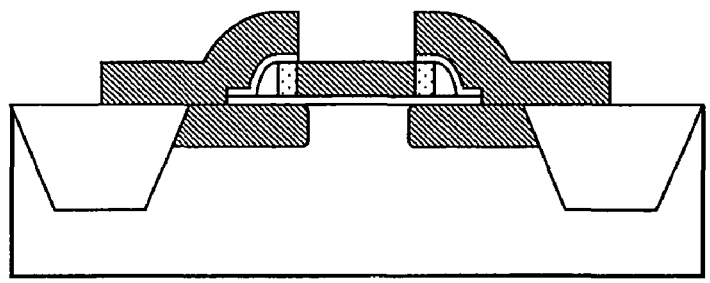
(g)
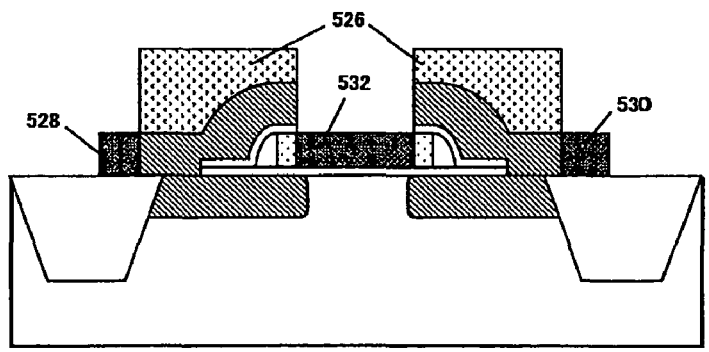
(h)
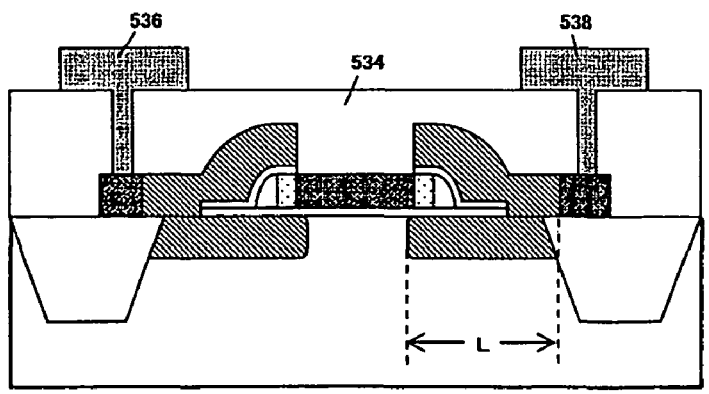

Figure 6-1
(a)
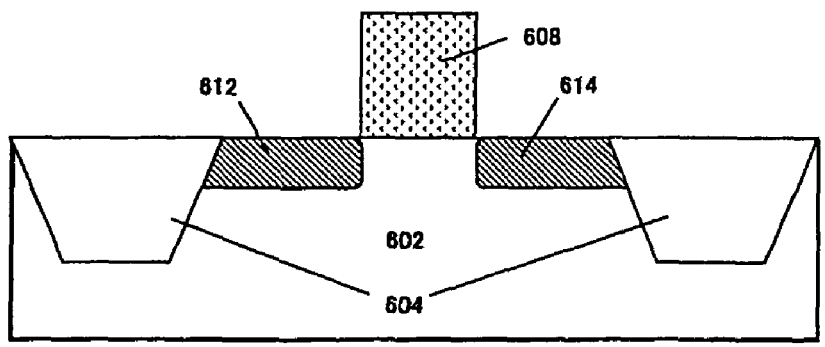
(b)
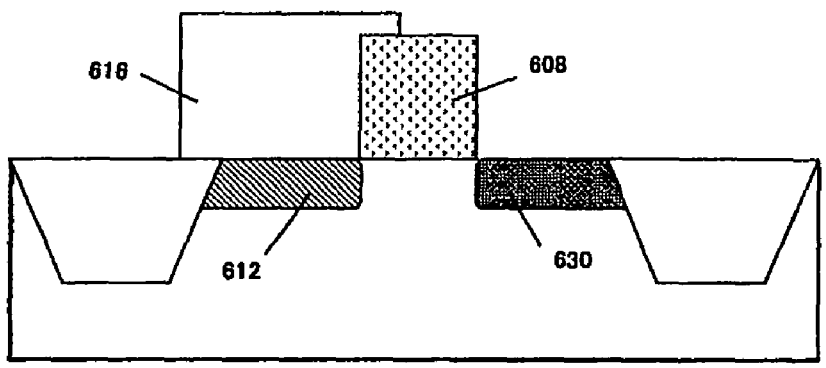
(c)
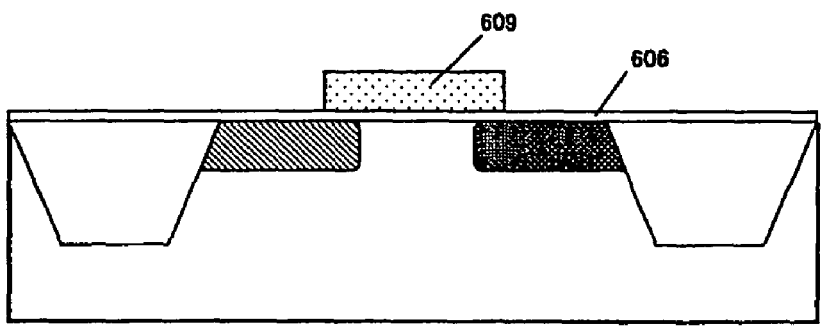
(d)
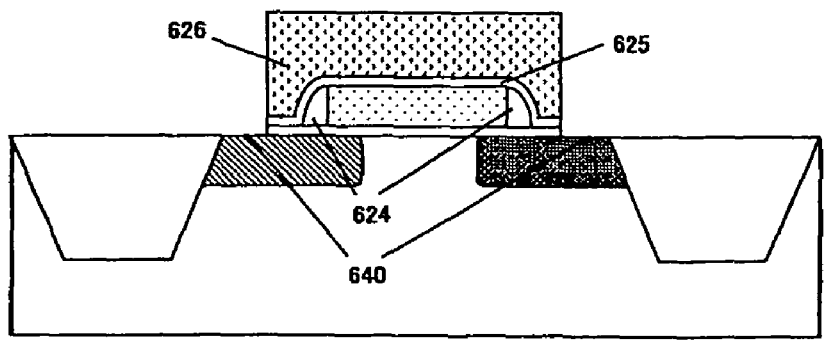

Figure 6-2
(e)
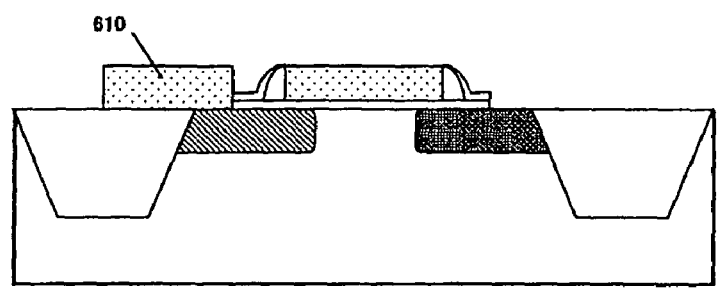
(f)
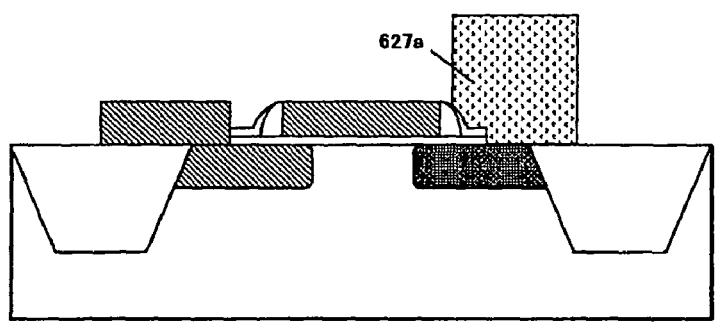
(g)
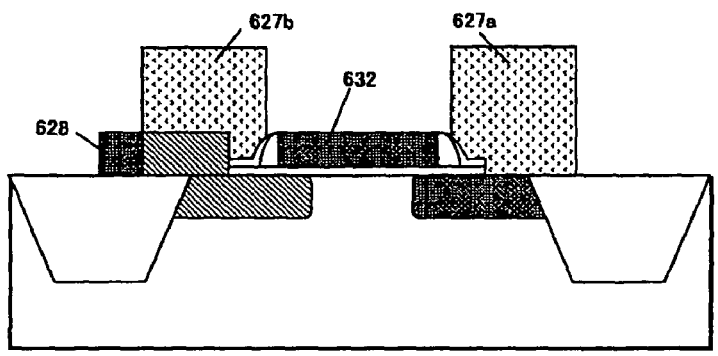
(h)
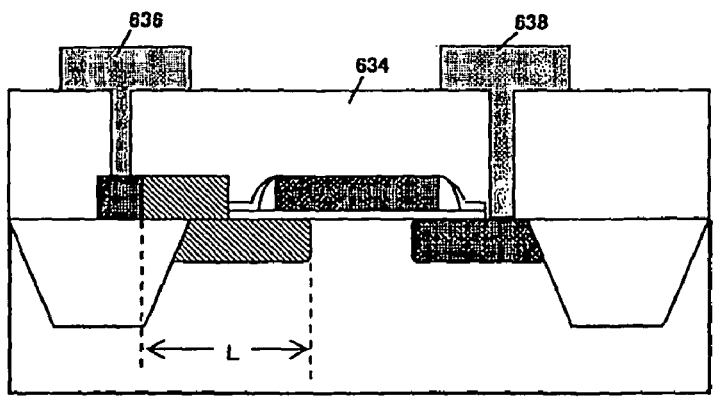

Figure 7-1
(a)
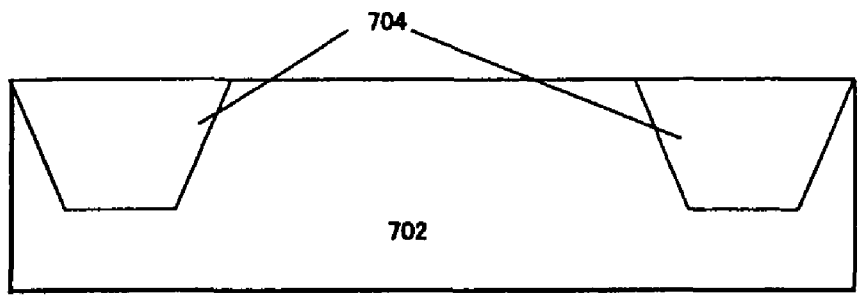
(b)
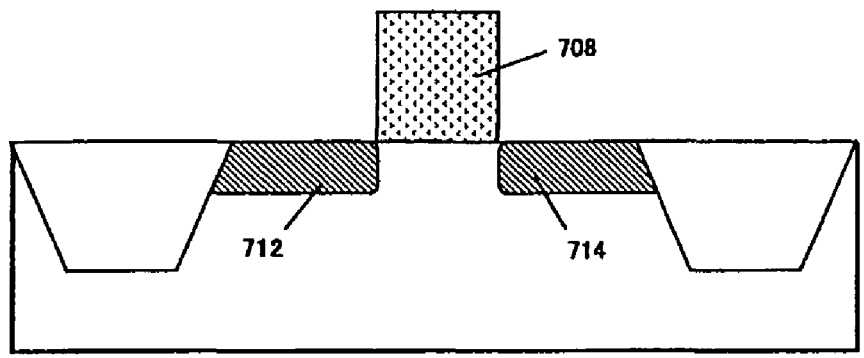
(c)
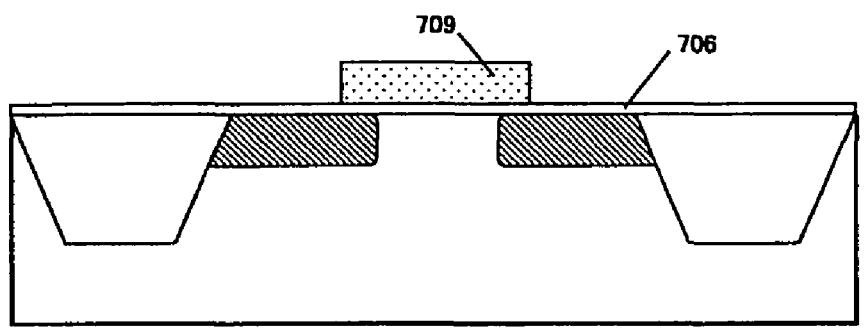
(d)
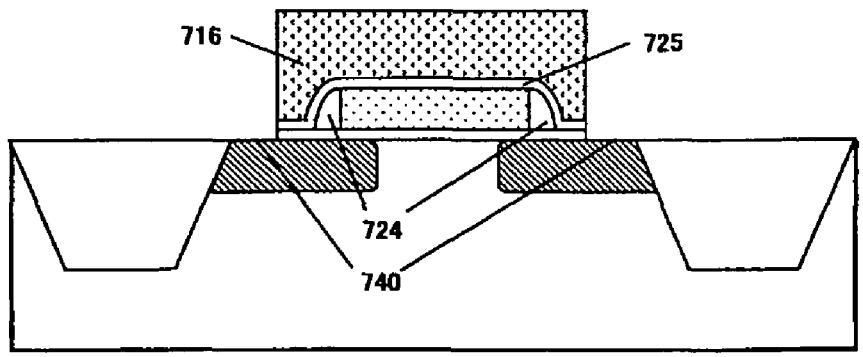

Figure 7-2
(e)
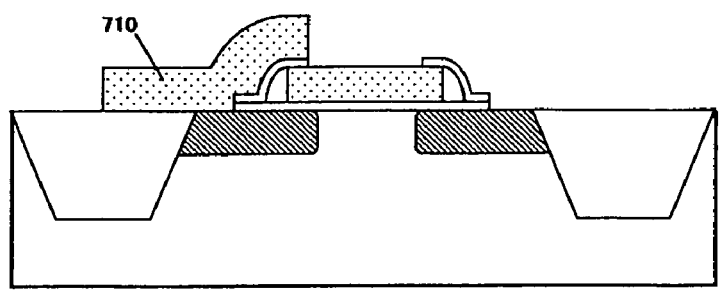
(f)
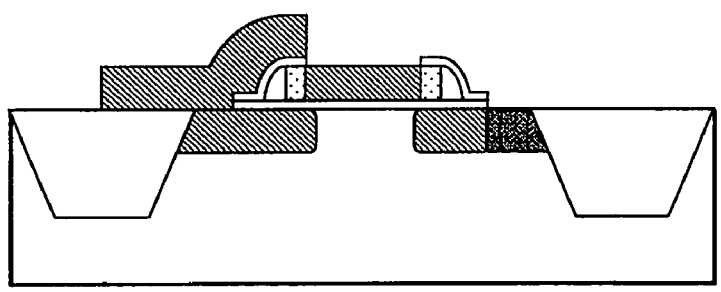
(g)
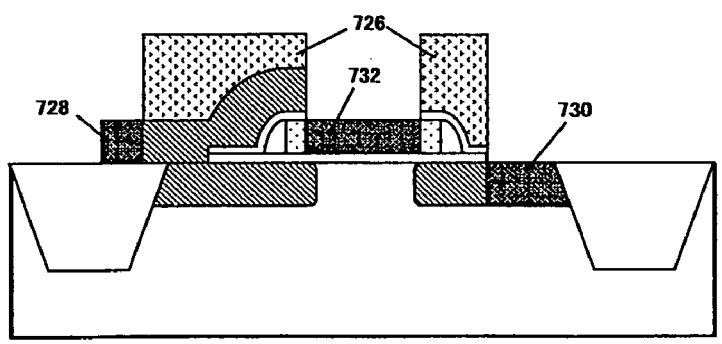
(h)
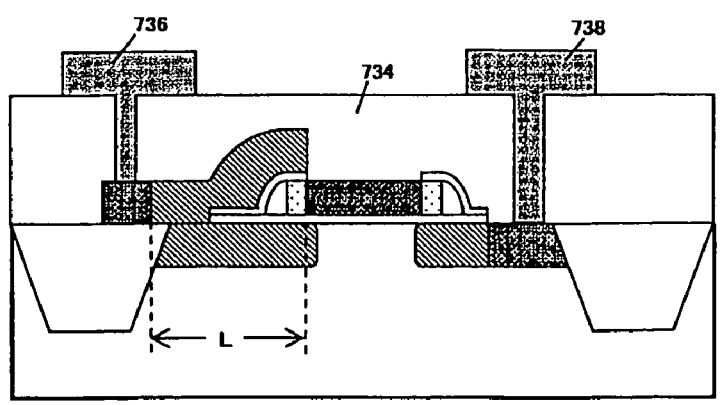

Figure 8-1
(a)
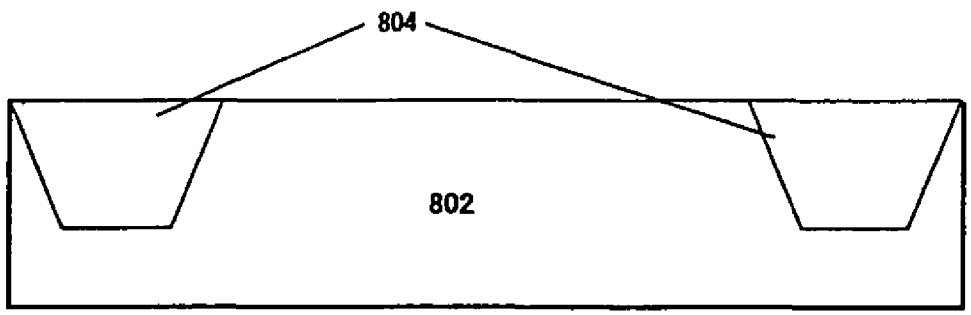
(b)
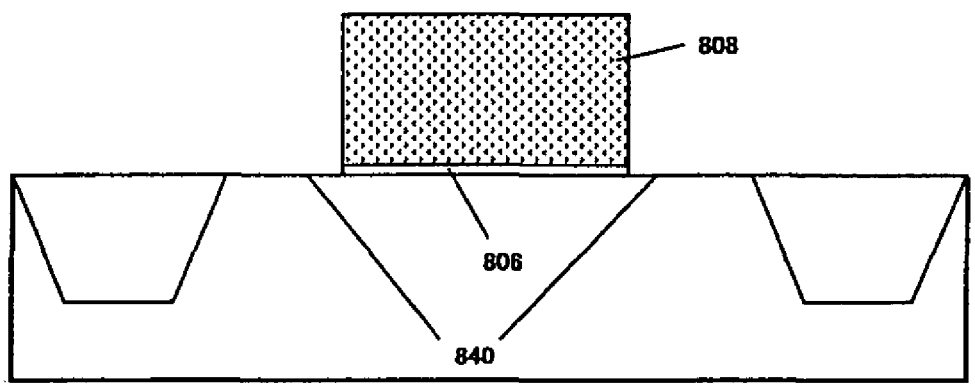
(c)
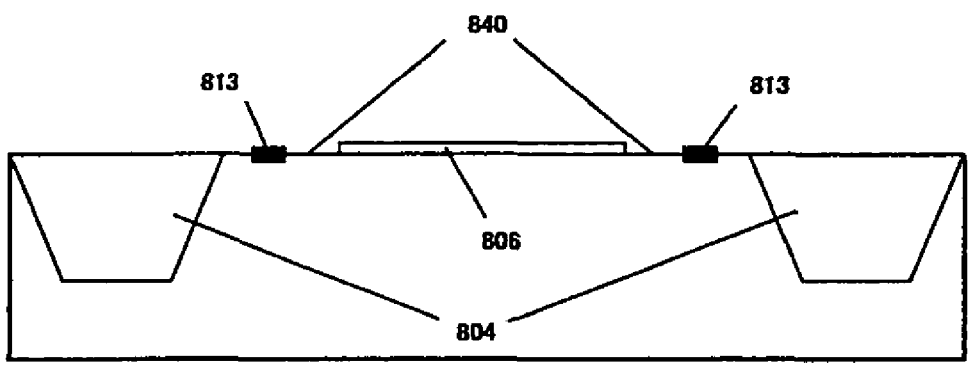
(d)
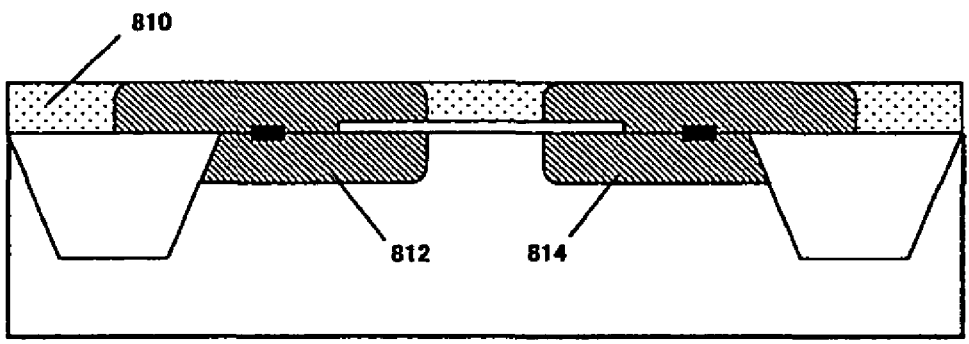

Figure 8-2
(e)
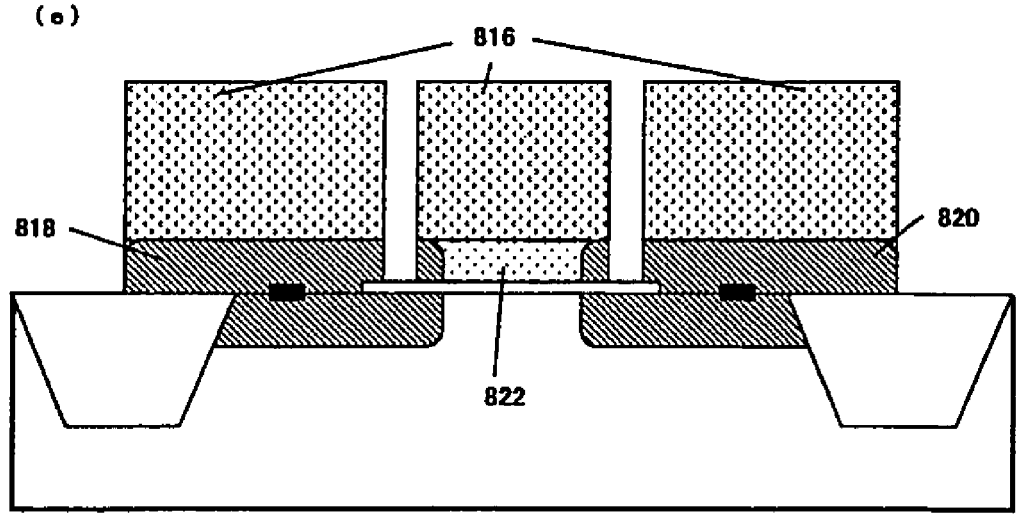
(f)
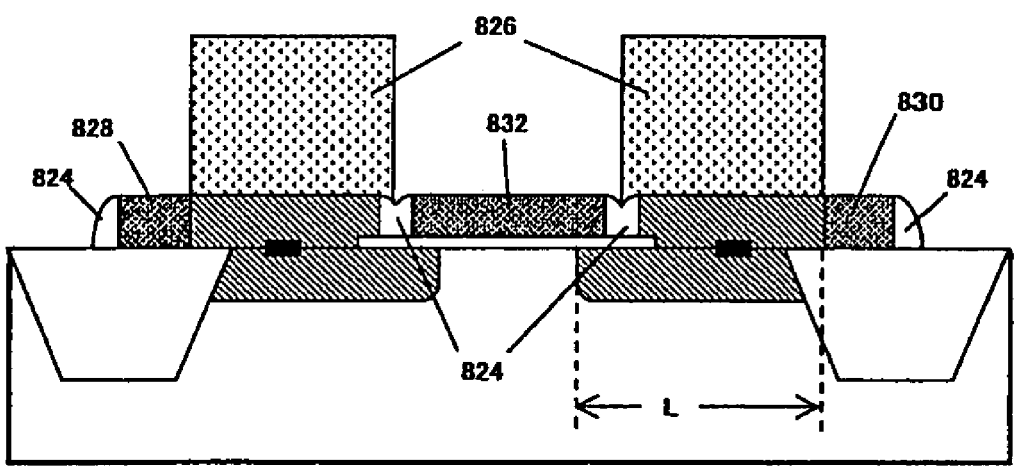
(g)
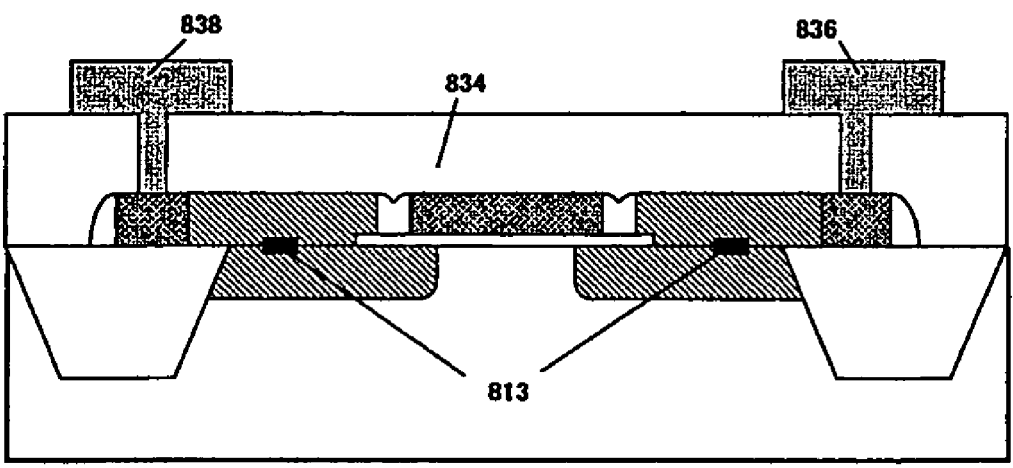

Figure 11-1
(a)
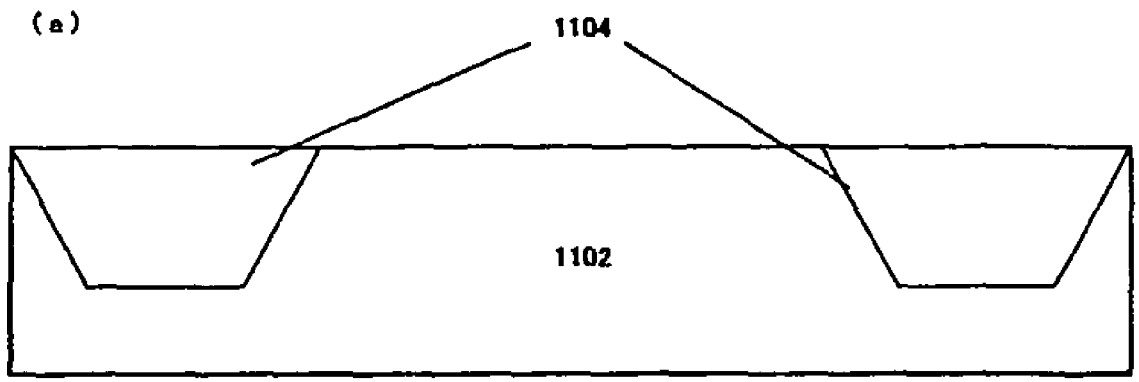
(b)
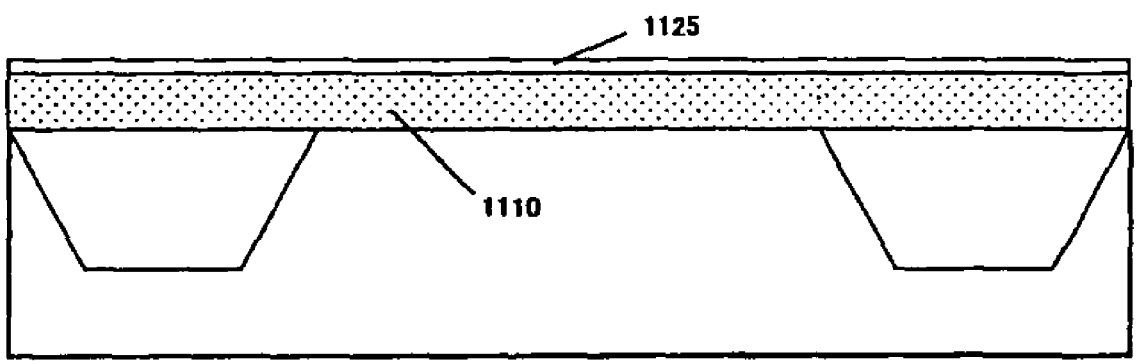
(c)
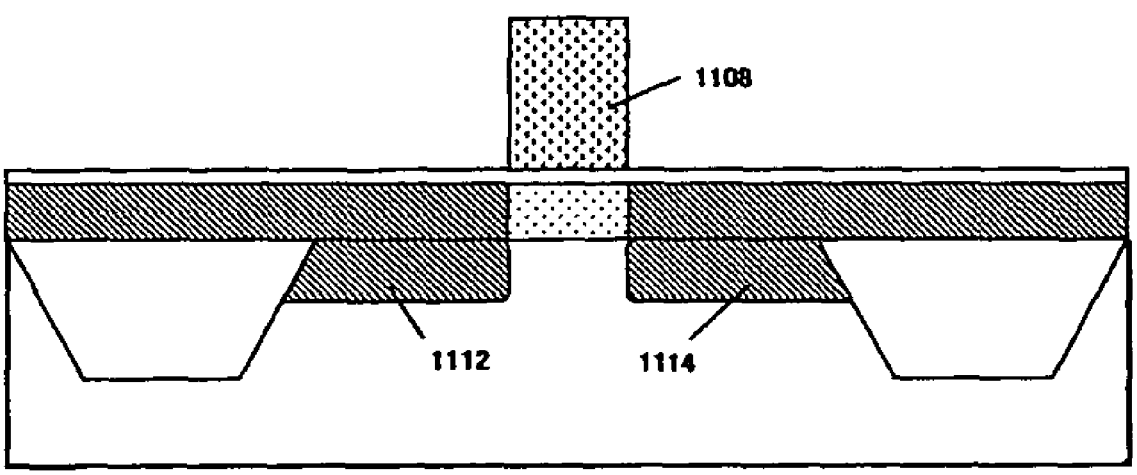

Figure 11-2
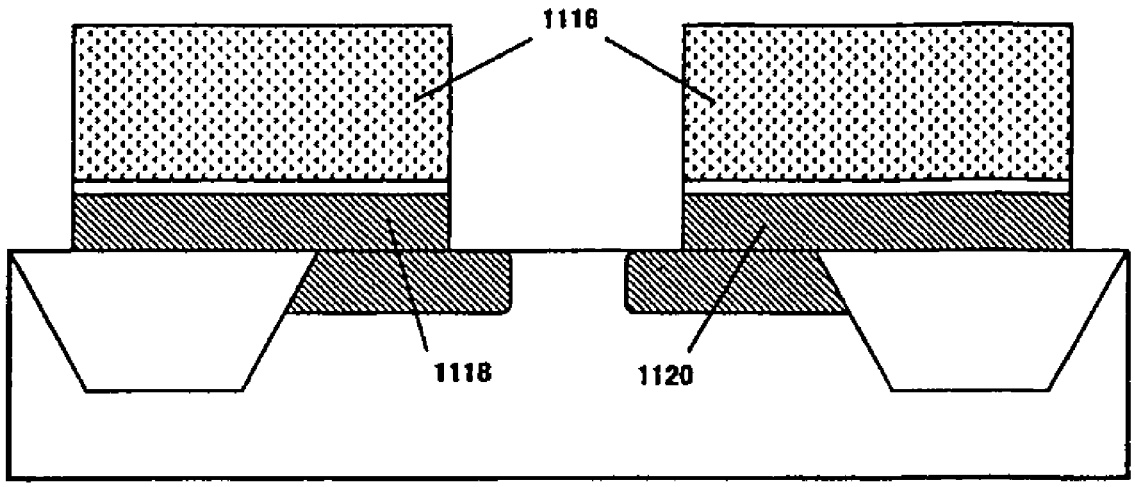
(d)
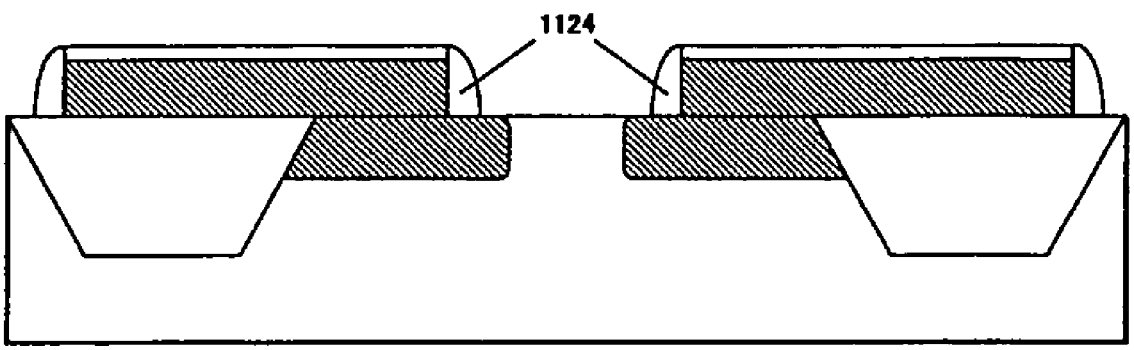
(e)
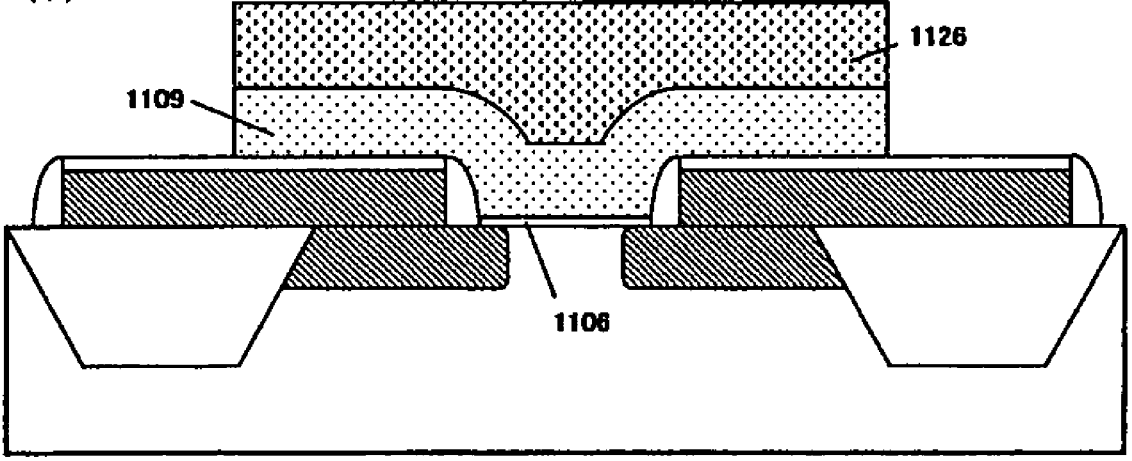
(f)

(a)

(b)

Figure 13-1
(a)
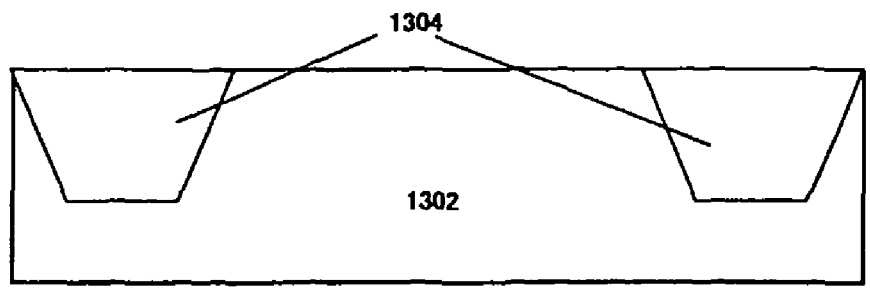
(b)
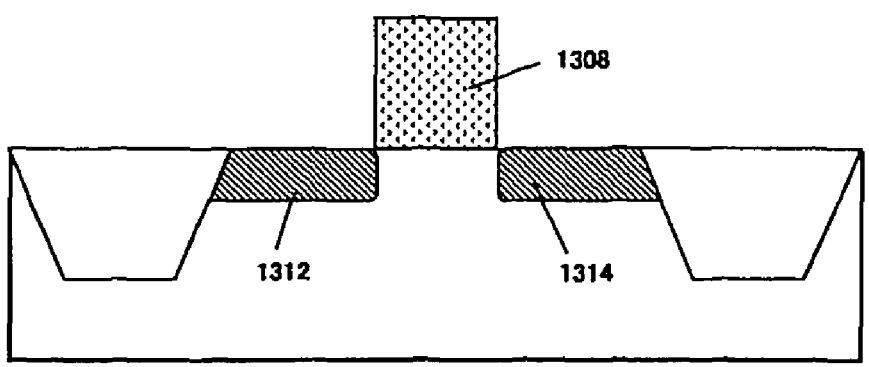
(c)
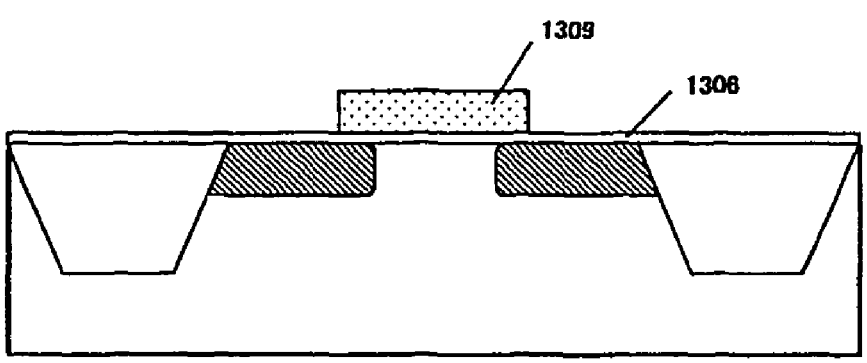
(d)
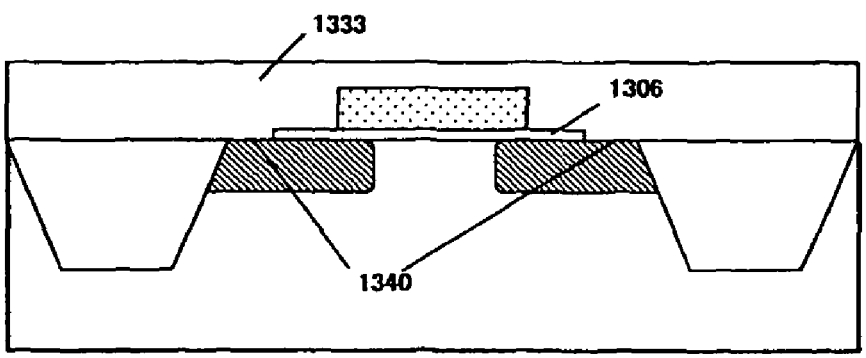

Figure 13-2
(e)
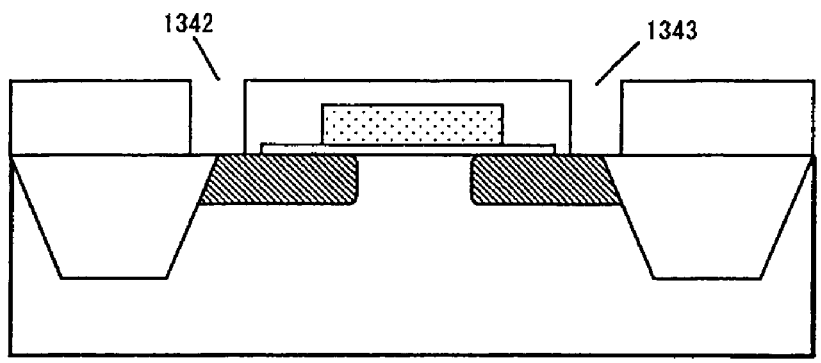
(f)
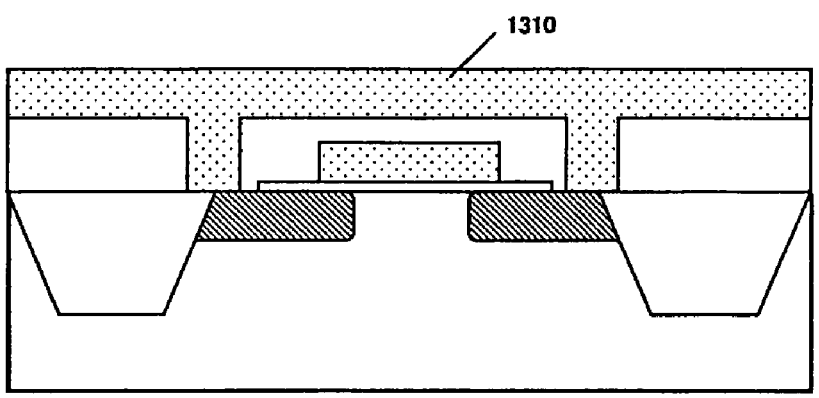
(g)
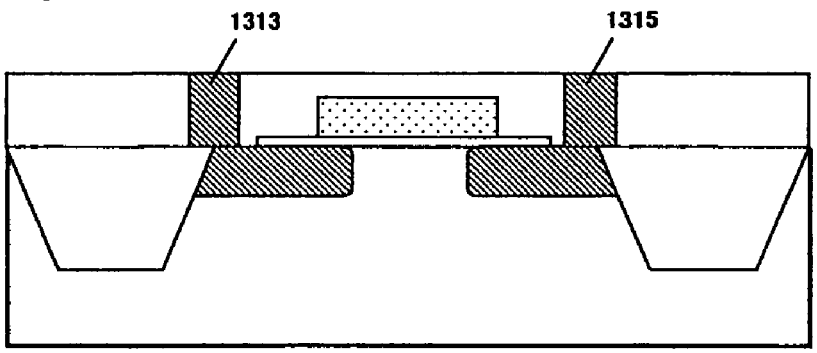
(h)
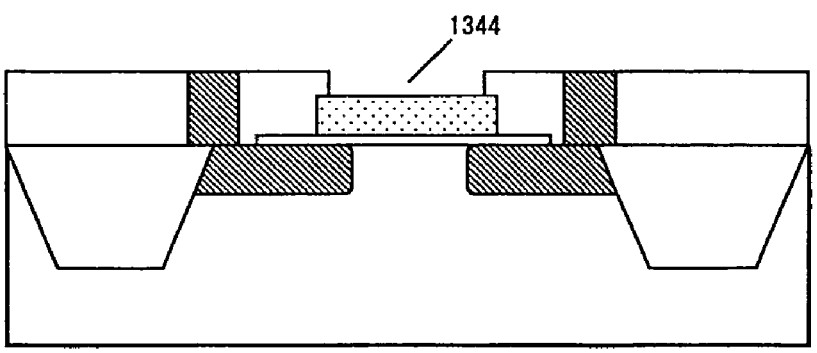

(i)

(j)

Figure 14-1
(a)
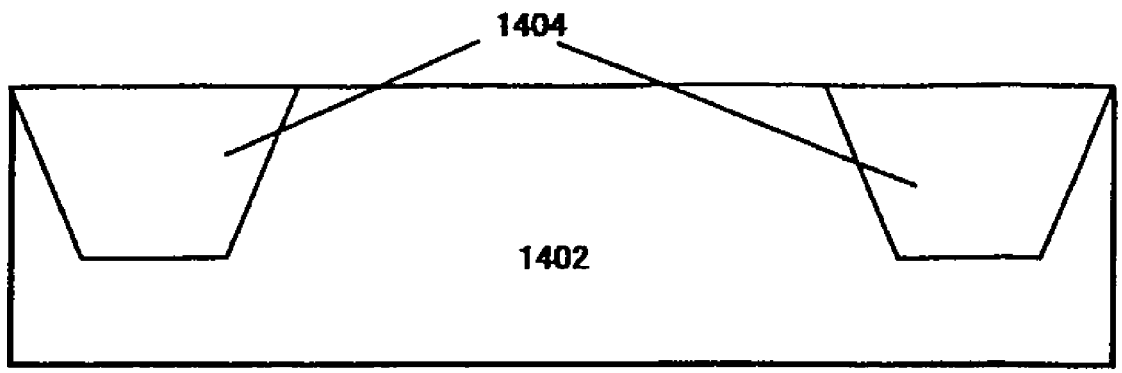
(b)
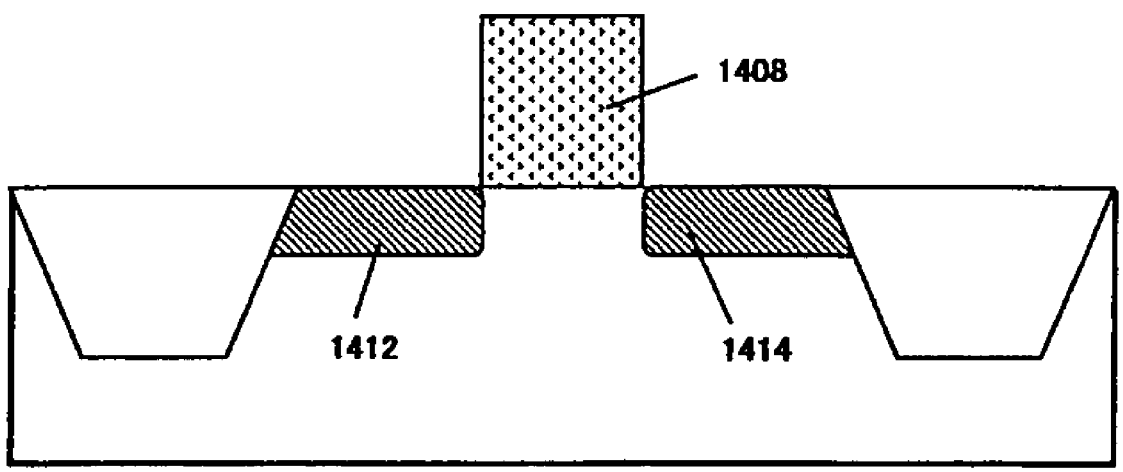
(c)
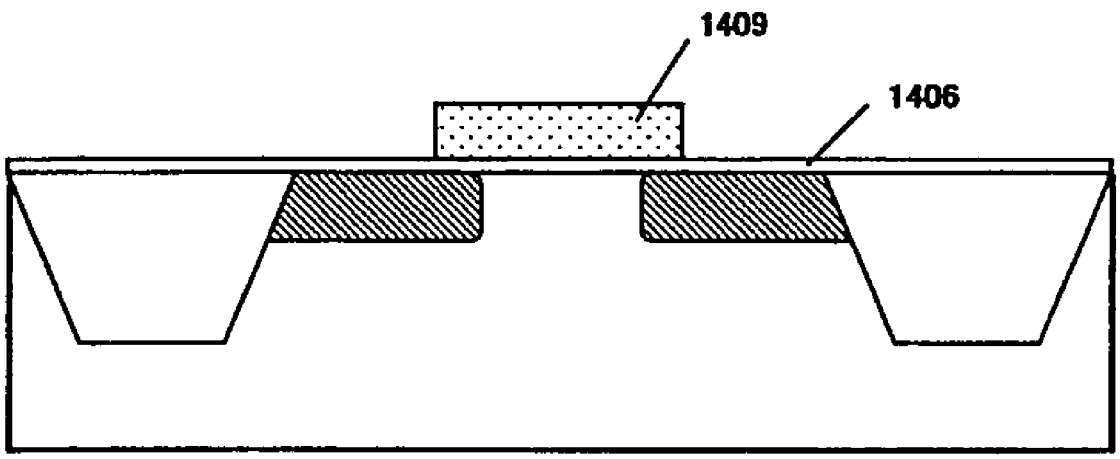

Figure 14-2
(d)
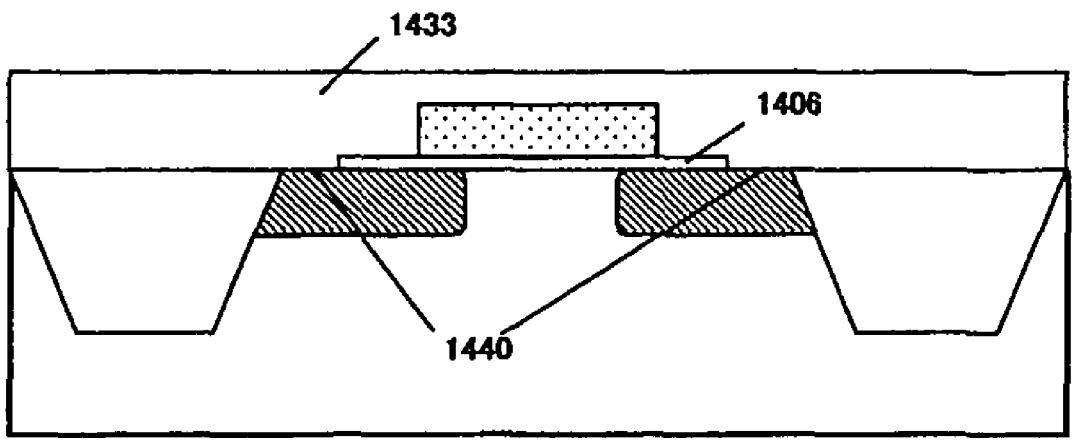
(e)
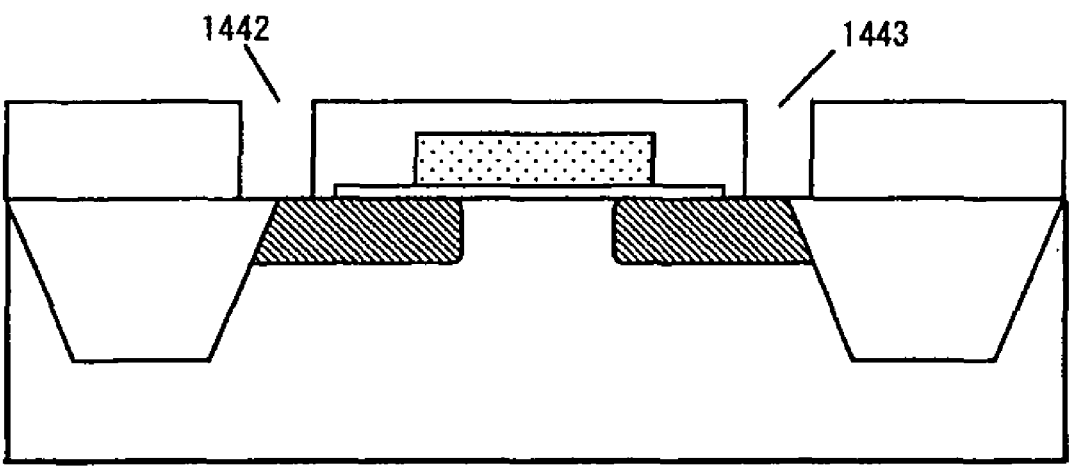
(f)
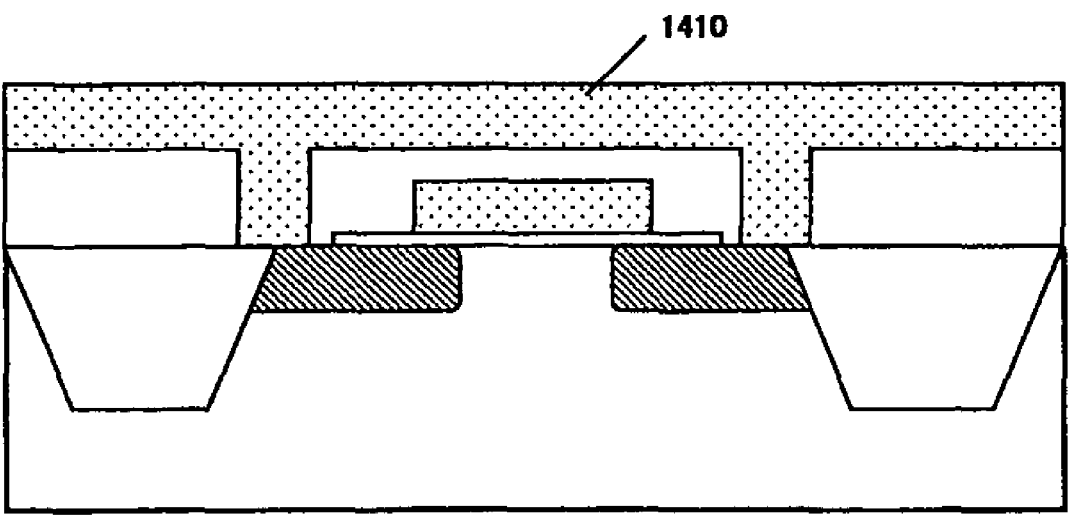

Figure 14-3
(g)
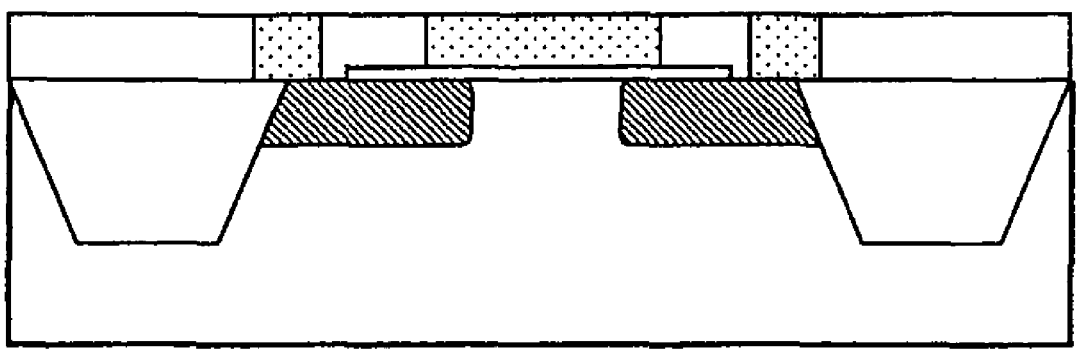
(h)
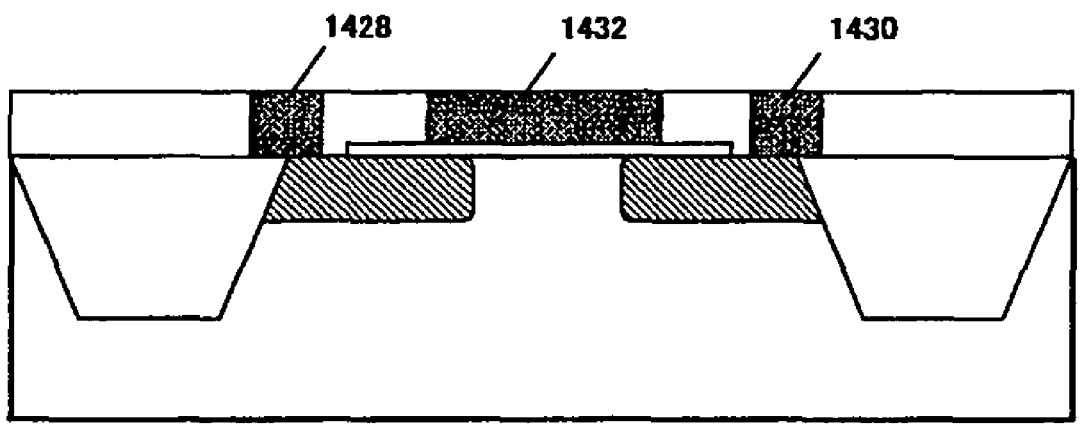
(i)
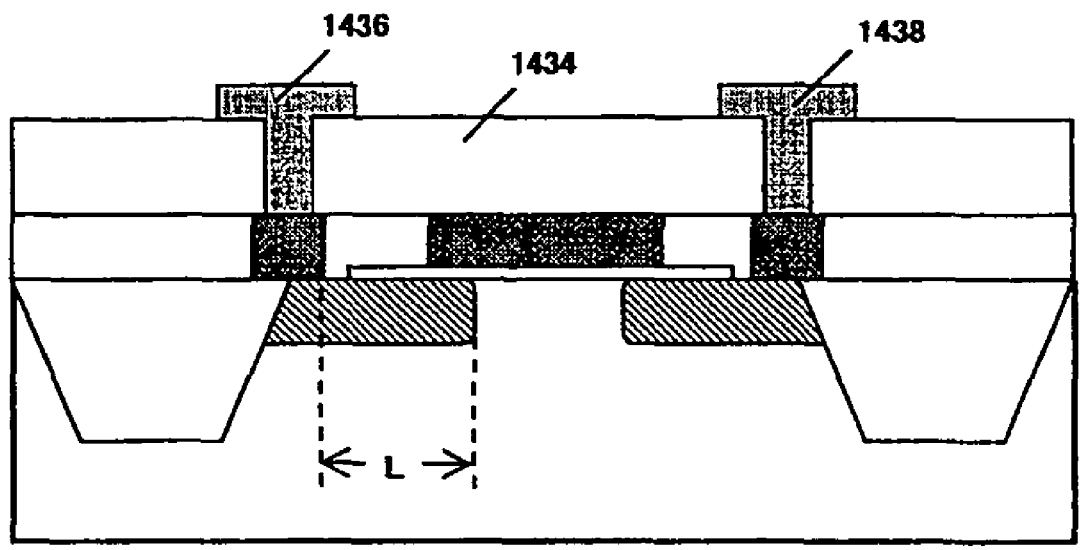

Fig. 15 (a) The relationship between the thickness of the CVD oxide film and the on-state breakdown voltage Fig. 15 (b) The relationship between the increment of the on-state breakdown voltage and the thickness of the CVD oxide film a)

b)

c)

d)

e)

f)

SMALL SIZE TRANSISTOR SEMICONDUCTOR DEVICE CAPABLE OF WITHSTANDING HIGH VOLTAGE

TECHNICAL FIELD

The present invention relates to a semiconductor device, more specifically, to a semiconductor device which has a high voltage transistor, or a high voltage transistor and a low voltage transistor.

BACKGROUND ART

A high voltage transistor is very large in size due to the necessity of a long gate length, a low concentration diffusion region as a drift region, and others, as compared to a low voltage transistor.

To date, a variety of techniques have been proposed to scale down a large-size high voltage transistor. Among them, Japanese Patent Laid-Open Publication No. Hei 8 (1996)-97411 has proposed a technique for shortening the length of a drift region of a lateral MOSFET in a horizontal direction with respect to the substrate while retaining the high voltage resistance, by forming a trench in the surface of the drain drift region so as to obtain the drift length also in the direction of thickness of the substrate.

A method for manufacturing the high voltage lateral trench MOSFET is described below with reference to FIG. 17 appended hereto.

A trench 3 is formed in a surface layer of a P-type well 2 in a P-type substrate 1, and an N-type drain drift region 4 is formed around the outside of side and bottom surfaces of the trench 3. Then, the trench 3 is filled with an insulating film 5. Next, a P-type base region 8 and a P-type channel region 10 are formed by an ion implantation, and after forming a gate electrode 7, an N-type source region 9 and an N-type drain region 11 are formed by an ion implantation. Further, electrodes 14 and 15 are formed on the N-type source region 9 and the N-type drain region 11 respectively so as to complete the high voltage lateral trench MOSFET.

Patent Document 1: Japanese Patent Laid-Open Publication No. Hei 8 (1996)-97411

DISCLOSURE OF THE INVENTION

Problems to be Solved by the Invention

According to the above technique, it was possible to downsize a high voltage transistor to some extent. However, such a downsized high voltage transistor was still large as compared to a low voltage transistor, due to the necessity to form a trench in an active region and others. Thus, there was a need to further downsize a high voltage transistor.

In particular, the size of a device having a high voltage transistor and a low voltage transistor on the same substrate was restrained by the size of the high voltage transistor. Therefore, there was a problem that effects of downsizing the chip size could not be provided by miniaturizing a low voltage transistor. In addition, there was a problem of restriction of layout freedom.

Means for Solving the Problems

The inventors have found that it is possible to downsize a semiconductor device with a long drift length by taking advantage of an isolation region surface(s) as a location(s) where at least one of a source region and a drain region is provided.

Accordingly, the present invention provides a semiconductor device characterized in that it comprises:
an isolation region formed in a semiconductor substrate;
an active region defined by the isolation region;
a gate electrode formed within the active region on the semiconductor substrate, with a gate insulator interposed between the gate electrode and the semiconductor substrate;
a channel region provided in the semiconductor substrate under the gate electrode;
a source region and a drain region located on both sides of the gate electrode; and
a drift region located between the channel region and the source region or the drain region,
wherein at least one of the source region and the drain region is located at least in part on the isolation region, and connected to the channel region through the drift region.

The inventors also have found that it is possible to improve the alignment accuracy of the source/channel/drain regions in the downsized semiconductor device by forming a semiconductor layer for the source region and/or drain region located on the isolation region(s) before forming a semiconductor layer for the gate electrode.

The present invention also provides a (first) method of manufacturing a semiconductor device characterized in that it comprises the steps of:
forming a first semiconductor layer on a first conductivity-type semiconductor substrate having an isolation region and an active region defined by the isolation region, so as to be astride the isolation region on one side of the active region to the isolation region on the other side thereof, in the gate length direction;
forming in the semiconductor substrate, second conductivity-type low concentration regions on both sides of a portion to be a channel region, within the active region under the first semiconductor layer, and simultaneously or previously or subsequently forming second conductivity-type low concentration regions in the first semiconductor layer at least on the second conductivity-type low concentration regions formed in the semiconductor substrate, and on the isolation region;
removing the first semiconductor layer at least over the portion to be the channel region, so as to bisect the first semiconductor layer;
forming a gate insulator on the semiconductor substrate and between the bisected first semiconductor layers;
forming a second semiconductor layer on the gate insulator and the bisected first semiconductor layers, with an insulating film interposed between the second semiconductor layer and the bisected first semiconductor layers; and
forming a source region and a drain region by processing at least portions of the bisected first semiconductor layers into second conductivity-type high concentration regions, the portions being located on the isolation regions, and simultaneously or previously or subsequently forming a gate electrode by processing the second semiconductor layer into a second conductivity-type high concentration region.

Furthermore, the inventors have found that it is possible to efficiently manufacture a further downsized semiconductor device by using a polysilicon-burying technique for forming the source region or drain region located on the isolation region and the drift region connected thereto when the above semiconductor device is manufactured.

The present invention also provides a (second) method of manufacturing a semiconductor device characterized in that it comprises the steps of:

forming second conductivity-type low concentration regions on both sides of a portion to be a channel region, in a first conductivity-type semiconductor substrate having an isolation region and an active region defined by the isolation region;

forming in the semiconductor substrate, a gate electrode on the portion to be the channel region, with a gate insulator interposed between the gate electrode and the semiconductor substrate;

forming an insulating layer on the semiconductor substrate;

forming openings in the insulating layer so as to expose the second conductivity-type low concentration regions formed in the semiconductor substrate together with the isolation region;

forming semiconductor layers by filling the openings with a semiconductor material;

forming in the semiconductor layers, second conductivity-type low concentration regions so as to be in contact with the second conductivity-type low concentration regions in the semiconductor substrate; and forming a source region and a drain region by processing portions of the semiconductor layers into second conductivity-type high concentration regions.

ADVANTAGES OF THE INVENTION

According to the semiconductor device of the invention, it is possible to greatly downsize it while retaining a desired drift length.

The semiconductor device of the invention can operate faster since the source region and/or the drain region are/is located at least in part on the isolation region(s), causing a reduction of the parasitic capacitance created between the source region and the semiconductor substrate and/or between the drain region and the semiconductor substrate.

According to the first method of manufacturing the semiconductor device of the invention, it is possible to further downsize the chip size since the gate length is determined in a self-aligning manner.

According to this method, it is also possible to provide a semiconductor device with an improved alignment accuracy of the source region/channel region (gate electrode)/drain region.

According to the second method of manufacturing the semiconductor device of the invention, it is possible to manufacture semiconductor devices with different desired drift lengths by appropriately setting the thickness of the buried semiconductor layer.

BRIEF DESCRIPTION OF THE DRAWINGS

FIG. 1-2 is a set of cross-sectional views (d) to (f) at different process steps, which illustrate the embodiment (Example 1) of the semiconductor devices and the manufacturing methods according to the present invention;

FIG. 2-1 is a set of cross-sectional views (a) to (c) at different process steps, which illustrate another embodiment (Example 2) of the semiconductor devices and the manufacturing methods according to the present invention;

FIG. 2-2 is a set of cross-sectional views (d) to (f) at different process steps, which illustrate the embodiment (Example 2) of a semiconductor device and the manufacturing methods according to the present invention;

FIG. 3-1 is a set of cross-sectional views (a) to (d) at different process steps, which illustrate another embodiment (Example 3) of the semiconductor device and the manufacturing methods according to the present invention;

FIG. 3-2 is a set of cross-sectional views (e) to (h) at different process steps, which illustrate the embodiment (Example 3) of the semiconductor device and the manufacturing methods according to the present;

FIG. 4-1 is a set of cross-sectional views (a) to (d) at different process steps, which illustrate another embodiment (Example 4) of the semiconductor device and the manufacturing methods according to the present invention;

FIG. 4-2 is a set of cross-sectional views (e) to (h) at different process steps, which illustrate the embodiment (Example 4) of the semiconductor device and the manufacturing methods according to the present invention;

FIG. 5-1 is a set of cross-sectional views (a) to (d) at different process steps, which illustrate another embodiment (Example 5) of the semiconductor device and the manufacturing methods according to the present invention;

FIG. 5-2 is a set of cross-sectional views (e) to (h) at different process steps, which illustrate the embodiment (Example 5) of the semiconductor device and the manufacturing methods according to the present invention;

FIG. 6-1 is a set of cross-sectional views (a) to (d) at different process steps, which illustrate another embodiment (Example 6) of a semiconductor device and the manufacturing methods according to the present invention;

FIG. 6-2 is a set of cross-sectional views (e) to (h) at different process steps, which illustrate the embodiment (Example 6) of a semiconductor device and the manufacturing methods according to the present invention;

FIG. 7-1 is a set of cross-sectional views (a) to (d) at different process steps, which illustrate another embodiment (Example 7) of a semiconductor device and the manufacturing methods according to the present invention;

FIG. 7-2 is a set of cross-sectional views (e) to (h) at different process steps, which illustrate the embodiment (Example 7) of a semiconductor device and the manufacturing methods according to the present invention;

FIG. 8-1 is a set of cross-sectional views (a) to (d) at different process steps, which illustrate another embodiment (Example 8) of a semiconductor device and the manufacturing methods according to the present invention;

FIG. 8-2 is a set of cross-sectional views (e) to (g) at different process steps, which illustrate the embodiment (Example 8) of a semiconductor device and the manufacturing methods according to the present invention;

FIG. 9-1 is a set of cross-sectional views (a) to (d) at different process steps, which illustrate another embodiment (Example 9) of a semiconductor device and the manufacturing methods according to the present invention;

FIG. 9-2 is a set of cross-sectional views (e) to (g) at different process steps, which illustrate the embodiment (Example 9) of a semiconductor device and the manufacturing methods according to the present invention;

FIG. 10-1 is a set of cross-sectional views (a) to (d) at different process steps, which illustrate another embodiment (Example 10) of a semiconductor device and the manufacturing methods according to the present invention;

FIG. 10-2 is a set of cross-sectional views (e) to (g) at different process steps, which illustrate the embodiment (Example 10) of a semiconductor device and the manufacturing methods according to the present invention;

FIG. 11-1 is a set of cross-sectional views (a) to (c) at different process steps, which illustrate another embodiment (Example 11) of a semiconductor device and the manufacturing methods according to the present invention;

FIG. 11-2 is a set of cross-sectional views (d) to (f) at different process steps, which illustrate the embodiment (Example 11) of a semiconductor device and the manufacturing methods according to the present invention;

FIG. 11-3 is a set of cross-sectional views (g) to (i) at different process steps, which illustrate the embodiment (Example 11) of a semiconductor device and the manufacturing methods according to the present invention;

FIG. 13-1 is a set of cross-sectional views (a) to (d) at different process steps, which illustrate another embodiment (Example 13) of a semiconductor device and the manufacturing methods according to the present invention;

FIG. 13-2 is a set of cross-sectional views (e) to (h) at different process steps, which illustrate the embodiment (Example 13) of a semiconductor device and the manufacturing methods according to the present invention;

FIG. 13-3 is a set of cross-sectional views (i) and (j) at different process steps, which illustrate the embodiment (Example 13) of a semiconductor device and the manufacturing methods according to the present invention;

FIG. 14-1 is a set of cross-sectional views (a) to (c) at different process steps, which illustrate another embodiment (Example 14) of a semiconductor device and the manufacturing methods according to the present invention;

FIG. 14-2 is a set of cross-sectional views (d) to (f) at different process steps, which illustrate the embodiment (Example 14) of a semiconductor device and the manufacturing methods according to the present invention;

FIG. 14-3 is a set of cross-sectional views (g) to (i) at different process steps, which illustrate the embodiment (Example 14) of a semiconductor device and the manufacturing methods according to the present invention;

EXPLANATION OF THE REFERENCE SIGNS

Figure 1:
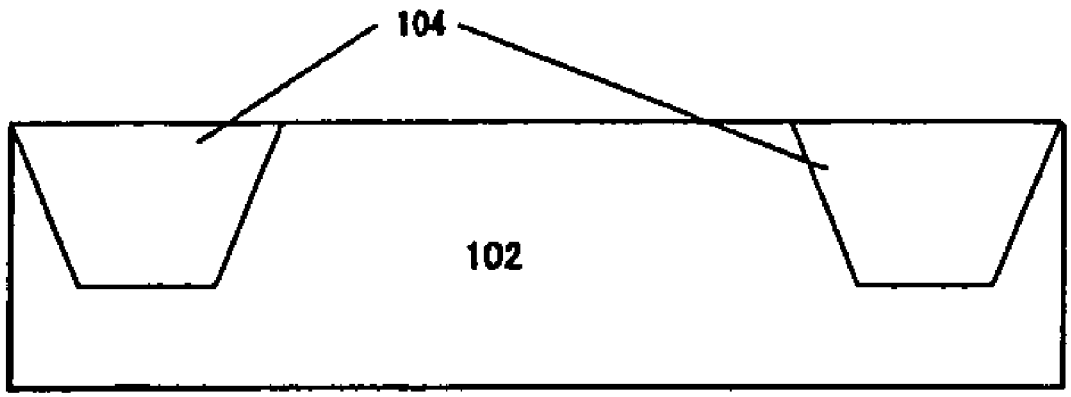
FIG. 1-1 is a set of cross-sectional views (a) to (c) at different process steps, which illustrate one embodiment (Example 1) of the semiconductor devices and the manufacturing methods according to the present invention.
Figure 1:
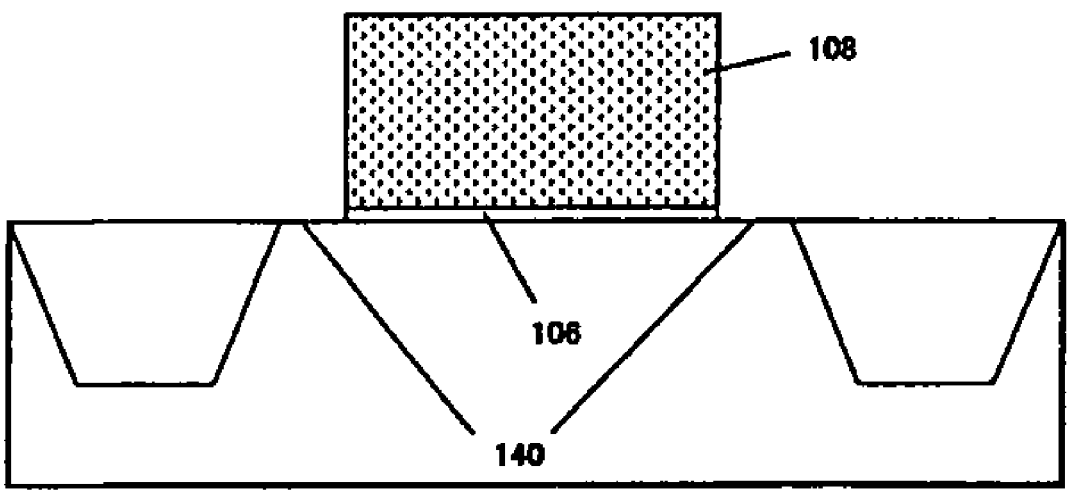
Figure 1:
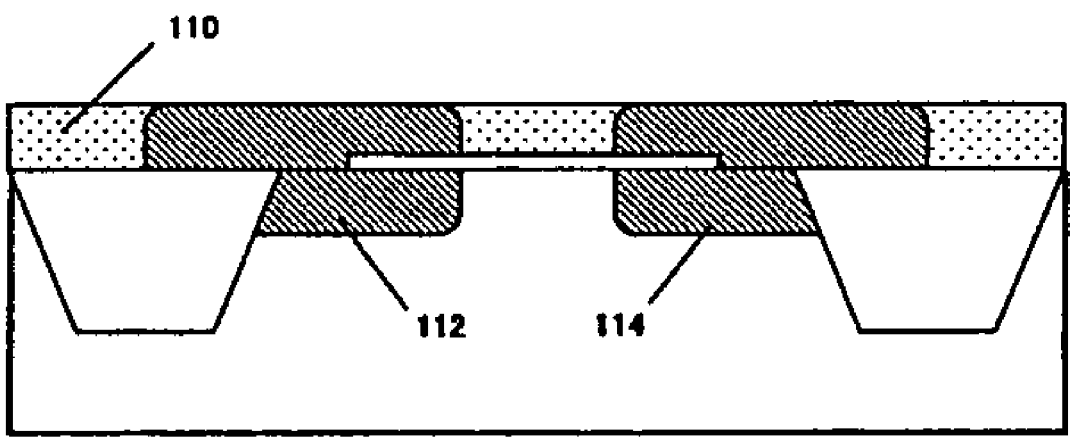

Reference signs 102, 202, 302, 402, 502, 602, 702, 802, 902, 1002, 1102, 1202, 1302, and 1402 denote the P-type semiconductor substrates;

Reference signs 104, 204, 304, 404, 504, 604, 704, 804, 904, 1004, 1104, 1204, 1304, and 1404 denote the isolation regions;

Reference sign 1205 denotes the insulating film;

Reference signs 106, 206, 306, 406, 506, 606, 706, 806, 906, 1006, 1106, and 1306, and 1406 denote the gate oxide films;

Reference signs 108, 116, 126, 208, 216, 308, 316, 326, 408, 416, 508, 516, 526, 608, 616, 626, 627a, 627b, 708, 716, 726, 808, 816, 826, 908, 916, 926, 1008, 1016, 1026, 1108, 1116, 1126, 1208, 1308, and 1408 denotes the photoresists;

Reference signs 309, 409, 509, 609, 709, 1109, 1309, and 1409 denote the first polysilicon films;

Reference signs 110, 210, 310, 311, 410, 411, 510, 511, 610, 710, 810, 910, 1010, 1110, 1210, 1310, and 1410 denote the semiconductor layers (the second polysilicon films);

Reference signs 112, 114, 212, 214, 312, 314, 412, 414, 512, 514, 612, 614, 712, 714, 812, 814, 912, 914, 1012, 1014, 1112, 1114, 1312, 1313, 1314, 1412, and 1414 denote the N-type low concentration diffusion layers;

Reference sign 813 denotes the titanium silicide;

Reference signs 118, 218, 818, 918, 1018, and 1118 denote the source region-forming parts;

Reference signs 120, 220, 820, 920, 1020, and 1120 denote the drain region-forming parts;

Reference signs 122, 222, 822, 922, and 1022 denote the gate electrode-forming parts;

Reference signs 124, 224, 324, 424, 524, 624, 724, 824, 924, 1024, 1123, and 1124 denote the sidewall spacers;

Reference signs 10, 20, 30, 40, 50, 60, 70, 80, 90, 100, 110, 120, 130, and 140 denote the silicon oxide films;

Reference signs 128, 130, 132, 228, 230, 132, 328, 330, 332, 428, 430, 432, 528, 530, 532, 628, 630, 632, 728, 730, 732, 828, 830, 832, 928, 929, 930, 932, 1028, 1029, 1030, 1032, 1128, 1130, 1132, 1328, 1330, 1332, 1428, 1430, and 1432 denote the N-type high concentration diffusion layers;

Reference signs 134, 234, 334, 434, 534, 634, 734, 834, 934, 1034, 1134, 1333, 1334, 1433, and 1434 denote the CVD oxide films;

Reference signs 136, 236, 336, 436, 536, 636, 736, 836, 936, 1036, 1136, 1336, and 1436 denote the source electrode lines;

Reference signs 138, 238, 338, 438, 538, 638, 738, 838, 938, 1038, 1138, 1338, and 1438 denote the drain electrodes;

Reference sign 1139 denotes the gate electrode;

Reference signs 140, 240, 340, 440, 540, 640, 740, 840, 940, 1040, 1340, and 1440 denote the surfaces of the semiconductor substrates;

Reference signs 1342, 1343, 1344, 1442, and 1443 denote the openings; and

Reference sign L denotes the drift length.

BEST MODE FOR CARRYING OUT THE INVENTION

In an embodiment of the present invention, the at least one of the source region and the drain region located on the isolation region(s) is each provided in a semiconductor layer formed astride the isolation region and the active region. According to the present embodiment, a semiconductor device can be provided, wherein the source region and/or drain region located on the isolation region(s) are/is manufactured by conventional photolithography techniques.

In an embodiment of the present invention, the at least one of the source region and the drain region located on the isolation region(s) is each formed of the entire semiconductor layer, and the drift region(s) is/are provided in a surface layer of the semiconductor substrate in the active region. According to the present embodiment, it is possible to make more contact holes connecting with a wiring layer formed over the source and drain regions, resulting in an improvement in reliability of the contact holes and a decrease in current density though each contact hole.

In an embodiment of the present invention, the at least one of the source region and the drain region located on the isolation region is located in a portion of the semiconductor layer, the portion being located on or over the isolation region, and the drift region is provided in both the semiconductor layer and a surface layer of the semiconductor substrate within the active region. According to the present embodiment, the semiconductor device can operate much faster since the source region and/or the drain region are/is located only on the isolation region(s), resulting in a reduction in parasitic capacitance created between the source region and the semiconductor substrate and/or between the drain region and the semiconductor substrate.

In an embodiment of the present invention, the gate electrode is made of a semiconductor and is equal in impurity concentration to the at least one of the source region and the drain region located on the isolation region. According to the present embodiment, a semiconductor device can be provided, which is manufactured in a simplified manufacturing process wherein an ion implantation is conducted simultaneously into the gate electrode, and into the source region and/or drain region located on the isolation region(s).

In an embodiment of the present invention, the at least one of the source region and the drain region located on the isolation region, and the gate electrode are formed by processing a single layer of a semiconductor film that is formed on the isolation region and the active region. According to the present embodiment, a semiconductor device can be provided, which is manufactured in a much simplified manufacturing process.

In an embodiment of the present invention, the at least one of the source region and the drain region located on the isolation region has an upper surface on the same level as the upper surface of the gate electrode. According to the present embodiment, a semiconductor device can be provided, wherein the difference in level of the upper surface of the semiconductor device is reduced to some degree, allowing to handle it easily in the subsequent processing and others.

In an embodiment of the present invention, the semiconductor layer covers at least one of both sides of the gate electrode, with an insulating film interposed between the semiconductor layer and the gate electrode. According to the present embodiment, a semiconductor device can be provided, which is manufactured in a simplified manufacturing process since it is possible to prevent a high concentration ion implantation into the semiconductor substrate surface within the active region under the source region and/or drain region during a high concentration ion implantation into the source region and/or drain region located on the isolation region(s).

In an embodiment of the present invention, the at least one of the source region and the drain region located on the isolation region is formed by processing a single layer of a semiconductor film that is formed on the isolation region and the active region, with the gate electrode covered with the semiconductor film.

In an embodiment of the present invention, the semiconductor device further comprises an interlayer insulator on the source region and the drain region, and a contact hole is formed through the interlayer insulator.

In an embodiment of the present invention, the contact hole is provided onto a portion of the at least one of the source region and the drain region, the portion being on the isolation region. According to the present embodiment, a semiconductor device can be provided, which operates faster since the parasitic capacitance of the source region and/or the drain region is reduced.

In an embodiment of the present invention, the semiconductor device further comprises a low voltage transistor on the semiconductor substrate. According to the present embodiment, a greatly downsized semiconductor device can be provided, which comprises a high voltage transistor and a low voltage transistor. In the semiconductor device, a layout freedom degree is high.

<Description of the Semiconductor Devices>

Essential and optional components of the semiconductor device of the present invention will be described below.

(Semiconductor Substrate)

In the semiconductor device of the invention, the semiconductor substrate is not limited to a specific one, and is any of those commonly used as a substrate for a semiconductor devise. For example, the semiconductor substrate can be a substrate composed of an element semiconductor such as silicon (Si), germanium (Ge) or the like, or compound semiconductor such as Group III-V (GaAs, InP, GaAlAs or the like), Group II-VI (GdS/CdTe, $Cu_2S$, ZnS, ZnSe or the like) or Group I-III-VI compound semiconductor, silicon carbide (SiC), silicon germanium (SiGe) or the like. Among them, an Si substrate, a Ge substrate and an SiGe substrate are preferable. The semiconductor substrate may have a structure such as an SOI structure, an SOS structure, or the like.

The semiconductor substrate may have previously been doped with P- or N-type impurities at a predetermined concentration. In addition, one or more wells doped with N- or P-type impurities may be formed in the semiconductor substrate. Suitable combinations of the semiconductor and impurities are known in the art, and are selected appropriately so as to achieve the performance desired for the semiconductor device to be manufactured. When a semiconductor is silicon or germanium, for example, N-type impurities include Group V elements such as phosphorus (P), arsenic (As) and antimony (Sb), and P-type impurities include Group III elements such as boron (B), aluminium (Al), gallium (Ga) and indium (In). The concentration of the impurities in the semiconductor substrate is not specifically limited as long as it is applicable to a semiconductor substrate of a semiconductor device, and can be, for example, in the range from $1\times10^{15}$ to $1\times10^{17}$ $cm^{-3}$. The semiconductor substrate used in the present invention is preferably a silicon substrate, more preferably a P- or N-type silicon substrate, and particularly preferably a P-type silicon substrate.

(Isolation Region)

In the semiconductor device of the invention, the isolation region can be in any form (e.g., of any material, in any shape, and others) that allows it to electrically isolate adjacent active regions from each other in the semiconductor substrate. Generally, the isolation region is formed of an insulating film, such as a silicon oxide ($SiO_2$) film, a silicon nitride ($Si_3N_4$) film, or an impurity diffused layer.

The upper surface of the isolation region may be on the same level as the surface of the semiconductor substrate, or may be on a higher level (e.g., approximately 50 to 300 nm higher level) than the semiconductor substrate surface (i.e., the isolation region may have a protrusion from the semiconductor substrate surface).

(Active Region)

In order to make the best use of the downsizing effect according to the present invention, it is preferable that the active region has a minimum size which is required for forming elements provided therein.

(Gate Insulator)

In the semiconductor device of the invention, the gate insulator is not limited to any specific one, and is a film that allows it to electrically isolate the gate electrode formed thereon from the semiconductor substrate under the gate electrode. For example, the gate insulator is a single-layer or multilayer silicon oxide film, silicon nitride film, high dielectric (e.g., $Ta_2O_5$) film, and/or the like. Among them, a silicon oxide film is preferable.

The thickness of the gate insulator can be determined appropriately according to the desired semiconductor device's characteristics, operating voltage, and the like. The thickness may be, for example, in the range of about 5 to 150 nm.

On a side having the source or drain region located on the isolation region, the gate insulator may be extended to the vicinity of the same isolation region. Such a gate insulator can work for ensuring the drift length to the source or drain region located on the isolation region.

(Gate Electrode)

In the semiconductor device of the invention, the gate electrode is not limited to a specific one, and is an electrode composed of a conductive material commonly used for an electrode. Conductive materials that can be used for the gate electrode include, for example, semiconductors such as polysilicon (in particular, low resistance semiconductor doped with impurities at high concentration), metals (aluminium (Al), copper (Cu), gold (Au), platinum (Pt) and the like), high melting point metals (tungsten (W), tantalum (Ta), titanium (Ti) and the like), silicides ($WSi_2$, $MoSi_2$, $TaSi_2$, $TiSi_2$, $NiSi_2$, $CoSi_2$, $PtSi_2$ and the like; especially silicides with high melting point metals), conductive organic polymer materials. Among them, polysilicon is preferred.

When semiconductor (e.g., polysilicon) is used, it is preferable to dope with N- or P-type impurities on or after forming a semiconductor layer so as to make the layer low resistant. The impurity concentration of the semiconductor layer constituting the gate electrode is not limited specifically and is any concentration enough to function as a gate electrode. The impurity concentration is, for example, in the range of $10^{17}$ to $10^{21}$ cm$^{-3}$.

In the case where the gate electrode is made of semiconductor doped with impurities, it is also referred herein to as "(P- or N-type) high concentration diffusion layer" or "(P- or N-type) high concentration diffusion region".

The gate electrode may have a single layer structure or a multilayer structure of two or more layers, such as polycide. The gate electrode also may have a structure at least partially buried in a trench formed in the semiconductor substrate (so-called trench gate electrode).

The gate electrode may be formed in such a manner that it is extended, at least one of the sides in the gate length direction, over the isolation region (i.e., the isolation region on where the source or drain region is formed). In this case, outside the gate insulator, the gate electrode is provided on, for example, the semiconductor layer (in which the source or drain region is formed) that is formed astride the isolation region and the active region and that is in contact with the surface of the semiconductor substrate within the active region, with an insulating film between the gate electrode and the semiconductor layer. That the gate electrode is extended over the isolation region, allows provision of a contact hole over the isolation region. As the result, it is not necessary to make a new draw lead and also it is easy to locate the contact hole in every transistor. Therefore, it is possible to further downsize the chip size.

The gate electrode can be formed in an appropriate thickness according to the desired semiconductor's characteristics, voltage to be applied, and the like. It may be formed in a thickness of, for example, about 50 to 750 nm, preferably 50 to 500 nm, and more preferably 100 to 300 nm.

The gate electrode may have a side wall spacer(s) of insulating film (e.g., silicon oxide film, or silicon nitride film) provided on its side wall(s).

(Source Region and Drain Region)

The source region and the drain region are also referred herein to as "(P- or N-type) high concentration diffusion layers" or "(P- or N-type) high concentration diffusion regions".

In the semiconductor device of the invention, the source and drain regions are not limited specifically with respect to their dimensions, impurity concentrations, junction depths or the like, as long as they are suitable as source and drain regions commonly formed in a semiconductor device. The impurity concentrations, dimensions, or the like, of the source and drain regions can be adjusted appropriately according to the desired semiconductor's performance and characteristics. The impurities include, for example, those as described above for the semiconductor substrate. The impurities can be a single species (e.g., phosphorous, arsenic or boron) or a combination of two or more species (e.g., a combination of phosphorous and arsenic). The impurity concentration can be in the range of $10^{17}$ to $10^{21}$ cm$^{-3}$. The impurity concentration can be equal to that of the gate electrode constituted of semiconductor.

In the present invention, one or both of the source region and the drain region is located at least in part on the isolation region(s), and connected to the channel region through the drift region(s).

It is preferable that at least the drain region is located on the isolation region.

In the context of the source and drain regions, the phrase "located on the isolation region" is used herein synonymously with the phrase "located at least in part on the isolation region", unless the context dictates otherwise.

Also, in the context of the source and drain regions, the phrase "on the isolation region" is used herein to include the meaning of "over the isolation region".

The source or drain region located on the isolation region may be positioned only on the isolation region, or may in part (or even in large part) protrude on or over the active region, or in the case where the isolation region is formed to protrude from the semiconductor substrate surface, the source or drain region may be positioned on a sidewall of the protrusion.

Preferably, the source or drain region located on the isolation region is located only on the isolation region. In this case, it is possible to greatly reduce parasitic capacitance between the source or drain region located only on the isolation region and the semiconductor substrate, thereby allowing much faster operation of the semiconductor device. It is especially preferable that both of the source region and the drain region are located only on the isolation region(s).

When only one of the source region and the drain region is located on the isolation region, the source or drain region not located on the isolation region is formed within the active region in the semiconductor substrate. The source or drain region not located on the isolation region may be in direct contact with the channel region, or may be connected to the channel region through a drift region in a surface layer of the semiconductor substrate.

The source region or drain region located on the isolation region is located in, for example, a semiconductor layer that is formed astride the isolation region and the active region and that is in contact with the surface of the semiconductor substrate within the active region. In this case, the source or drain region located on the isolation region may be formed from the entire semiconductor layer, or may be located in a portion of the semiconductor layer, the portion being located on the isolation region.

The source or drain region located on the isolation region also may be provided in the upper portion of the semiconductor layer, with the remaining lower portion of the semiconductor layer provided as a drift region. In other words, the source or drain region located on the isolation region may be provided in such a manner that it is layered on the drift region in the semiconductor layer. That the source or drain region and the drift region are positioned vertically, allows a further downsizing of the semiconductor device in the horizontal direction, while ensuring a desired drift length. Also, the horizontal position(s) of the source region and/or drain region can be fixed while having different drift length(s). Therefore, it is possible to simplify wiring patterns and the like.

The semiconductor material constituting the semiconductor layer may be the same as, or different from, the semiconductor material constituting the semiconductor substrate. Preferably, the semiconductor material constituting the semiconductor layer is the same as the semiconductor material constituting the semiconductor substrate. For example, it is preferable that when the semiconductor substrate is a silicon substrate, the semiconductor layer formed thereon is a polysilicon layer.

In the case where the source or drain region located on the isolation region is provided in such a manner that it is layered on the drift region in the semiconductor layer, the thickness of the semiconductor layer can be set according to the desired drift length, since the settable drift length partially depends on the thickness (height) of the semiconductor layer. The thickness can be, for example, 600 nm or more, e.g., 600 to 2000 nm, or 600 to 1100 nm.

It is preferable that the upper surface(s) of the source and/or drain region(s) located on the isolation region(s) are/is on the same level as the upper surface of the gate electrode. This causes a reduction of the difference in level of the upper surface of the semiconductor device to some degree, resulting in easy handling in subsequent processing and others.

(Drift Region)

The drift region (or field limiting region) can be expressed herein as a "(P- or N-type) low concentration diffused layer" or a "(P- or N-type) low concentration diffusion region".

In the semiconductor device of the invention, the drift region contains the same conductivity-type impurities as for the source region and the drain region. The impurity species of the drift region may be the same impurity species or the same combination of the impurity species of the source or drain region connected thereto. The impurity concentration of the drift region is lower than that of the source or drain region that is connected thereto, such as in the range of $5\times10^{-1}$ to $1\times10^{-4}$ times, preferably in the range of $1\times10^{-1}$ to $1\times10^{-4}$ times, preferably in the range of $5\times10^{-1}$ to $1\times10^{-3}$ times, preferably in the range of $1\times10^{-1}$ to $1\times10^{-3}$. The impurities include, for example, those of the semiconductor substrate as described above.

The impurity concentration of the drift region need not be constant throughout its whole region. For example, the drift region consists of a plurality of parts (e.g., two of the channel-side part and the source- or drain-side part), and the impurity concentration of an area closer to the source- or drain-side part may be higher than that of an area closer to the channel-side part. The stepwise increasing/decreasing concentrations of the drift region allows limitation of an electric field generated at the junction of the source or drain region and the drift region, resulting in further high voltage resistance of the device.

It is preferable that the end of the drift region connected to the channel region is extended under the gate electrode. In other words, it is preferable that the drift region adjoins the gate electrode with the gate insulator interposed therebetween.

In the semiconductor device of the invention, the drift region must be provided on the side having the source or drain region located on the isolation region. In the case where the source region or the drain region is provided in the semiconductor substrate, the drift region may or may not be provided on the side having the source region or the drain region.

The drift region is provided in a surface layer of the semiconductor substrate. Additionally, the drift region may be located also in the semiconductor layer formed astride the isolation region and the active region. The impurity concentration of the drift region provided in the semiconductor layer may be equal to, or higher (but lower than that of the source or drain region connected to the drift region) or lower than, that of the drift region provided in the surface layer of the semiconductor substrate within the active region.

In the case where the drift region is located also in the semiconductor layer formed astride the isolation region and the active region, since an oxide film ($SO_2$ film) can be spontaneously formed on the surface layer of the semiconductor substrate within the active before forming the semiconductor layer, depending on the manufacturing environment, the drift region provided in the semiconductor layer may be connected to the drift region provided in the surface layer of the semiconductor substrate through the spontaneous oxide film. In that case, the resistance between the both drift regions may increase, thereby required performances of the manufactured semiconductor device may not be achieved.

In order to avoid this risk, the semiconductor device of the invention may further comprises a low resistance region that is in contact with the drift region provided in the formed semiconductor layer and with the drift region provided in the surface layer of the semiconductor substrate within the active region. Here, the term "low resistance region" refers to a region which is approximately equal in sheet resistance to at least one of the two drift regions that are in contact with the region. The sheet resistance of the low resistance region is, for example, in the range of about 10 to 30Ω/□. The sectional area of the low resistance region along the semiconductor substrate may be 5 to 100% of the contact area between the drift region in the semiconductor substrate surface and the semiconductor layer on the assumption that the spontaneous oxide film is not formed on the semiconductor substrate surface.

The low resistance region may be a layer of metal or metal compound.

The metal may be an elemental metal or an alloy of two or more metal elements. Preferably, the metal is such a metal that can form a low resistance silicide (the resistivity of which is, for example, 1 mΩ·cm or less, preferably 500 μΩ·cm or less, more preferably 300 μΩ·cm or less, more preferably 200 μΩ·cm or less, more preferably 100 μΩ·cm or less, more preferably 50 μΩ·cm or less, more preferably 25 μΩ·cm or less, more preferably 10 μΩ·cm or less, and more preferably 1 μΩ·cm or less). The metals that can form low resistance silicides include, for example, transition metals, high melting point metals, and noble metals.

In the present specification, the transition metals refer to metals belonging to Groups III to XII in the Periodic Table of the Element. The preferable metals used in the invention are metals belonging to Groups IV, V, VI, IX or X.

In the present specification, the noble metals refer to gold, silver, ruthenium, rhodium, palladium, osmium, iridium, and platinum.

In the present specification, the high melting point metals refer to metals having a melting point of 1,000° C. or more. The high melting point metals include, for example, cobalt, nickel, titanium, vanadium, chromium, zirconium, niobium, molybdenum, hafnium, tantalum, and tungsten. The preferable high melting point metals in the invention are metals having a melting point of 1,300° C. or more, and more preferably 1,500° C. or more The metal may preferably be cobalt, chromium, molybdenum, nickel, palladium, tantalum, tungsten, titanium, vanadium, zirconium, platinum or hafnium, or may be an alloy of two or more of the aforesaid metals. In the case where the low resistance region is a layer of metal, the metal may partially form a silicide with silicon (e.g., in the semiconductor substrate surface and/or the semiconductor layer).

The metal compound may be a low resistance silicide of an elemental metal, or two or more metal elements, and preferably is a high melting point metal silicide. The metal compound may be, for example, a silicide of cobalt, chromium, molybdenum, nickel, palladium, tantalum, tungsten, titanium, vanadium or zirconium, or an alloy of two or more of the aforesaid metals.

The metal compound also may be a low resistance metal nitride (which is a metal nitride whose resistivity is, for example, 1 mΩ·cm or less, preferably 500 μΩ·cm or less, more preferably 300 μΩ·cm or less, more preferably 200 μΩ·cm or less, more preferably 100 μΩ·cm or less, more preferably 50 μΩ·cm or less, more preferably 25 μΩ·cm or less, more preferably 10 μΩ·cm or less, and more preferably 1 μΩ·cm or less) and preferably a nitride of high melting point metal. The metal nitride may be, for example, molybdenum nitride, tantalum nitride, tungsten nitride, titanium nitride or zirconium nitride.

The low resistance region also may have a layered structure, and may be formed of two or more metal layers (e.g., layers of metals that can form a silicide (preferably, high melting point metals)), two or more metal compound layers (e.g., layers of high melting point metal silicide and/or high melting point metal nitride), or one or more metal layers and one or more metal compound layers.

The low resistance region also may be a high concentration impurity diffusion layer. The high concentration impurity diffusion layer constituting the low resistance region may be higher in impurity concentration than one or both of the drift regions which is in contact with the high concentration impurity diffusion layer, for example, 2 or more times higher, preferably 10 or more times higher, more preferably 100 or more times higher, and more preferably 100 or more times higher. The impurity concentration may be, for example, in the range of $10^{18}$ to $10^{21}$ cm$^{-3}$, and may be equal to that of the source region and/or the drain region and/or the gate electrode (in the case where the gate electrode is composed of semiconductor). Impurities include, for example, those of the semiconductor substrate as described above. The impurity diffusion region constituting the low resistance region contains impurities of the same conductivity type as in the drift region in contact with the impurity diffusion region. The impurity species of the impurity diffusion region may be the same as, or different from, the species or species combination of the impurities in the drift region in contact with the impurity diffusion region. The high concentration impurity diffusion layer constituting the low resistance region may be located from the surface of the semiconductor layer formed astride the isolation region and the active region, to the surface layer (the drift region) of the semiconductor substrate.

(Other Elements)

The semiconductor device of the invention may further comprise an interlayer insulator on the source region and the drain region, with a contact hole provided through the interlayer insulator. The interlayer insulator is not limited to any specific one. As the interlayer insulator, it is possible to use any known film, such as a silicon oxide film, an SOG film, or the like. The contact hole is preferably provided onto a portion of the source or drain regions, the portion being on the isolation region. This allows a reduction in parasitic capacitance of the source region and/or the drain region, resulting in a further increase in the operation speed of the semiconductor device. Additional contact hole may be provided onto the gate electrode besides that provided toward the source region and/or the drain region.

The semiconductor device of the invention may further comprise a metal wiring. As the metal wiring, an Al film, a Cu film, or the like can be mentioned.

The semiconductor device of the invention may further comprise a low voltage transistor on the semiconductor substrate.

<Description of the Methods for Manufacturing the Semiconductor Devices>

In brief, the semiconductor device of the invention is manufactured as follows, for example.

An isolation region(s) is/are formed on the first conductivity-type semiconductor substrate.

The isolation region can be formed by any known technique, such as a selection oxidation (LOCOS), trench oxidation, STI, or ion implantation method, or the like. The isolation region is usually formed at a depth of 200 to 500 nm from the surface of the semiconductor substrate.

The upper surface of the isolation region may be on the same level as the surface of the semiconductor substrate, or may be on a higher level (e.g., approximately 50 to 300 nm higher level) than the semiconductor substrate surface (i.e., the isolation region may have a protrusion from the semiconductor substrate surface).

A gate insulator is formed at a location where the gate electrode is to be formed within the active region on the semiconductor substrate, the active region being defined by the isolation region(s). The gate insulator can be formed by a thermal oxidation, CVD or sputtering method or the like.

The gate insulator may be extended to the vicinity of the isolation region on the side which is to have the source region or drain region thereon (the gate insulator may be extended to the vicinity of the isolation regions on the both sides if both of the source region and the drain regions are to be located on the isolation region(s)). In this case, the gate insulator is formed, or the previously formed gate insulator is removed, so that the active region surface is exposed at least in the vicinity of the isolation region (preferably, in an area of the surface of the semiconductor substrate adjacent to the isolation region).

Then, a semiconductor layer (e.g., a polysilicon layer) is formed astride the isolation region on which the source or drain region is to be provided, and the active region. The semiconductor layer is formed so as to be in contact with the active region surface of the semiconductor layer at the side of the isolation region (in the gate length direction).

The semiconductor layer is preferably extended to the gate insulator so that the active region surface of the semiconductor substrate is not exposed. If the active region surface of the semiconductor substrate is exposed, it is possible to inappropriately implant impurities into the active region surface of the semiconductor substrate, on impurity-implanting in the semiconductor layer as described below.

The semiconductor layer formed on the gate insulator can be processed into the gate electrode.

The thickness of the semiconductor layer is not limited specifically, but, for example, in the range of 50 to 750 nm, preferably 50 to 500 nm, and more preferably 100 to 300 nm. The semiconductor layer can be formed by a CVD or a sputtering method.

The size of the contact area of the semiconductor layer formed astride the isolation region and the active region with the active region surface of the semiconductor substrate is determined appropriately so that the manufactured semiconductor device achieves desired functions. For example, the contact area size in the gate length direction may be equal to, or larger than, the junction depth of the drift region provided in the surface layer of the semiconductor substrate. The contact area size in the gate width direction may be equal to, or larger than, that of the low concentration diffusion region provided in the surface layer of the semiconductor substrate. It is preferable that the dimensions of the contact area are 0.1 µm or more.

The position of the contact area in the gate length direction is selected appropriately by taking into consideration the drift length to be given. For example, in the case where the source or drain region is located only on the isolation region, the contact area can be located in anywhere between the channel region and the isolation region, since the drift length to be given is not varied according to the position of the contact area. On the other hand, in the case where the source or drain region contacts at the contact area with the drift region provided in the surface layer of the semiconductor substrate, a region between the channel region and the contact area functions as a drift region and thus the drift length is a length therebetween. Therefore, in order to ensure the drift length, it is preferable that the contact area is located as far away as possible from the channel region, i.e., only in the vicinity of the isolation region (preferably adjacent to the isolation region). It is possible to achieve such an arrangement of the contact area by, for example, forming the gate insulator so as to extend to the vicinity of the isolation region.

Next, a low concentration diffusion region is formed by introducing second conductivity-type impurities into portions to be the drift regions in the semiconductor layer and the surface layer of the semiconductor substrate within the active region. The impurities may be simultaneously introduced into a portion(s) which is/are to be processed into the source and/or drain region(s). It is preferable to mask a portion to be the channel region so that the impurities are not introduced thereinto. In the case where the gate electrode is formed by processing the semiconductor layer, the impurities may be introduced also into a portion to be processed into the gate electrode.

In the surface layer of the semiconductor substrate within the active region, it is preferable that the low concentration diffusion region is also formed partially under the gate insulator so that the low concentration diffusion region is extended under the gate electrode which will be formed later.

The introduction of impurities is carried out by, for example, an ion implantation method. The conditions for ion implantation (such as acceleration energy, dose amount, and ion species) are not limited specifically and can be selected appropriately so that the region where the impurities are implanted functions adequately. The ion implantation may be carried out with varying acceleration energy or at different acceleration energies, and/or at different dose amounts, in order for the impurities to reach the semiconductor substrate surface layer (where is the portion to be the drift region) within the active region that is covered with the semiconductor layer.

The acceleration energy is selected appropriately according to the ion species and the required reach depth. If, for example, phosphorus ions are used, it is possible to select the acceleration energy in the range of 20 to 200 KeV for the implantation into a superficial area (e.g., 500 nm or less in depth), and in the range of 150 to 400 KeV for the implantation into a deeper area (e.g., 300 nm or more in depth).

The dose amount for the low concentration diffusion region is, for example, in the range of $1.0 \times 10^{11}$ to $5.0 \times 10^{13}$ ions/cm$^2$.

In the case where the low concentration diffusion region is formed in the surface layer of the semiconductor substrate through the semiconductor layer, the ion implantation is carried out at, for example, a lower acceleration energy at first. At this time, the ions are implanted into the formed semiconductor layer near the surface. Next, the ion implantation is carried out at a higher acceleration energy. At this time, most of the ions are implanted into the surface layer of the semiconductor substrate deeper from the surface, although the ions are implanted also into the formed semiconductor layer near the surface. As the result, the low concentration diffusion regions having the desired concentration are formed both in the semiconductor layer and the surface layer of the semiconductor substrate. Of course, the ion implantation may be carried out at a higher acceleration energy at first, and then at a lower acceleration energy.

As the ion species to be implanted, it is possible to use any of those commonly used as impurities. The ion species include, for example, phosphorous ion (P$^+$), arsenic ion (As$^+$), antimony ion (Sb$^+$), boron ion (B$^+$, BF$_2^+$), indium ion (In$^+$) and the like. A single ion species may be used, or two or more ion species may be used. If two or more ion species are used, they can be implanted separately or in mixture. After the implantation, the impurity diffusion may be facilitated by heat treatment.

The ion implantation can be carried out through the gate insulator.

In the case where only one of the source region and the drain region is located on the isolation region, the ion implantation may be carried out in separate steps at the side having the source or drain region on the isolation region, and at the side having the source or drain region in the surface layer of the semiconductor substrate. It is also possible to carry out multiple ion implantations. In the latter case, lower energy ion implantation is carried out on both sides, and when higher energy ion implantation is carried out, the side having the source or drain region in the surface layer of the semiconductor substrate may be masked.

At this time, in the case where the gate electrode is made by processing the formed semiconductor layer, the semiconductor layer may be cut and separated into part to be processed into the gate electrode, and the part(s) to be processed into the source region (and the draft region) and/or the drain region (and the drift region), by photolithography techniques.

It is preferable to form a side wall spacer of an insulator film (e.g., SiO$_2$ based film) on the sides of the separate parts. The side wall spacer can be formed in a desired width (e.g., a width of 100 to 500 nm at the bottom) by any known methods in the art.

Any unnecessary part(s) of the semiconductor layer may be removed, or may be left stand unless it/they affect(s) the performance of the semiconductor device to be manufactured.

Next, portion(s) to be formed into the source region and/or drain region of the formed semiconductor layer is/are processed into high concentration diffusion region(s) by introducing the second conductivity-type impurities. In the case where the gate electrode is formed from the semiconductor layer, the impurities may be introduced simultaneously into the portion to be the gate electrode. In this case, the gate electrode has the same impurity concentration as the source region and/or drain region located on the isolation region(s). The impurities may be the same as, or different from, those used in forming the low concentration diffusion region. Preferably, the introduction of the impurities is carried out by the ion implantation as described above. The dose amount of the impurities for forming the high concentration diffusion region is, for example, in the range of $1.0 \times 10^{14}$ to $1.0 \times 10^{17}$ ions/cm$^2$.

In the case where the low concentration diffusion region in the surface layer of the semiconductor substrate alone is sufficient to obtain the desired drift length, the semiconductor layer astride the isolation region and the active region and in contact with the active region surface of the semiconductor substrate may be formed entirely into a high concentration diffusion region at this moment since it is not necessary to provide a low concentration diffusion region as the drift region to the semiconductor layer. It is preferable that the impurity concentration at an area in contact with the substrate is in the range of $10^{16}$ to $10^{18}$ cm$^{-3}$.

It is not necessary that the formed semiconductor layer is processed entirely into the source region and/or the drain region, or into the source and drift regions and/or the drain and drift regions. There may be a portion(s) not functioning as any element(s), in the form of undoped, or low- or high concentration diffusion regions, in the formed semiconductor layer, unless it/they affect(s) the performance of the semiconductor device to be manufactured.

In addition, an interlayer insulator (e.g., a CVD oxide film) may be formed all over the surface, and if necessary, a contact hole and/or metal wiring may be formed.

Furthermore, a low voltage transistor may be formed on the same semiconductor substrate. The low voltage transistor can be formed by any known methods in the art.

In the above, the descriptions are made mainly for the source region and/or drain region located on the isolation region(s), and the drift region(s) connected thereto. Any other necessary elements such as the isolation region(s), and the gate electrode if it is not formed from the semiconductor layer can be formed by any techniques known in the art. In the case where the semiconductor device of the invention has the source or drain region located not on the isolation region, the source or drain region (and the drift region connected thereto, if present) can be formed by any conventional methods.

In the above methods, it is possible to form the source or drain region located on the isolation region and the gate electrode by processing a single layer of a semiconductor film formed on the isolation region and the active region. This allows the simplification of the manufacturing process.

The semiconductor device of the invention may further comprise a low resistance region that is in contact with the drift region provided in the formed semiconductor layer, and the drift region provided in the surface layer of the semiconductor substrate within the active region, as described in the section "Description of the semiconductor devices" above. In the above manufacturing method, the low resistance region can be formed as described below, for example.

Firstly, after forming the gate insulator and before forming the semiconductor layer astride the isolation region where the source or drain region is provided and the active region, a film of metal or metal compound as described above (e.g., a metal selected from the group consisting of high melting point metals, transition metals and noble metals, or silicide or nitride thereof) is formed all over the semiconductor substrate.

The metal film can be formed by any known methods, such as a sputtering method, a deposition method (e.g., a vacuum evaporation, CVD or EB method), an ion spraying method, and the like.

The metal silicide film may be formed by heat-treating the previously deposited metal film as described above so as to be formed into a silicide. The heat treatment is carried out under conditions that are commonly used in the silicide formation, such as under vacuum, in an atmosphere of nitrogen gas or an inert gas (e.g., argon), and at a temperature of 400 to 1,200° C. (in particular, in the range of 600 to 1,000° C.). The time period for the heat treatment can be determined according to the thickness of the silicide film to be formed, the heat treating method to be used and others. If an RTA (Rapid Thermal Anneal) method is used, for example, the time period can be shortened such as several tens of seconds to several minutes.

The unreacted (or unnecessary) part of the metal film may be removed by wet-etching with use of an acid (such as sulfuric acid or fluorine acid) and/or an alkali (such as ammonium hydroxide), or dry etching with use of $CF_4$ (carbon tetrafluoride) gas.

Then, the metal silicide film may be subjected to an additional heat treatment so as to achieve lower resistant. The conditions for the additional heat treatment may be the same as, or different from, those of the silicide formation step (the temperature may be a higher or lower temperature (e.g., in the range of 800 to 900° C.)).

The metal silicide film can be also formed by introducing metal ions selectively in an area where the silicide film is to be formed, by the use of, for example, ion implantation and then the heat treatment as described above. Or, the metal silicide film also can be formed directly on the semiconductor substrate surface by feeding simultaneously metal film material gas and silane gas.

The metal nitride film can be formed by sputtering, for example, in an atmosphere of nitrogen-containing mixed gas (e.g., a mixed gas of Ar and $N_2$) so as to directly form a nitride film. Alternatively, the metal nitride film can be formed into a nitride film by heat-treating a previously deposited metal film, for example, in a nitriding atmosphere (such as, in $N_2$ gas). During the heat treatment, a part of metal elements in the metal nitride film may be silicidated.

The thickness of the formed metal film or metal compound film is not limited specifically, and is in the a range of, for example, 5 to 200 nm, and preferably 50 to 200 nm.

The formed metal film or metal compound film is patterned by known photolithography techniques. Examples of an opening pattern of the photoresist used for patterning the film are shown in FIG. 16.

Figure 16:
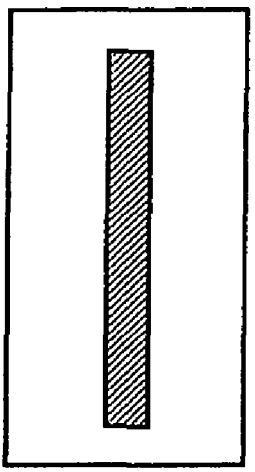
FIG. 16 shows examples of layout pattern of low resistance region, wherein line AB indicates the position of the gate electrode-side end of the isolation region on which a source or drain region is located, and line CD indicates the position of the isolation region-side end of the gate insulator, and shading indicates the area where low resistance regions are formed.
Figure 16:
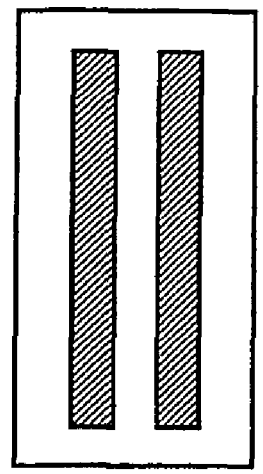
Figure 16:
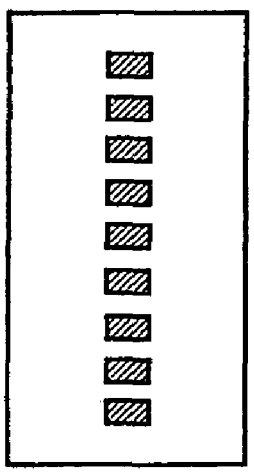
Figure 16:
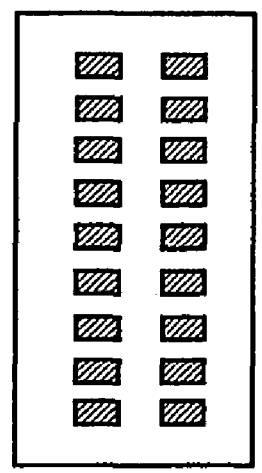
Figure 16:
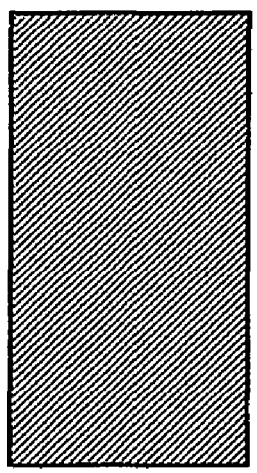
Figure 16:
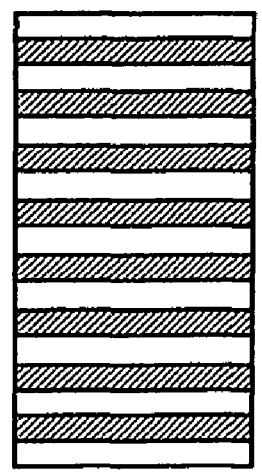
Figure 17:
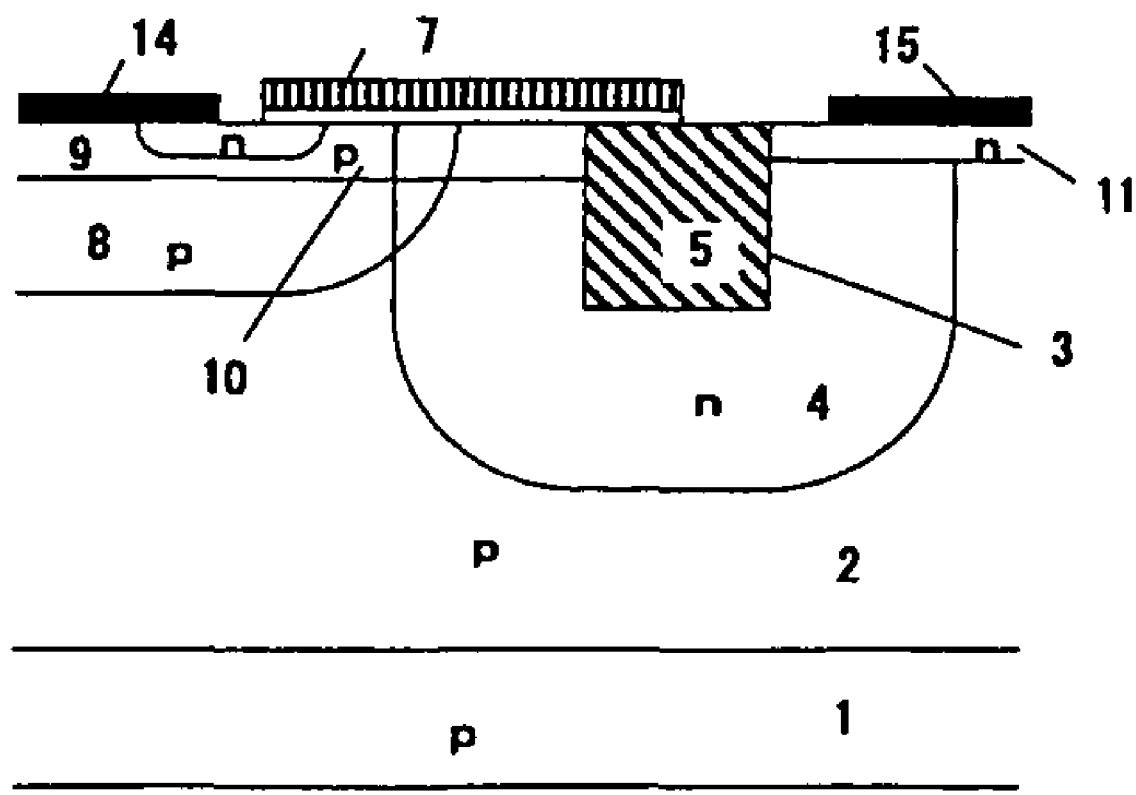
FIG. 17 illustrates a conventional semiconductor device.

In FIG. 16, the right end corresponds to the position of the side end, toward the gate electrode, of the isolation region on which the source or drain region is formed, the left end corresponds to the position of the side end, toward the said isolation region, of the gate insulator, and the width in the vertical direction corresponds to the gate width. FIG. 16a) exemplifies a pattern of single stripe opening parallel to the gate width direction. FIG. 16b) exemplifies a pattern of stripe openings parallel to the gate width direction. FIG. 16c) exemplifies a pattern of aligned discrete openings parallel to the gate width direction. FIG. 16d) exemplifies a pattern of a plurality of aligned openings parallel to the gate width direction. FIG. 16e) exemplifies a pattern of an opening which is fully opened. FIG. 16f) exemplifies a pattern of one or more aligned openings crossing from the end of the isolation region to the end of the gate insulator in the gate width direction. Although FIGS. 16a) to f) show the individual openings in the shape of rectangle, the shape is not limited thereto. It is easily understood by those skilled in the art that the openings may be in any shape (such as, a square or a circle).

It is to be noted that the layout patterns shown in FIG. 16 are examples, and layout patterns can be any shape and array/arrange, as long as a low resistant electrical connection is established between the two low concentration diffusion regions (or the drift regions) in the semiconductor substrate surface and the semiconductor layer.

The total area of an opening(s) may be, for example, 5 to 100% of the contact area between the drift region in the semiconductor substrate surface and the semiconductor layer, on the assumption that the spontaneous oxide film is not formed on the semiconductor substrate surface.

If the low resistance regions are formed on both of the source region side and the drain region side, the same opening pattern may be used on the both sides, or different patterns may be used on the respective side. It is preferable to use the same pattern.

Next, the semiconductor layer is formed astride the isolation region(s) and the active regions with the semiconductor layer covered with the patterned metal or meal compound film.

The subsequent steps are as described above.

It is not necessary to remove the spontaneous oxide film ($SO_2$ film). In the case where the spontaneous oxide film is removed, it can be removed in at least an area of the semiconductor substrate surface where the metal film or metal compound film is to be formed, by washing (e.g., with an aqueous HF solution or an anhydrous HF), argon ion sputtering, plasma etching with an inert gas, or reducing (e.g., in a hydrogen atmosphere), before forming the metal film or metal compound film all over the semiconductor substrate. A metal silicide film can be formed without an additional step of removing the spontaneous oxide film by the use of the technique described in Japanese Patent Laid-Open Publication No. 2002-217130.

Secondly, the low resistance region can be formed as a high concentration diffusion region by introducing the second conductivity-type impurities into the low concentration diffusion region in the semiconductor substrate surface, at an appropriate point of time after forming the semiconductor layer astride the isolation region on which the source or drain region is to be formed and the active region (e.g., after forming the low concentration diffusion regions in the semiconductor layer and the surface layer of the semiconductor substrate). The impurities are introduced through the spontaneous oxidation ($SO_2$) film at high concentration, and diffused by the heat treatment, thereby destroying the spontaneous oxidation film so as to establish a low resistance electrical connection between the two low concentration diffusion regions (or the drift regions) in the semiconductor substrate surface and the semiconductor layer.

The impurities to be introduced may be the same as, or different from, those used in forming the low concentration diffusion regions. The impurity introduction is preferably carried out by the ion implantation as described above. The photoresist used for the impurity introduction may have an opening pattern as shown in FIG. 16. The dose amount is, for example, in the range of $1.0 \times 10^{14}$ to $1.0 \times 10^{17}$ ions/cm$^2$. The impurity introduction may be carried out at the same time as the introduction of the impurities at high concentration into the portion(s) to be processed into the source region and/or the drain region and/or gate electrode, or separately under different conditions. The heat treatment can be carried out, after introducing the impurities, by a commonly used method (e.g., the RTA method) and under commonly used conditions.

The impurities are introduced through the semiconductor layer or from the semiconductor substrate surface. In order to ensure that the impurities are introduced at a high concentration into the low concentration diffusion region (or the drift region) in the semiconductor substrate surface, a partial or the entire thickness of the semiconductor layer may be removed by etching in the area where the impurities are introduced. The removal of the partial or entire thickness of the semiconductor layer may be carried out alone, or at the same time as etching the layer for another purpose.

Also in the method for manufacturing the semiconductor device of the invention which will be described below, the low resistance region can be formed as described above, if necessary.

The semiconductor device of the invention also may be manufactured as follows.

In the active region of the first conductivity-type semiconductor substrate having an isolation region(s) formed as described above, the second conductivity-type impurities are introduced by known photolithography techniques so that low concentration regions are formed. During this time, it is preferable to mask a portion to be the channel region so that the impurities are not introduced thereinto. In the case of manufacturing the semiconductor device with only one of the source region and the drain region located on the isolation region, the impurities may be introduced into the active region only on the side of the gate electrode toward the source or drain region located on the isolation region. The impurity introduction is preferably carried out by the ion implantation as described above.

Next, on the gate insulator formed on the semiconductor substrate within the active region, the gate electrode is formed over the channel region, and preferably also over the low concentration diffusion regions. At this time, the gate electrode may be a completed electrode, or a semiconductor film (e.g., a polysilicon film)) which is an uncompleted electrode and thus needs to be further processed.

It is preferable that side wall spacers are formed on the sides of the gate electrode or the semiconductor film that is an uncompleted electrode.

The gate insulator may be extended to the vicinity of the isolation region on the side toward the source region and/or the drain region to be located on the isolation region, as described above.

Then, the semiconductor layer (e.g., a polysilicon layer) is formed astride the isolation region on which the source region or drain region is to be provided and the active region. The semiconductor layer is formed so as to be in contact with the exposed surface of the semiconductor substrate within the active region, as described above.

The formed semiconductor layer may entirely cover the exposed area of the semiconductor substrate within the active region. It also may be extended over the gate insulator. Over the gate insulator, the semiconductor layer may cover the gate electrode (or the semiconductor film that need to be further processed into the gate electrode) and/or the side wall spacers totally or partially (e.g., at least one end in the gate length direction). In this case, it is preferable to previously mask the gate electrode (or the semiconductor film) with an insulating film such as an $SiO_2$ or SiN film. This insulating film can work for ensuring the electrical insulation between the formed semiconductor layer and the gate electrode (or the semiconductor film to be processed into the gate electrode). In the implantation of the impurities at high concentration into the formed semiconductor layer and the semiconductor film to be processed into the gate electrode, the insulating film together with the gate insulator may also work for preventing from the introduction of the impurities at high concentration into the surface layer of the semiconductor substrate.

In the case of manufacturing the semiconductor device with both of the source region and the drain region located on the isolation regions, the formed semiconductor layer may be made in the form of a single layer astride one of the isolation regions and the other thereof, or in the form of two layers that are spaced apart from each other over the gate electrode (or the semiconductor film to be processed into the gate electrode).

That the formed semiconductor layer is extended over the gate insulator (and further extended over the gate electrode and/or the side wall spacer) allows the easy prevention from the implantation of impurities at high concentration into the (low concentration) drift region in the surface layer of the semiconductor substrate due to the misalignment of the photoresist or others, in forming the high concentration diffusion regions as detailed below.

In the case where the formed semiconductor layer is made with the gate electrode entirely covered therewith, the semiconductor layer is removed over the gate electrode in order to electrically isolate the partial semiconductor layer on the side toward the source region from the partial semiconductor layer on the side toward the drain region. In the case where the formed semiconductor layer is made with the entire or a part of the semiconductor film covered therewith, the semiconductor film being uncompleted as a gate electrode, the formed semiconductor layer is removed at least over the channel region in order to electrically isolate the partial semiconductor layer on the side toward the source region from the partial semiconductor layer on the side toward the drain region, and/or to process the semiconductor film into the gate electrode (e.g., by doping the film with ions).

The portion(s) to be the drift region(s) of the formed semiconductor layer is processed into the low concentration diffusion region(s) by introducing the second conductivity-type impurities thereinto. The impurities may be the same as, or different from, those used in forming the low concentration diffusion region in the surface layer of the semiconductor substrate. It is necessary that the impurities reach the low concentration diffusion region in the surface layer of the semiconductor substrate under the formed semiconductor layer. The introduction of the impurities is preferably carried out by the ion implantation as described above.

The impurities may be simultaneously introduced into the portion(s) to be the source region and/or the drain region. At this time, if the semiconductor film constituting the gate electrode is remained impurity-uncontained (and thus an uncompleted gate electrode), the impurities may be introduced also into the semiconductor film.

In the case where the low concentration diffusion region in the surface layer of the semiconductor substrate alone can obtain the desired drift length, this step can be omitted since the low concentration diffusion region does not need to be present as the drift region in the semiconductor layer.

Then, the portion(s) to be processed into the source region and/or drain region of the formed semiconductor layer is/are processed into the high concentration diffusion region(s) by introducing the second conductivity-type impurities thereinto. Simultaneously, the impurities may be introduced into the semiconductor film constituting the gate electrode, thereby processing it into a completed gate electrode. In this case, the gate electrode has the same impurity concentration as the source or drain region located on the isolation region. The impurities may be the same as, or different from, those used in forming the low concentration diffusion region. Preferably, the introduction of the impurities is carried out by the ion implantation as described above.

Next, the insulating film on the gate electrode is removed.

In addition, an interlayer insulator (e.g., a CVD oxide film) may be formed all over the surface, and a contact hole and/or metal wiring may be formed, if necessary.

In the above, the descriptions are made mainly for the source or drain region located on the isolation region and the drift region connected thereto. Any other necessary elements, such as the isolation region(s) and the gate electrode which is not formed from the semiconductor layer, can be formed by any of the known techniques in the art. In the case where the semiconductor device of the invention has the source or drain region which is not located on the isolation region, the source or drain region (and the drift region connected thereto, if present) can be formed by any conventional methods.

The semiconductor device of the invention also may be manufactured as follows.

On the first conductivity-type semiconductor substrate having an isolation region(s) formed as described above, a first semiconductor layer (e.g., a polysilicon layer) is formed astride the isolation region on one side of the active region and the isolation region on the other side in the gate length direction with the active region therebetween covered with the first semiconductor layer. The formation of the semiconductor layer can be carried out by the method as described above.

The formed first semiconductor layer is at least partially in contact with the surface of the semiconductor substrate within the active region on the both sides of the portion to be the channel region.

A first insulating film (e.g., an silicon oxide film) may be formed on the semiconductor layer. Since the first insulating film can function as insulation between the drift region formed in the semiconductor layer and the gate electrode provided on the insulating film, it may be required to have a sufficient thickness (e.g., 50 to 100 nm) to be resistant to the potential difference between the drift region and the gate electrode. The insulating film, as well as the semiconductor layer, can be formed by a CVD, sputtering or heat oxidation method.

Next, the portions to be processed into the drift regions of the formed semiconductor layer and the active region surface of the semiconductor substrate are processed into the low concentration diffusion regions by introducing second conductivity-type impurities thereinto. Simultaneously, the impurities may be introduced into the portion(s) to be processed into the source and/or drain region(s) in the semiconductor layer. It is preferable to mask the portion, where the channel region is to be provided, of the surface layer of the semiconductor substrate so that the impurities are not introduced thereinto. The impurities may be introduced into the semiconductor layer under the mask. Preferably, the introduction of impurities is carried out by the ion implantation as described above. The low concentration diffusion region in the first semiconductor layer and the low concentration diffusion region in the semiconductor substrate may be formed simultaneously or sequentially, and preferably is formed simultaneously.

The formed semiconductor layer is bisected into a part to be processed into the source region and the drift region (hereinafter referred to as source region-forming part of the semiconductor layer) and a part to be processed into the drain region and the drift region (hereinafter referred to as drain region-forming part of the semiconductor layer) by photolithography techniques for example. The bisection is carried out by removing a portion(s) of the first semiconductor layer and, if necessary, an insulating film formed thereon at least over the channel region (in the gate length direction, and completely in the thickness direction). It is preferable to remove the semiconductor layer so as to expose a portion of the low concentration diffusion region formed in the surface layer of the semiconductor substrate as well as the channel region, in order to partially overlap the gate electrode to be formed between the bisected semiconductor layers and the drift region consisting of the low concentration diffusion region in a subsequent step.

In the case where the low concentration diffusion region is not exposed when the semiconductor layer is bisected, the gate electrode and the drift region may be partially overlapped by heat treatment after forming the gate electrode so as to diffuse the impurities to a potion of the channel region.

If it is expected to etch the surface layer of the semiconductor substrate in removing the semiconductor layer, it is preferable that a second insulating film (e.g., a silicon oxide film) is formed with the semiconductor substrate surface layer (at least the surface of the portion to be the channel region) covered with the second insulating film at the bisecting position before depositing the semiconductor layer while the semiconductor substrate surface at an area adjacent to the isolation region(s) is exposed, in order to avoid any damage of the surface layer of the semiconductor substrate. The second insulating film is preferably removed after bisecting the semiconductor layer and the insulating film thereon. The formation and removal of the second insulating film can be carried out by, for example, known photolithography techniques.

It is preferable to provide side wall spacers on the sides of each of the bisected semiconductor layers. In order to ensure insulation between the gate electrode and the source or drain region that are formed to be juxtaposed to each other in a subsequent step, the side wall spacers are required to have a sufficient thickness (e.g., 100 to 500 nm) to be resistant to the potential difference between the gate electrode and the source or drain region. The side wall spacers can be formed by any known methods in the art (e.g., a combination of CVD method and etch back method, oxidation treatment of surface layers).

The gate insulator is formed on the exposed surface layer of the semiconductor substrate between the bisected semiconductor layers by a known method (e.g., a heat oxidation method).

Next, another semiconductor layer (e.g., a polysilicon film; hereinafter referred to as "gate electrode-forming semiconductor layer") that is to be processed into the gate electrode in a subsequent step is formed at least on the gate insulator by known photolithography techniques. The gate electrode-forming semiconductor layer may be formed on the insulating film formed on the source region-forming part and/or the drain region-forming part of the semiconductor layer. Preferably, the gate electrode-forming semiconductor layer is formed which partially overlaps with the insulating films on the source region-forming part and the drain region-forming part of the semiconductor layer but not the end portions of the source region-forming part and the drain region-forming part of the semiconductor layer, the end portions being to be processed into the source and drain regions in a subsequent step.

It is preferable to form the side wall spacers on both sides of the gate electrode-forming semiconductor layer.

If any insulating films are present over the end portions of the source region-forming part and the drain region-forming part of the semiconductor layer, the end portions being to be processed into the source and drain regions in a subsequent step, it is preferable to remove the insulating films at this time. The removal of the insulating films may be carried out in the course of formation of the side wall spacers as described above.

Then, the end portions of the source region-forming part and the drain region-forming part of the semiconductor layer, the end portions being to be the source and drain regions, and the gate electrode-forming semiconductor layer are processed into the high concentration diffusion regions by introducing second conductivity-type impurities thereinto. The impurities may be the same as, or different from, those used in forming the low concentration diffusion region. Preferably, the introduction of the impurities is carried out by the ion implantation as described above.

In addition, an interlayer insulator (e.g., a CVD oxide film) may be formed all over the surface, and a contact hole and/or metal wiring may be formed, if necessary. It is preferable that the contact hole connecting with the gate electrode is formed onto a portion of the gate electrode, the portion being located on the isolation region.

According to this manufacturing method, it is possible to improve the alignment accuracy of the gate length, and the source region to be formed in the source region-forming part and the drain region to be formed in the drain region-forming part, since the gate length is determined between the source region-forming part and the drain region-forming part in a self-aligning manner.

It is also possible to further downsize the chip size, since the gate electrode is formed which is extended over the isolation region in every transistor, and thus an additional step is not required for drawing a lead from the gate electrode on to the isolation region.

In the above, the descriptions are made mainly for the source and drain regions, the drift regions connected thereto, and the gate electrode. Any other necessary elements can be formed by any known techniques in the art.

The semiconductor device of the invention also may be manufactured as follows.

In the active region of the first conductivity-type semiconductor substrate having an isolation region(s) formed as described above, second conductivity-type low concentration regions are formed on both sides of the portion to be the channel region by, for example, the ion implantation as described above preferably with the portion to be the channel region masked.

Next, the gate electrode is formed on the gate insulator formed at least on the portion of the semiconductor substrate within the active region, the portion to be the channel region, as described above. At this time, the gate electrode may be a completed electrode, or a semiconductor film that is an uncompleted electrode, as described in the above method.

Next, an insulating film (e.g., a CVD oxide film) for a buried semiconductor layer is formed all over the surface.

The insulating film having a sufficient thickness is formed to obtain the desired drift length according to the desired transistor's characteristics (especially the voltage resistance), since the thicker the insulating film is, the longer drift length can be obtained as described below.

The thickness of the insulating film is, for example, 600 nm or more. The thickness of 600 nm or more is preferable since it is possible to ensure that the drift length achieves an on-state breakdown voltage of about 20 V or more in a subsequent step without expanding the horizontal size. Here, the on-state breakdown voltage is the voltage at which the transistor is broken down by biasing the drain and the gate (i.e., the transistor is in the on-state).

The upper limit of the thickness of the insulating film is not specifically defined, but it can be, for example, 2,000 nm or less, or 1,100 nm or less, considering that it also affects the total thickness (or height) of the semiconductor device to be manufactured.

Next, an opening is formed in the insulating film by removing part of the insulating film so as to expose the semiconductor substrate surface within the active region where the second conductivity-type low concentration diffusion region is provided as described above, and the isolation region adjacent to the second conductivity-type low concentration diffusion region.

The size of the exposed area of the second conductivity-type low concentration diffusion region in the opening is determined appropriately so as to achieve the desired functions in the semiconductor device to be manufactured.

The size of the exposed area of the isolation region in the opening is not limited specifically, and may be a sufficient size for the source/drain region formed in the opening in a subsequent step to be located at least in part on the isolation region.

The dimensions of the opening can be such that the source/drain region to be formed in the opening in a subsequent step has a horizontal dimension sufficient to function.

Next, a buried semiconductor layer is formed by filling the opening with a semiconductor material. The semiconductor material may be the same as, or different from, the material constituting the semiconductor substrate. It is preferable that the semiconductor material is the same as the material constituting the semiconductor substrate. In the case where the semiconductor substrate is a silicon substrate, for example, it is preferable that the semiconductor material is polysilicon.

In forming the buried semiconductor layer, the semiconductor material deposited outside the opening may be removed by polishing it with a CMP method. The insulating film may be used as a stopper for polishing. Alternatively, polishing may be continued until the upper surface of the buried semiconductor layer is on the same level as the upper surface of the gate electrode (or the semiconductor film which is to be further processed into the gate electrode). This is preferable, in the case where no drift region is provided in the buried semiconductor layer.

Next, in the buried semiconductor layer, second conductivity-type impurities are introduced to form a low concentration region, which is in contact with the low concentration diffusion region in the surface layer of the semiconductor substrate. The introduction of the impurities is preferably carried out by the ion implantation as described above. In the case where no drift region is provided in the buried semiconductor layer, it is possible to omit this step.

In the case where the gate electrode is formed of semiconductor and is not yet completed at this time, the insulating film may be removed, if necessary, over the gate electrode-forming semiconductor layer. It is preferable that in the gate length direction, the insulating film is removed at least over the entire gate length.

Next, second conductivity-type impurities are introduced in the portion (preferably, the upper end portion) which is to be the source/drain region of the buried semiconductor layer, so as to form a low concentration diffusion region(s). The impurities may be the same as, or different from, those used in forming the low concentration diffusion region. Preferably, the introduction of the impurities is carried out by the ion implantation as described above. The impurities may be simultaneously introduced also into the gate electrode-forming semiconductor layer, if necessary.

The low concentration diffusion region remaining in the buried semiconductor layer at this time, together with the low concentration diffusion region provided in the semiconductor substrate surface, constitute a drift region. If the buried semiconductor layer is thicker, it is possible to ensure a longer drift length in the buried semiconductor layer, and thus it is possible to shorten the drift length in the semiconductor substrate surface. Therefore, the semiconductor device can be downsized in the gate length direction.

Since the thickness (the height) of the buried semiconductor layer may depend on the thickness of the insulating film for forming the buried semiconductor layer as described above, the thickness of the insulating film can be determined appropriately in consideration of the desired drift length and the obtainable drift length in the semiconductor substrate surface.

In addition, an interlayer insulator (e.g., a CVD oxide film) may be formed all over the surface, and a contact hole and/or metal wiring may be formed if necessary.

According to this manufacturing method, it is possible to obtain the desired drift length by appropriately setting the thickness of the buried semiconductor layer. It is also possible to make the position of the source region/drain region fixed while having different drift lengths. Thus, it is possible to manufacture the semiconductor devices with different drift lengths in the same manufacturing apparatus (e.g., without changing the mask or the like).

In the above, the descriptions are made mainly for the source and drain regions, the drift regions connected thereto, and the gate electrode. Any other necessary elements can be formed by any known techniques in the art.

Hereinafter, the semiconductor devices and the methods for manufacturing the same according to the present invention will be specifically described with reference to the drawings. Each example is an embodiment of the semiconductor devices and their manufacturing methods of the invention, and is provided only for illustrating the semiconductor devices and their manufacturing methods of the invention. The present invention is not limited to the examples.

EXAMPLES

Example 1

In this example, the source and drain regions, the partial drift regions connected thereto and the gate electrode were made from a single polysilicon layer formed astride the isolation region and the active region (FIGS. 1(a) to 1(f)).

As shown in FIG. 1(a), isolation regions 104, having a depth of 300 to 500 nm, are formed on a P-type semiconductor substrate 102 by known STI techniques. The active region is defined as being between the two isolation regions 104.

Next, a gate oxide film 106, having a thickness of 40 nm, is formed by known photolithography techniques with a photoresist 108 in such a manner as to expose surfaces 140 of the P-type semiconductor substrate 102 (FIG. 1(b)).

Then, after deposing a polysilicon film 110 with a thickness of 250 nm by a CVD method, phosphorous ions are implanted into the polysilicon film 110 and the P-type semiconductor substrate 102, with a portion to be the channel region of the semiconductor substrate masked, under the two conditions such as a dose amount of $8.0\times10^{12}$ ions/cm$^2$ and an energy of 120 KeV, and a dose amount of $5.0\times10^{12}$ ions/cm$^2$ and an energy of 250 KeV, so as to form low concentration N-type diffusion layers 112 and 114 having an impurity concentration of about $5\times10^{17}$ cm$^{-3}$ (FIG. 1(c)).

Next, as shown in FIG. 1(d), the polysilicon film 110 is divided into three parts (a source region-forming part 118, a drain region-forming part 120 and a gate electrode-forming part 122) by known photolithography techniques with a photoresist 116. Here, the lower surfaces of the lateral source region-forming part 118 and the lateral drain region-forming part 120 each are at least partially in contact with the surface 140 of the semiconductor substrate 102. The middle gate electrode-forming part 122 is located on the gate oxide film 106 in such a manner as to cover at least the channel region in the semiconductor substrate 102, and is not contacted with the surface 140 of the semiconductor substrate 102. The three parts 118, 120 and 122 are subsequently processed into the source region and the partial drift region connected thereto, the drain region and the partial drift region connected thereto, and the gate electrode, respectively.

Side wall spacers 124 of SiO$_2$ film are formed on the both sides of each of the source region-forming part 118, the drain region-forming part 120 and the gate electrode-forming part 122. Subsequently, arsenic ions are implanted into portions of the source region-forming part 118 and the drain region-forming part 120 (the portions are located on the isolation regions 104) and the gate electrode-forming part 122 at a dose amount of $3.0\times10^{15}$ ions/cm$^2$ and an energy of 40 KeV by known photolithography techniques. And then, the arsenic ions are activated by heat treatment so as to form high concentration N-type diffusion layers having an impurity concentration of about 0.3 to $1\times10^{23}$ cm$^{-3}$ (FIG. 1(e)). The high concentration N-type diffusion layers 128 and 130 in the source region-forming part 118 and the drain region-forming part 120 will act as a source region and a drain region respectively, and the high concentration N-type diffusion layers 132 in the gate electrode-forming part 122 will act as a gate electrode.

Lastly, as shown in FIG. 1(f), a CVD oxide film 134 is deposited and then contact holes are opened, and wiring metal material is patterned so as to form electrodes 136 and 138.

In the semiconductor device of the present example, each drift region is composed of not only the low concentration N-type diffusion layer 112 or 114 in the semiconductor substrate 102 within the active region, but also the low concentration N-type diffusion layer in the source region-forming part 118 or the drain region-forming part 120, which is formed from the polysilicon film 110 deposited astride the isolation regions and the active region. The drift length L is longer in the semiconductor device of the present example than in a similar size semiconductor device wherein the drift regions are provided only within the active region surface of the semiconductor substrate. In other words, the semiconductor device of the present example has the size including isolation regions miniaturized, as compared to a conventional semiconductor device having the same drift length.

In the semiconductor device of the present example, since both of the source and drain regions are provided on the isolation regions, junction capacitances (parasitic capacitances) between the source and drain regions and the silicon substrate are reduced to a negligible degree and thus it is possible to operate the semiconductor device much faster.

Example 2

In this example, the source and drain regions, and the gate electrode were made from a single polysilicon layer formed astride the isolation region and the active region (FIGS. 2(a) to 2(f)).

Figures 1, 2:
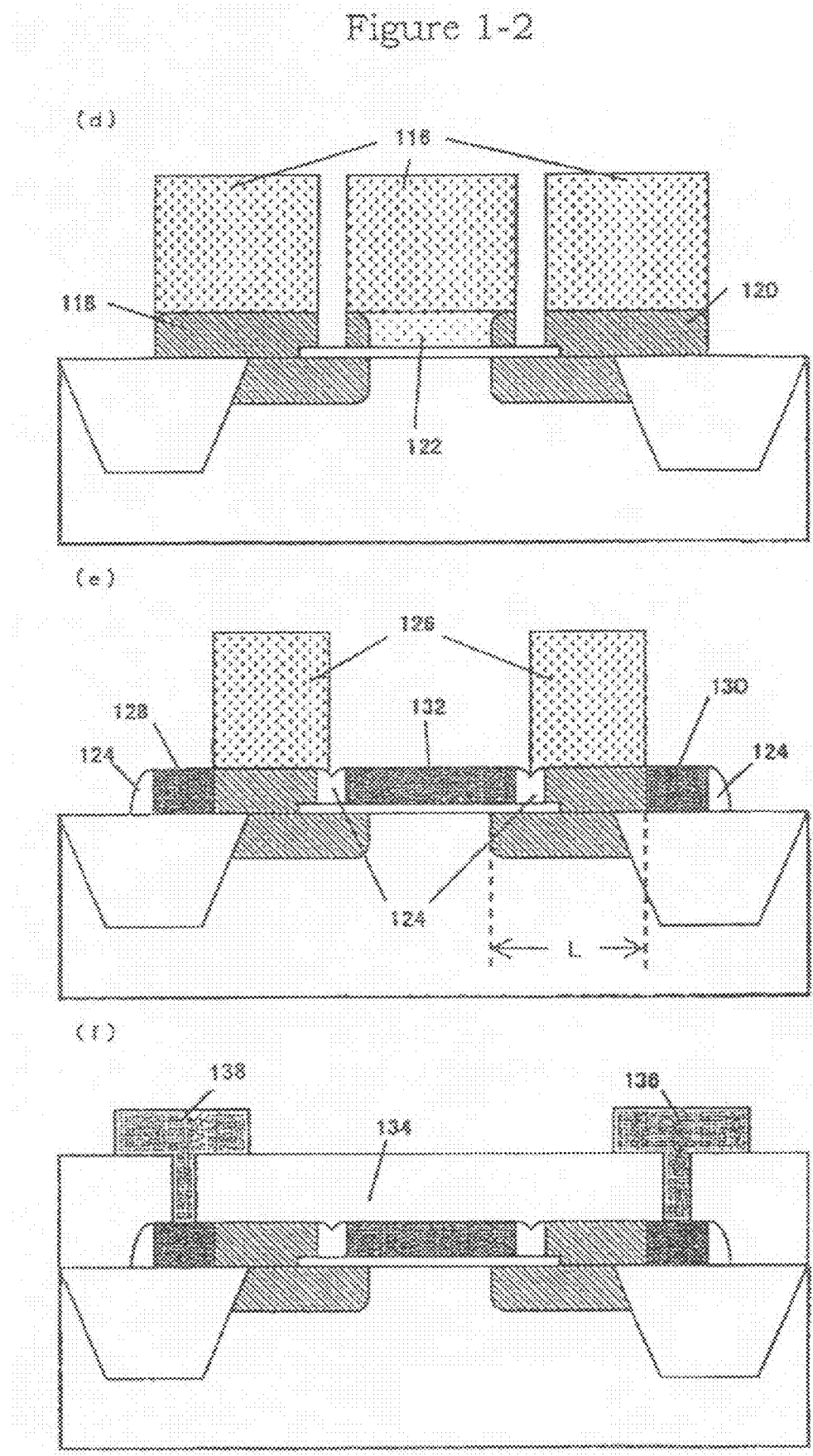
Figure 2:
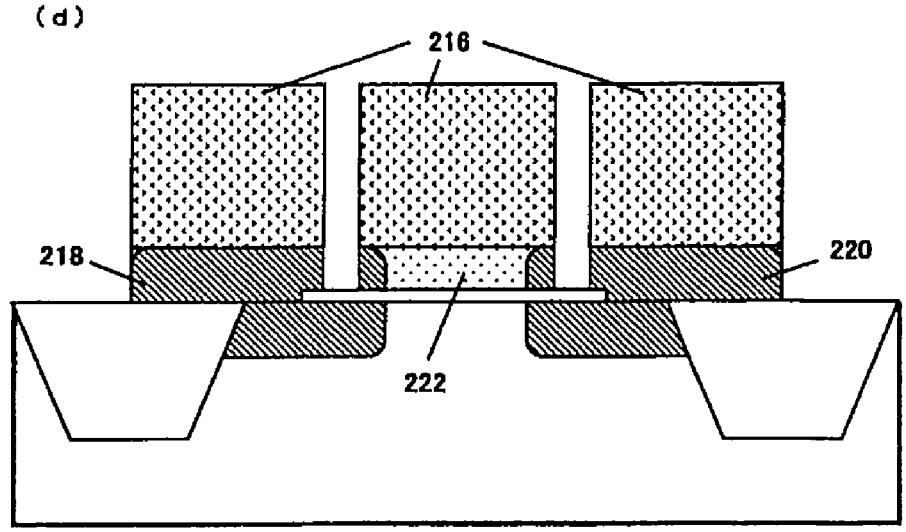
Figure 2:
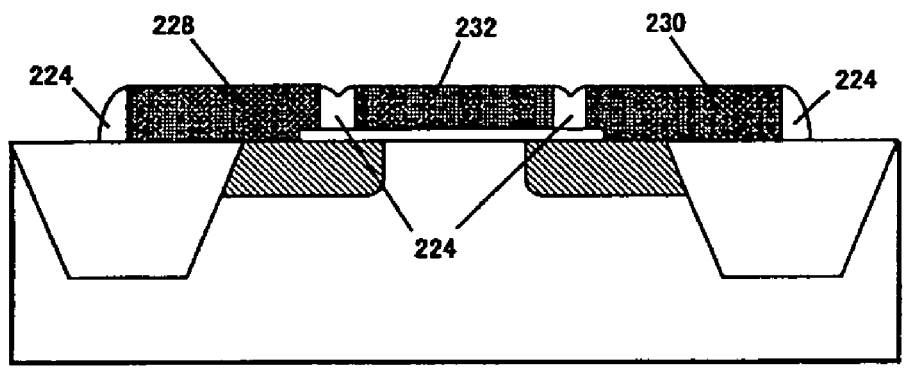
Figure 2:
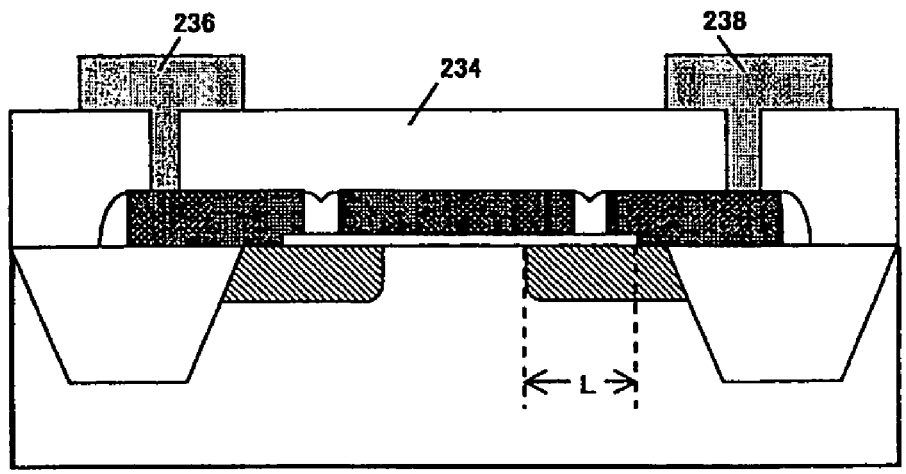

As shown in FIG. 2(a), isolation regions 204, having a depth of 300 to 500 nm, are formed on a P-type semiconductor substrate 202 by known STI techniques.

Next, a gate oxide film 206, having a thickness of 40 nm, is formed by known photolithography techniques with a photoresist 208 in such a manner as to expose surfaces 240 of the P-type semiconductor substrate 202 (FIG. 1(b)) only in the vicinity of the isolation regions 204 (FIG. 2(b)).

Then, after depositing a polysilicon film 210 having a thickness of 250 nm by a CVD method, phosphorous ions are implanted into the polysilicon film 210 and the P-type semiconductor substrate 202 with a portion to be the channel region of the semiconductor substrate masked, under the two conditions such as a dose amount of $8.0\times10^{12}$ ions/cm$^2$ and an energy of 120 KeV, and a dose amount of $5.0\times10^{12}$ ions/cm$^2$ and an energy of 250 KeV, so as to form low concentration N-type diffusion layers 212 and 214 having an impurity concentration of about $5\times10^{17}$ cm$^{-3}$ (FIG. 2(c)).

Next, as shown in FIG. 2(d), the polysilicon film 210 is divided into three parts (a source region-forming part 218, a drain region-forming part 220 and a gate electrode-forming part 222) by known photolithography techniques. Here, the lower surfaces of the lateral source region-forming part 218 and the lateral drain region-forming part 220 each are at least partially in contact with the surface 240 of the semiconductor substrate 202. The middle gate electrode-forming part 222 is located on the gate oxide film 206 in such a manner as to cover at least the channel region in the semiconductor substrate 202, and is not contacted with the surface 240 of the semiconductor substrate.

Side wall spacers 224 of SiO$_2$ film are formed on the both sides of each of the source region-forming part 218, the drain region-forming part 220 and the gate electrode-forming part 222. Subsequently, arsenic ions are implanted into the source region-forming part 218, the drain region-forming part 220 and the gate electrode-forming part 222 at a dose amount of $3.0\times10^{15}$ ions/cm$^2$ and an energy of 40 KeV by known photolithography techniques. And then, the arsenic ions are activated by heat treatment to form high concentration N-type diffusion layers having an impurity concentration of about 0.3 to $1\times10^{23}$ cm$^{-3}$ (FIG. 2(e)). The high concentration N-type diffusion layers 228, 230 and 232 will act as a source region, a drain region, a gate electrode respectively. Since the source and drain regions (228 and 230) are in contact with the low concentration diffusion layers 212 and 214 only at the surfaces 240 in the vicinity of the isolation regions 204, the low concentration diffusion layers 212 and 214 entirely, in a length direction, act as a drift region.

Lastly, as shown in FIG. 2(f), a CVD oxide film 234 is deposited and then contact holes are opened, and wiring metal material is patterned to form electrodes 236 and 238.

In the semiconductor device of the present example, each drift region is composed of the low concentration N-type diffusion layer 212 or 214, which extends from the channel region to the vicinity of the isolation region, in the semiconductor substrate 202. The drift length L is longer in the semiconductor device of the present example than in a similar size semiconductor device wherein the source and drain regions are provided within the active region surface of the semiconductor substrate. In other words, the semiconductor device of Example 2 has the size including isolation regions miniaturized, as compared to a conventional semiconductor device having the same drift length.

In the semiconductor device of the present example, since both of the source and drain regions are provided on the isolation regions, junction capacitances (parasitic capacitances) between the source and drain regions and the silicon substrate are reduced and thus it is possible to operate the semiconductor device faster.

In the case where the contact hole(s) connecting with the source region and/or the drain region is/are formed onto a portion(s) on the isolation region(s) of the source region and/or the drain region, the parasitic capacitance of the source region and/or the drain region is reduced and thus it is possible to operate the semiconductor device much faster.

When the high concentration diffusion layers are provided also in portions, which are located on the low concentration diffusion layers (drift regions) in the semiconductor substrate, of the semiconductor layer formed astride the isolations region and the active region, as described in this example, it is possible to destroy the spontaneous oxide film by high concentration impurity implantation and subsequent heat treatment even if a spontaneous oxide film is once generated at the interface between the high- and low-concentration diffusion layers.

Example 3

In this example, the source and drain regions, and the partial drift regions connected thereto were made from a single polysilicon layer, which is deposited astride the isolation region and the active region and different from a semiconductor film that is processed into the gate electrode (FIG. 3(a) to (f)).

As shown in FIG. 3(a), isolation regions 304, having a depth of 0.3 to 0.5 μm, are formed on a P-type semiconductor substrate 302 by known STI techniques.

Next, as shown in FIG. 3(b), phosphorous ions are implanted into the P-type semiconductor substrate 302 at a dose amount of $3.0\times10^{12}$ ions/cm$^2$ and an energy of 180 KeV, and at a dose amount of $3.0\times10^{12}$ ions/cm$^2$ and an energy of 80 KeV by known photolithography techniques with a photoresist 308 masking the channel region, so as to form low concentration N-type diffusion layers 312 and 314 having an impurity concentration of about $3\times10^{17}$ cm$^{-3}$.

As shown in FIG. 3(c), after forming a gate oxide film 306 having a thickness of 40 nm, a first polysilicon film 309 having a thickness of 250 nm is formed by polysilicon deposition by a CVD method.

Next, side wall spacers 324 of SiO$_2$ film are formed on the both sides of the first polysilicon film 309. An SO$_2$ film 325, having a thickness of 50 nm, is deposited to cover the first polysilicon film 309 and the side wall spacers 324. Then, surfaces 340 of the low concentration N-type diffusion layers 312 and 314 in the P-type semiconductor substrate 302 are exposed by known photolithography techniques with a photoresist 316 (FIG. 3(d)).

Then, as shown in FIG. 3(e), second polysilicon films 310 and 311, having a thickness of 250 nm, are deposited astride the isolation regions 304 and the active region so as to be in contact with the semiconductor substrate surfaces 340. After that, the SO$_2$ film 325 on the first polysilicon film 309 is removed.

Subsequently, as shown in FIG. 3(f), phosphorous ions are implanted at a dose amount of $8.0\times10^{12}$ ions/cm$^2$ and an energy of 120 KeV into the second polysilicon films 310 and 311 and the first polysilicon film 309.

Then, as shown in FIG. 3(g), arsenic ions are implanted at a dose amount of $3.0\times10^{15}$ ions/cm$^2$ and an energy of 40 KeV into portions of the second polysilicon films 310 and 311 (the portions are located on the isolation regions 304), and in the first polysilicon film 309 by known photolithography techniques also using a photoresist 326. After that, the arsenic ions are activated by heat treatment to form high concentration N-type diffusion layers having an impurity concentration of about 0.3 to $1\times10^{21}$ cm$^{-3}$. The high concentration N-type diffusion layers 328 and 330 in the second polysilicon films 310 and 311 will act as a source region and a drain region respectively, and the high concentration N-type diffusion layers 332 in the first polysilicon film will act as a gate electrode.

Lastly, as shown in FIG. 3(h), a CVD oxide film 334 is deposited and then contact holes are opened, and wiring metal material is patterned to form electrodes 336 and 338.

The semiconductor device of Example 3 has the size including isolation regions miniaturized, as compared to a conventional semiconductor device having the same drift length L.

The junction capacitances (parasitic capacitances) between the source and drain regions and the silicon substrate are reduced to a negligible degree and thus it is possible to operate the semiconductor device much faster.

Example 4

In this example, the source and drain regions were made from a polysilicon layer formed on the isolation region and the active region, with the gate electrode covered (FIGS. 4(a) to 4(f)).

As shown in FIG. 4(a), isolation regions 404, having a depth of 0.3 to 0.5 μm, are formed on a P-type semiconductor substrate 402 by known STI techniques.

Next, as shown in FIG. 4(b), phosphorous ions are implanted into the P-type semiconductor substrate 402 at a dose amount of $3.0\times10^{12}$ ions/cm$^2$ and an energy of 180 KeV, and at a dose amount of $3.0\times10^{12}$ ions/cm$^2$ and an energy of 80 KeV by known photolithography techniques with a photoresist 408 masking the channel region, so as to form low concentration N-type diffusion layers 412 and 414 having an impurity concentration of about $3\times10^{17}$ cm$^{-3}$.

As shown in FIG. 4(c), after forming a gate oxide film 406 having a thickness of 40 nm, a first polysilicon film 409 having a thickness of 250 nm is formed by polysilicon deposition by a CVD method.

Next, side wall spacers 424 of SiO$_2$ film are formed on the both sides of the first polysilicon film 409. An SO$_2$ film 425 having a thickness of 50 nm is deposited to cover the first polysilicon film 409 and the side wall spacers 424. Then, surfaces 440 of the low concentration N-type diffusion layers 412 and 414 in the P-type semiconductor substrate 402 are exposed only in the vicinity of the isolation regions 404 by known photolithography techniques with photoresist 416 (FIG. 4(d)).

Then, as shown in FIG. 4(e), a polysilicon film having a thickness of 250 nm is deposited to cover the first polysilicon film 409 on the isolation regions 404 and the active region, and subsequently the first polysilicon film is removed at least the channel region to obtain second polysilicon films 410 and 411.

Then, as shown in FIG. 4(f), phosphorous ions are implanted at a dose amount of $8.0\times10^{12}$ ions/cm$^2$ and an energy of 120 KeV into the second polysilicon films 410 and 411 and a portion of the first polysilicon film 409 (the portion is located over the channel region in the semiconductor substrate 402).

Then, as shown in FIG. 4(g), arsenic ions are implanted at a dose amount of $3.0\times10^{15}$ ions/cm$^2$ and an energy of 40 KeV in the second polysilicon films 410 and 411 and the portion of the first polysilicon film 409, over the channel region. After that, the arsenic ions are activated by heat treatment to form high concentration N-type diffusion layers having an impurity concentration of about 0.3 to $1\times10^{21}$ cm$^{-3}$. Here, it is not necessary to form any photoresist on the second polysilicon films 410 and 411 and the portion of the first polysilicon film 409, since the SiO$_2$ film 425 and the gate oxide film 406 prevent from implanting arsenic ions into the surface layer of the semiconductor substrate. The high concentration N-type diffusion layers 428 and 430 in the second polysilicon films 410 and 411 will act as a source region and a drain region respectively, and the high concentration N-type diffusion layers 432 in the first polysilicon film will act as a gate electrode.

Next, the SiO$_2$ film is removed over the channel region.

Lastly, as shown in FIG. 4(h), a CVD oxide film 434 is deposited and then contact holes are opened, and wiring metal material is patterned to form electrodes 436 and 438.

The semiconductor device of Example 4 has the size including isolation regions miniaturized, as compared to a conventional semiconductor device having the same drift length L.

The junction capacitances (parasitic capacitances) between the source and drain regions and the silicon substrate are reduced with the source and drain regions formed on the isolation regions. In addition, in the case where the contact hole(s) connecting with the source region and/or the drain region is/are formed onto a portion(s) of the source region and/or the drain region, the portion(s) being located on the isolation region(s), the parasitic capacitance of the source region and/or the drain region is further reduced. Therefore, it is possible to operate the semiconductor device faster.

Example 5

In this example, the source and drain regions were made from a polysilicon layer which is deposited on the isolation region and the active region, with the gate electrode covered (FIGS. 5(a) to 5(f)).

As shown in FIG. 5(a), isolation regions 504, having a depth of 0.3 to 0.5 μm, are formed on a P-type semiconductor substrate 502 by known STI techniques.

Next, as shown in FIG. 5(b), phosphorous ions are implanted into the P-type semiconductor substrate 502 at a dose amount of $3.0\times10^{12}$ ions/cm$^2$ and an energy of 180 KeV, and at a dose amount of $3.0\times10^{12}$ ions/cm$^2$ and an energy of 80 KeV by known photolithography techniques with a photoresist 508 masking the channel region, so as to form low concentration N-type diffusion layers 512 and 514 having an impurity concentration of about $3\times10^{17}$ cm$^{-3}$.

Then, as shown in FIG. 5(c), after forming a gate oxide film 506 having a thickness of 40 nm, polysilicon is deposited by a CVD method to form a first polysilicon film 509 having a thickness of 250 nm.

Next, side wall spacers 524 of SiO$_2$ film are formed on the both sides of the first polysilicon film 509. An SO$_2$ film 525 having a thickness of 50 nm is deposited with the first polysilicon film 509 and the side wall spacers 524 covered. Then, surfaces 540 of the low concentration N-type diffusion layers 512 and 514 in the P-type semiconductor substrate 502 are exposed only in the vicinity of the isolation regions 504 by known photolithography techniques with a photoresist 516 (FIG. 5(d)).

Then, as shown in FIG. 5(e), a polysilicon film having a thickness of 250 nm is deposited on the isolation regions 504 and the active region so as to cover the first polysilicon film 509 and to contact with the semiconductor substrate surfaces 540, and subsequently the polysilicon film and the SiO$_2$ film 525 are removed at least over the channel region so as to obtain second polysilicon films 510 and 511.

Then, as shown in FIG. 5(f), phosphorous ions are implanted at a dose amount of $8.0\times10^{12}$ ions/cm$^2$ and an energy of 120 KeV in the second polysilicon films 510 and 511 and a portion of the first polysilicon film 509 (the portion is located over the channel region in the semiconductor substrate 502).

Then, as shown in FIG. 5(g), arsenic ions are implanted at a dose amount of $3.0\times10^{15}$ ions/cm$^2$ and an energy of 40 KeV into portions of the second polysilicon films 510 and 511 (the portions are located on the isolation regions 504) and the portion of the first polysilicon film 509 over the channel region. After that, the arsenic ions are activated by heat treatment so as to form high concentration N-type diffusion layers having an impurity concentration of about 0.3 to $1\times10^{21}$ cm$^{-3}$. During the implantation, since the second polysilicon films 510 and 511 are extended and deposited on the isolation regions, it is not possible to implant the arsenic ions at a high concentration into the semiconductor substrate surface 540, even if the misalignment of the photoresist 526 occurs. The high concentration N-type diffusion layers 528 and 530 in the second polysilicon films 510 and 511 will act as a source region and a drain region respectively, and the high concentration N-type diffusion layer 532 in the first polysilicon film will act as a gate electrode.

Lastly, as shown in FIG. 5(h), a CVD oxide film 534 is deposited and then contact holes are opened, and wiring metal material is patterned to form electrodes 536 and 538.

The semiconductor device of Example 5 also has the size including isolation regions miniaturized, as compared to a conventional semiconductor device having the same drift length L.

In the semiconductor device of the present example, both of the source and drain regions are provided only on the isolation regions, and thus junction capacitances (parasitic capacitances) between the source and drain regions and the silicon substrate are reduced to a negligible degree. Therefore, it is possible to operate the semiconductor device much faster.

Example 6

In this example, the drain region and the partial drift region connected thereto were made from a semiconductor layer, which is deposited on the isolation region and the active region and different from a semiconductor film that is processed into the gate electrode (FIGS. 6(a) to 6(f)).

As shown in FIG. 6(a), isolation regions 604, having a depth of 0.3 to 0.5 μm, are formed on a P-type semiconductor substrate 602 by known STI techniques, and phosphorous ions are implanted into the P-type semiconductor substrate 602 at a dose amount of $3.0\times10^{12}$ ions/cm$^2$ and an energy of 180 KeV, and at a dose amount of $3.0\times10^{12}$ ions/cm$^2$ and an energy of 80 KeV by known photolithography techniques with a photoresist 608 masking the channel region, to form low concentration N-type diffusion layers 612 and 614 having an impurity concentration of about $3\times10^{17}$ cm$^{-3}$.

Next, as shown in FIG. 6(b), phosphorous ions are implanted into the P-type semiconductor substrate 602 at a dose amount of $8.0\times10^{12}$ ions/cm$^2$ and an energy of 120 KeV by known photolithography techniques with a photoresist 616 masking the low concentration N-type diffusion layer 612, so as to form a high concentration N-type diffusion layer 630 having an impurity concentration of about $5 \times 10^{17}$ cm$^{-3}$.

Then, as shown in FIG. 6(c), after forming a gate oxide film 606 having a thickness of 40 nm, polysilicon is deposited by a CVD method to form a first polysilicon film 609 having a thickness of 250 nm.

Next, side wall spacers 624 of SiO$_2$ film are formed on the both sides of the first polysilicon film 609. An SO$_2$ film 625 having a thickness of 50 nm is deposited with the first polysilicon film 609 and the side wall spacers 624 covered. Then, surfaces 640 of the low concentration N-type diffusion layer 612 and the high concentration N-type diffusion layer 630 in the P-type semiconductor substrate 602 are exposed by known photolithography techniques with photoresist 626 (FIG. 6(d)).

Then, as shown in FIG. 6(e), a second polysilicon film 610 having a thickness of 250 nm is deposited astride the isolation regions 604 where the drain region is to be provided and the active region, and subsequently the SO$_2$ film 625 over the first polysilicon film 609 is removed.

Then, as shown in FIG. 6(f), phosphorous ions are implanted at a dose amount of $8.0 \times 10^{12}$ ions/cm$^2$ and an energy of 120 KeV into the second polysilicon film 610 and the first polysilicon film 609 by known photolithography techniques with a photoresist 627a.

Then, as shown in FIG. 6(g), arsenic ions are implanted at a dose amount of $3.0 \times 10^{15}$ ions/cm$^2$ and an energy of 40 KeV into a portion of the second polysilicon film 610 (the portion is located over the isolation region) and the first polysilicon film 609 by known photolithography techniques also using a photoresist 627b. After that, the arsenic ions are activated by heat treatment to form high concentration N-type diffusion layers having an impurity concentration of about 0.3 to $1 \times 10^{21}$ cm$^{-3}$. The high concentration N-type diffusion layer 628 in the second polysilicon film 610 will act as a drain region, the high concentration N-type diffusion layers 632 in the first polysilicon film will act as a gate electrode, and the high concentration N-type diffusion layers 630 in the surface layer of the semiconductor substrate will act as a source region.

Lastly, as shown in FIG. 6(h), a CVD oxide film 634 is deposited and then contact holes are opened, and wiring metal material is patterned to form electrodes 636 and 638.

Example 7

In this example, the drain region was made from a polysilicon layer that had been deposited on the isolation region and the active region, with the gate electrode covered, and the source region was conventionally made in the semiconductor surface (FIG. 7(a) to (f)).

As shown in FIG. 7(a), isolation regions 704 having a depth of 0.3 to 0.5 μm are formed on a P-type semiconductor substrate 702 by known STI techniques.

Next, as shown in FIG. 7(b), phosphorous ions are implanted into the P-type semiconductor substrate 702 at a dose amount of $3.0 \times 10^{12}$ ions/cm$^2$ and an energy of 180 KeV, and at a dose amount of $3.0 \times 10^{12}$ ions/cm$^2$ and an energy of 80 KeV by known photolithography techniques with a photoresist 708 with the channel region masked, so as to form low concentration N-type diffusion layers 712 and 714 having an impurity concentration of about $3 \times 10^{17}$ cm$^{-3}$.

Then, as shown in FIG. 7(c), after forming a gate oxide film 706 having a thickness of 40 nm, polysilicon is deposited by a CVD method to form a first polysilicon film 709 having a thickness of 250 nm.

Next, side wall spacers 724 of SiO$_2$ film are formed on the both sides of the first polysilicon film 709, and an SO$_2$ film 725 with a thickness of 50 nm is deposited covering the first polysilicon film 709 and the side wall spacers 724. Then, surfaces 740 of the low concentration N-type diffusion layers 712 and 714 in the P-type semiconductor substrate 702 are exposed by known photolithography techniques with a photoresist 716. The surface of the low concentration N-type diffusion layer 712 in vicinity of the isolation region 704 is exposed (FIG. 7(d)).

Then, as shown in FIG. 7(e), a second polysilicon film 710 having a thickness of 250 nm is deposited astride the isolation regions 704 located on the drain side and the active region so as to cover the first polysilicon film 709 and to contact with the semiconductor substrate surfaces 740 on the drain side, and subsequently the SiO$_2$ film 725 (and, if present, the second polysilicon film 710) is removed at least over the channel region.

After that, as shown in FIG. 7(f), phosphorous ions are implanted at a dose amount of $8.0 \times 10^{12}$ ions/cm$^2$ and an energy of 120 KeV into the second polysilicon film 710 and a portion of the first polysilicon film 709 (the portion is located over the channel region in the semiconductor substrate 702).

Then, as shown in FIG. 7(g), arsenic ions are implanted at a dose amount of $3.0 \times 10^{15}$ ions/cm$^2$ and an energy of 40 KeV into a portion of the second polysilicon film 710 (the portion is located on the isolation region 704), the portion of the first polysilicon film 709 over the channel region, and a portion of the N-type low concentration diffusion layer in the semiconductor substrate, whose surface 740 of the portion is exposed, by known photolithography techniques with a photoresist 726. After that, the arsenic ions are activated by heat treatment so as to form high concentration N-type diffusion layers having an impurity concentration of about 0.3 to $1 \times 10^{21}$ cm$^{-3}$. The high concentration N-type diffusion layer 728 in the second polysilicon film 710 will act as a drain region, the high concentration N-type diffusion layer 732 in the first polysilicon film will act as a gate electrode, and the high concentration N-type diffusion layer 730 in the semiconductor substrate will act as a source region.

Lastly, as shown in FIG. 7(h), a CVD oxide film 734 is deposited and then contact holes are opened, and wiring metal material is patterned to form electrodes 736 and 738.

The semiconductor devices of Examples 6 and 7, wherein only the drain region is located on the isolation region, can provide the same effects as in the other devices described above.

Although Examples 6 and 7 show semiconductor devices of the invention wherein only the drain region is located on the isolation region, it is appreciated by a person of ordinary skill in the art that it is also possible to manufacture a semiconductor device wherein only the source region is located on the isolation region in a similar manner, and such a semiconductor device can also provide the effects of the present invention.

Example 8

In the semiconductor device (of Example 1) wherein the source and drain regions, the partial drift regions connected thereto and the gate electrode were made from a single polysilicon layer formed astride the isolation region and the active region, low resistance regions were further provided which were each in contact with the respective drift regions in the polysilicon layer and the respective drift regions in the active region surface of the semiconductor substrate and which were composed of a layer of metal or metal compound (FIGS. 8(*a*) to 8(*g*)).

In a similar manner to Example 1, isolation regions 804, an active region and a gate oxide film 806 are formed on a P-type semiconductor substrate 802 (FIGS. 8(*a*) to 8(*b*)).

After removing the photoresist 808, titanium is deposited all over the silicon semiconductor substrate surface by sputtering so that 100 nm in thickness of the titanium is formed. Subsequently, the substrate is subjected to a heat treatment (at 950° C., for 30 seconds) by the RTA method so that the titanium reacts with the silicon of the semiconductor substrate to form a silicide. Unreacted part of the Ti film is removed with use of an acid. Additional heat treatment (at 900° C., for 30 seconds) is conducted. The titanium silicide films are patterned by photolithography techniques to form low resistance titanium silicide layers 813 on the surface 840 of the semiconductor substrate 802 between the isolation region 804 and the gate oxide film 806 (FIG. 8(*c*)).

Then, in a similar manner to Example 1, after depositing a polysilicon film 810, low concentration N-type diffusion layers 812 and 814 are formed (FIG. 8(*d*)), and then the polysilicon film 810 is divided into three parts (a source region-forming part 818, a drain region-forming part 820 and a gate electrode-forming part 822) (FIG. 8(*e*)). Also, in a similar manner to Example 1, after providing side wall spacers 824 of $SiO_2$ film on the respective parts, high concentration N-type diffusion layers 828, 830 and 832 (which will act as a source region, a drain region and a gate electrode, respectively) are formed (FIG. 8(*f*)). Lastly, a CVD oxide film 834 is deposited and then contact holes are opened, and wiring metal material is patterned to form electrodes 836 and 838 (FIG. 8(*g*)).

In the semiconductor device of Example 8, even if a spontaneous oxide film is generated on the active region surface 840 of the semiconductor substrate before forming the polysilicon film 810, it is possible to ensure that low resistant electrical connection is established between the drift region in the semiconductor substrate and the drift region in the polysilicon film 810, through the titanium silicide 813.

Although Example 8 shows an embodiment in which the low resistance regions are each a layer of titanium silicide, it is possible to manufacture a semiconductor device of the invention wherein the low resistance region is a layer of other silicide in a similar manner, and such a semiconductor device can also provide the effects of the present invention.

It is also possible to manufacture a semiconductor device of the invention wherein a layer of metal or metal nitride is provided as a resistance region, in the method as described above but modified appropriately, and such a semiconductor device can also provide the effects of the present invention.

Example 9

Figures 1, 9:
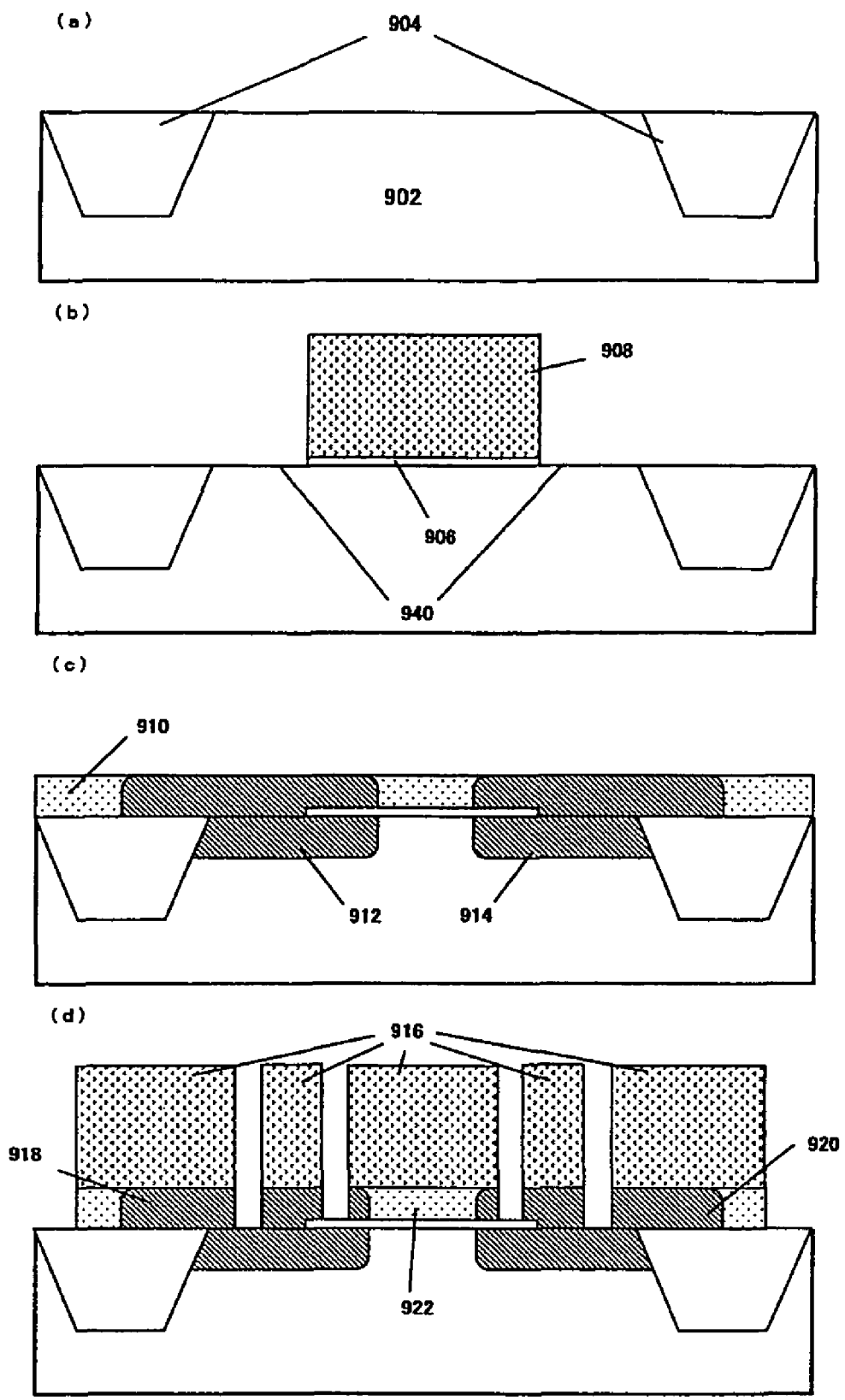
Figures 2, 9:
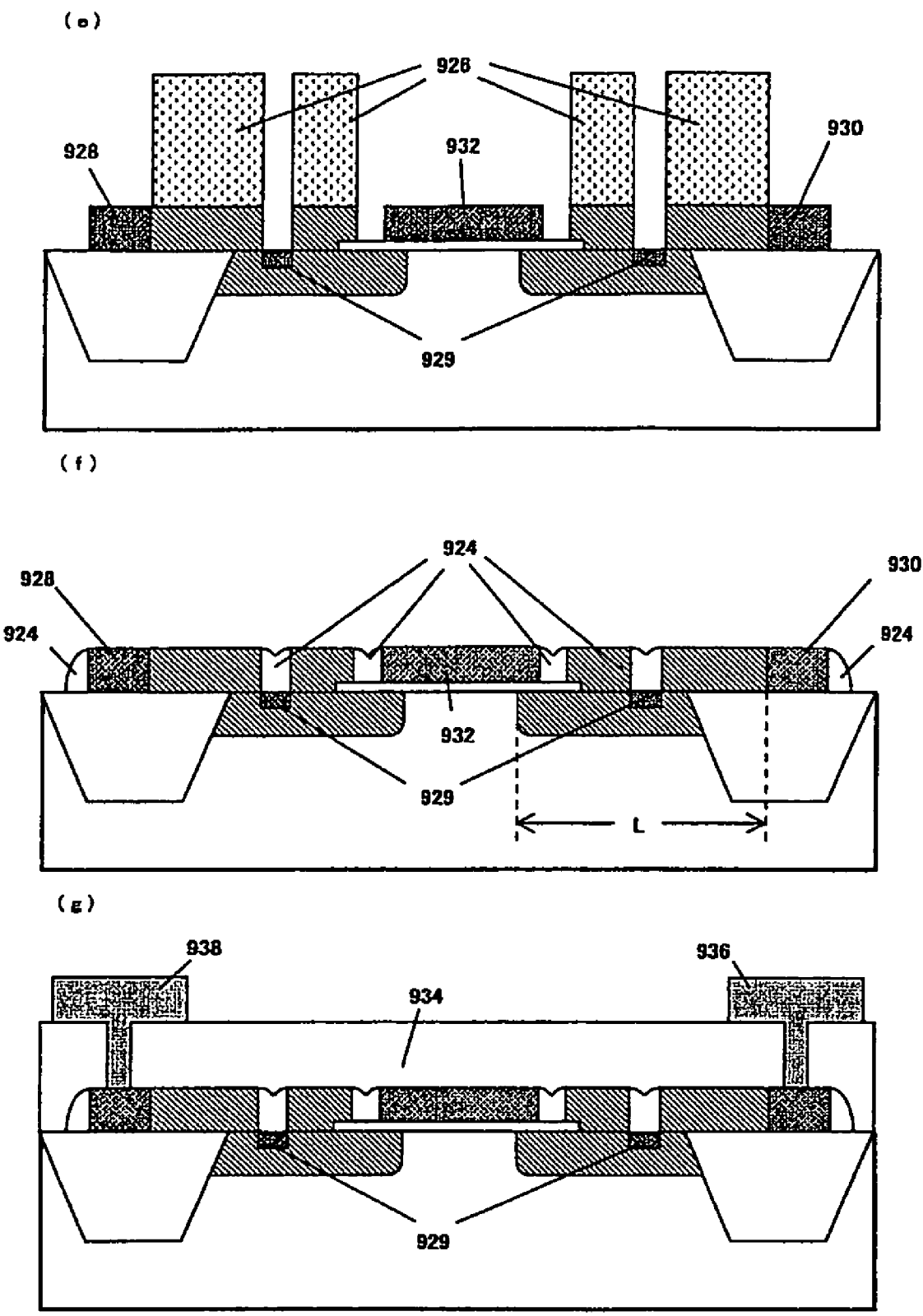

In the semiconductor device (of Example 1) wherein the source and drain regions, the partial drift regions connected thereto and the gate electrode were made from a single polysilicon layer formed astride the isolation region and the active region, low resistance regions were further provided which were each in contact with the respective drift regions in the polysilicon layer and the respective drift regions within the active region surface of the semiconductor substrate and were each formed of high concentration diffusion layer (FIGS. 9(*a*) to 9(*g*)).

In a similar manner to Example 1, on a P-type semiconductor substrate 902, isolation regions 904, active region and gate oxide film 906 are formed, and after forming low concentration N-type diffusion layers 912 and 914, a polysilicon film 910 is deposited (FIGS. 9(*a*) to 9(*c*)).

Next, as shown in FIG. 9(*d*), the polysilicon film 910 is divided into three parts (a source region-forming part 918, a drain region-forming part 920 and a gate electrode-forming part 922) by known photolithography techniques using a photoresist 916 basically in a similar manner to Example 1, but simultaneously a predetermined pattern of openings is formed in portions of the source region-forming part 918 and the drain region-forming part 920 which are in contact with the low concentration N-type diffusion layers 912 and 914 in the semiconductor substrate surface, so as to expose the low concentration N-type diffusion layers 912 and 914.

Subsequently, arsenic ions are implanted into portions of the source region-forming part 918 and the drain region-forming part 920 (the portions are located on the isolation regions 904), the gate electrode-forming part 922, and the exposed surface layer of the semiconductor substrate, at a dose amount of $3.0 \times 10^{15}$ ions/cm$^2$ and an energy of 40 KeV with a photoresist 926. And then, the arsenic ions are activated by heat treatment so as to form high concentration N-type diffusion layers having an impurity concentration of about $1 \times 10^{21}$ cm$^{-3}$ (FIG. 9(*e*)). The high concentration N-type diffusion layers 929 will act as low resistance regions. The high concentration N-type diffusion layers 928 and 930 will act as a source region and a drain region, and the high concentration N-type diffusion layer 932 will act as a gate electrode.

Then, an $SiO_2$ film having a thickness of 250 to 350 nm is formed by a CVD method, and etched back to form side wall spacers 924 on the side walls of the source region-forming part 918, the drain region-forming part 920 and the gate electrode-forming part 922 (including the side walls of the openings) (FIG. 9(*f*)).

Lastly, a CVD oxide film 934 is deposited and then contact holes are opened, and wiring metal material is patterned to form electrodes 936 and 938 (FIG. 9(*g*)).

In the semiconductor device of Example 9, even if a spontaneous oxide film is generated on the active region surface 940 of the semiconductor substrate before forming the polysilicon film 910, it is possible to ensure that low resistant electrical connection is established between the drift region in the semiconductor substrate and the drift region in the polysilicon film 910, through the high concentration impurity diffusion layer 929.

Example 10

Figures 1, 10:
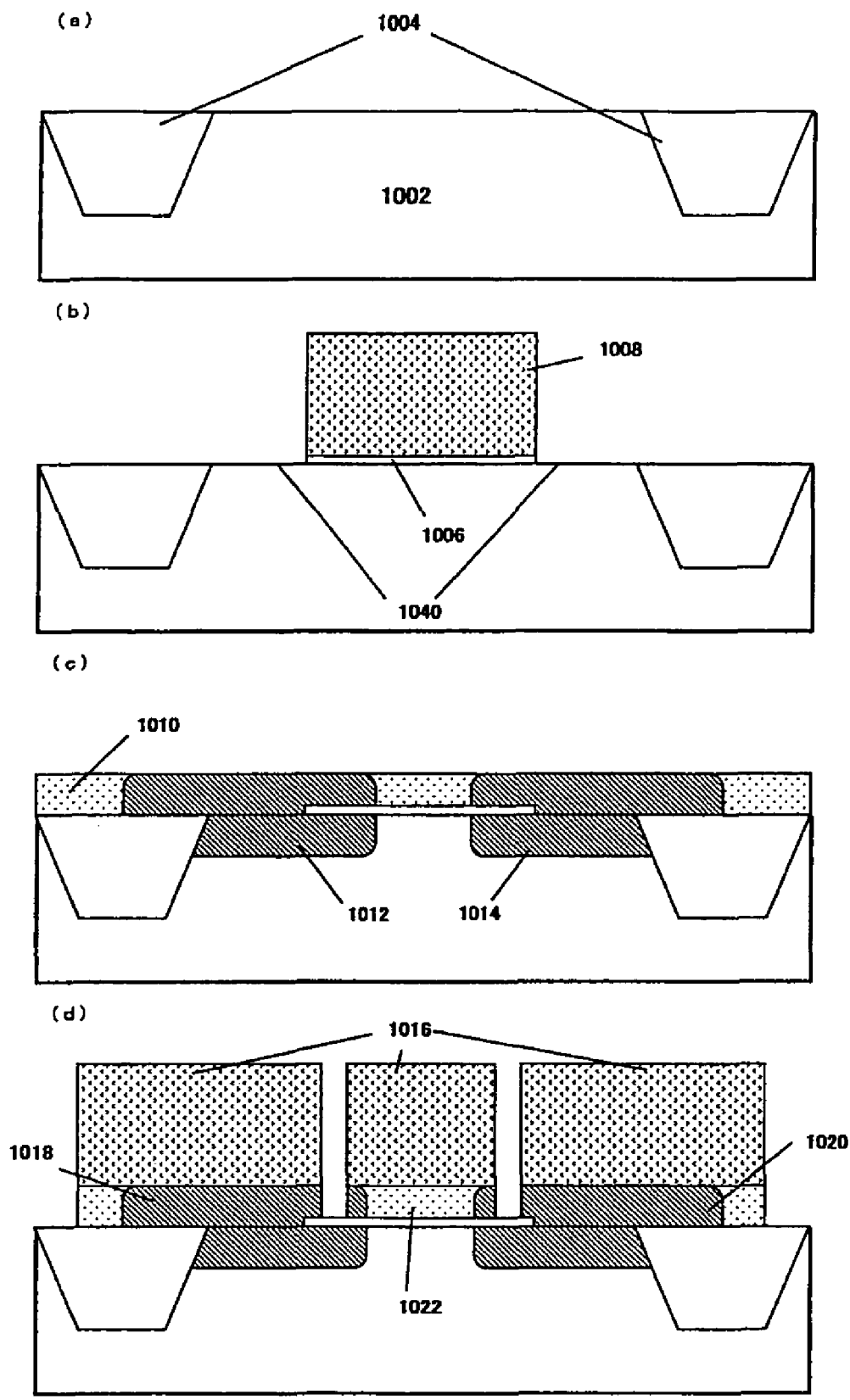
Figures 2, 10:
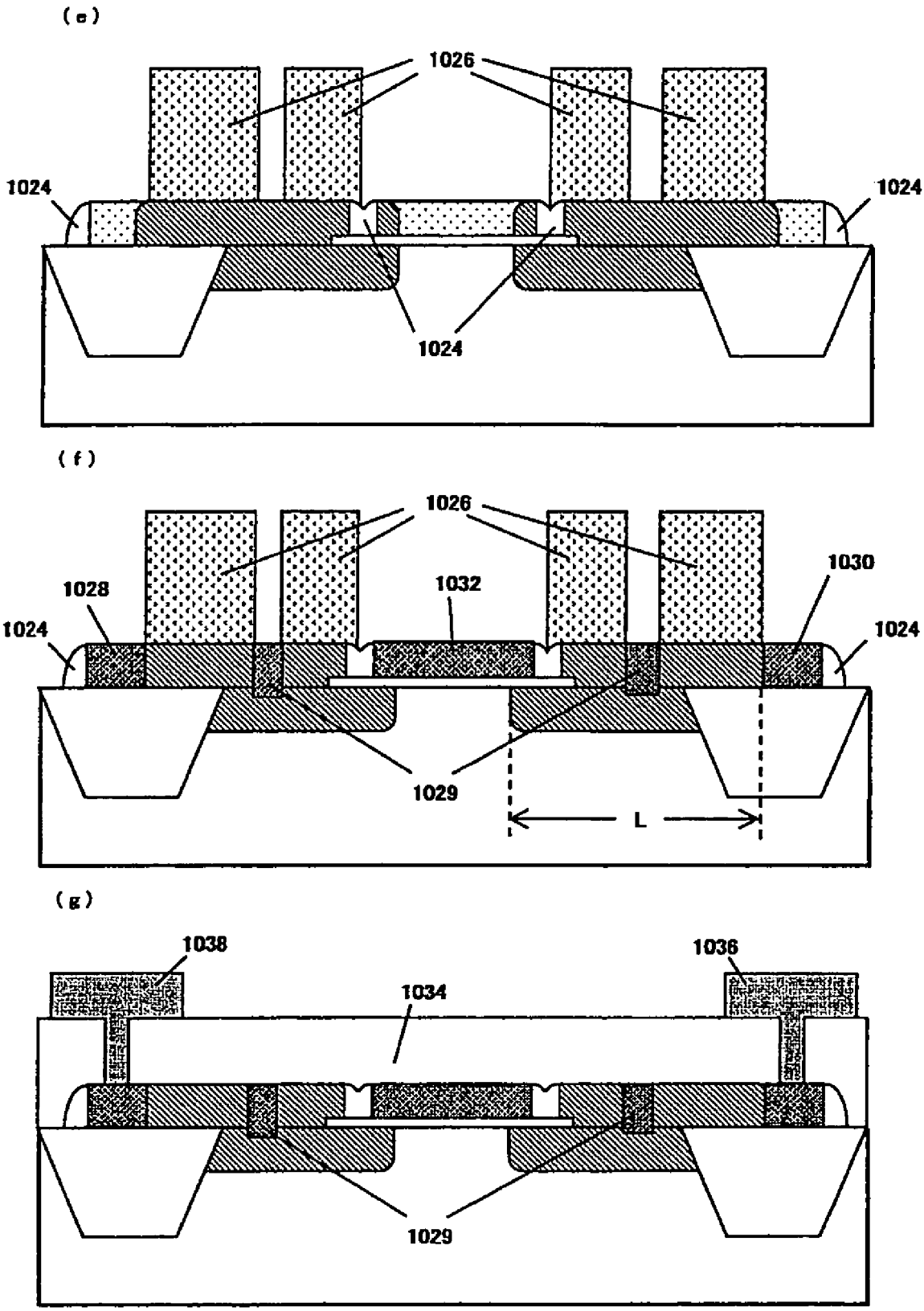

In the semiconductor device (of Example 1) wherein the source and drain regions, the partial drift regions connected thereto and the gate electrode were made from a single polysilicon layer formed astride the isolation region and the active region, low resistance regions were further provided which were each in contact with the drift region in the formed polysilicon layer and the respective drift regions in the active region surface of the semiconductor substrate and were each formed of impurity diffusion layer (FIGS. 10(*a*) to 10(*g*)).

In a similar manner to Example 1, isolation regions 1004, active region and gate oxide film 1006 are formed on a P-type semiconductor substrate 1002. After depositing a polysilicon film 1010 and then forming low concentration N-type diffusion layers 1012 and 1014, the polysilicon film 1010 is divided into three parts (a source region-forming part 1018, a drain region-forming part 1020 and a gate electrode-forming part 1022 (FIGS. 10(*a*) to 10(*d*)).

Next, an $SiO_2$ film having a thickness of 250 to 350 nm is formed by a CVD method, and etched back to form side wall spacers 1024 on the side walls of each of the source region-forming part 1018, the drain region-forming part 1020 and the gate electrode-forming part 1022. A photoresist 1026 of a predetermined pattern is formed on the portions of the source region-forming part 1018 and the drain region-forming part 1020, the portions being located on the isolation regions, and on portions, in contact with the low concentration N-type diffusion layers 1012 and 1014, in the semiconductor substrate surface, and on the gate electrode-forming part 1022, by known photolithography techniques (FIG. 10(*e*)).

Arsenic ions are implanted at a dose amount of $3.0 \times 10^{15}$ ions/cm$^2$ and an energy of 40 KeV with a photoresist 1026. And then, the arsenic ions are activated by heat treatment so as to form high concentration N-type diffusion layers having an impurity concentration of about $1 \times 10^{21}$ cm$^{-3}$ (FIG. 10(*e*)). The high concentration N-type diffusion layers 1029 in the source region-forming part 1018 and the drain region-forming part 1020, which are in contact with the low concentration N-type diffusion layers 1012 and 1014 in the semiconductor substrate surface, will act as low resistance regions. The high concentration N-type diffusion layers 1028 and 1030 of the source region-forming part 1018 and the drain region-forming part 1020, which are located on the isolation regions, will act as a source region and a drain region respectively, and the high concentration N-type diffusion layer 1032 of the gate electrode-forming part will act as gate electrode (FIG. 10(*f*)).

Lastly, a CVD oxide film 1034 is deposited and then contact holes are opened, and wiring metal material is patterned to form electrodes 1036 and 1038 (FIG. 10(*g*)).

In the semiconductor device of the present example, even if a spontaneous oxide film is generated on the active region surface 1040 of the semiconductor substrate before forming the polysilicon film 1010, it is possible to ensure that low resistant electrical connection is established between the drift region in the semiconductor substrate and the drift region in the polysilicon film 1010, through the high concentration impurity diffusion layer 1029.

Although Examples 8 to 10 describe the modifications of Example 1, similar modifications can be made to other examples. A person of ordinary skill in the art can understand and produce a variety of other modifications by reference to the description herein and the attached drawings, as well as the conventional techniques known in the art.

Example 11

Figures 3, 11:
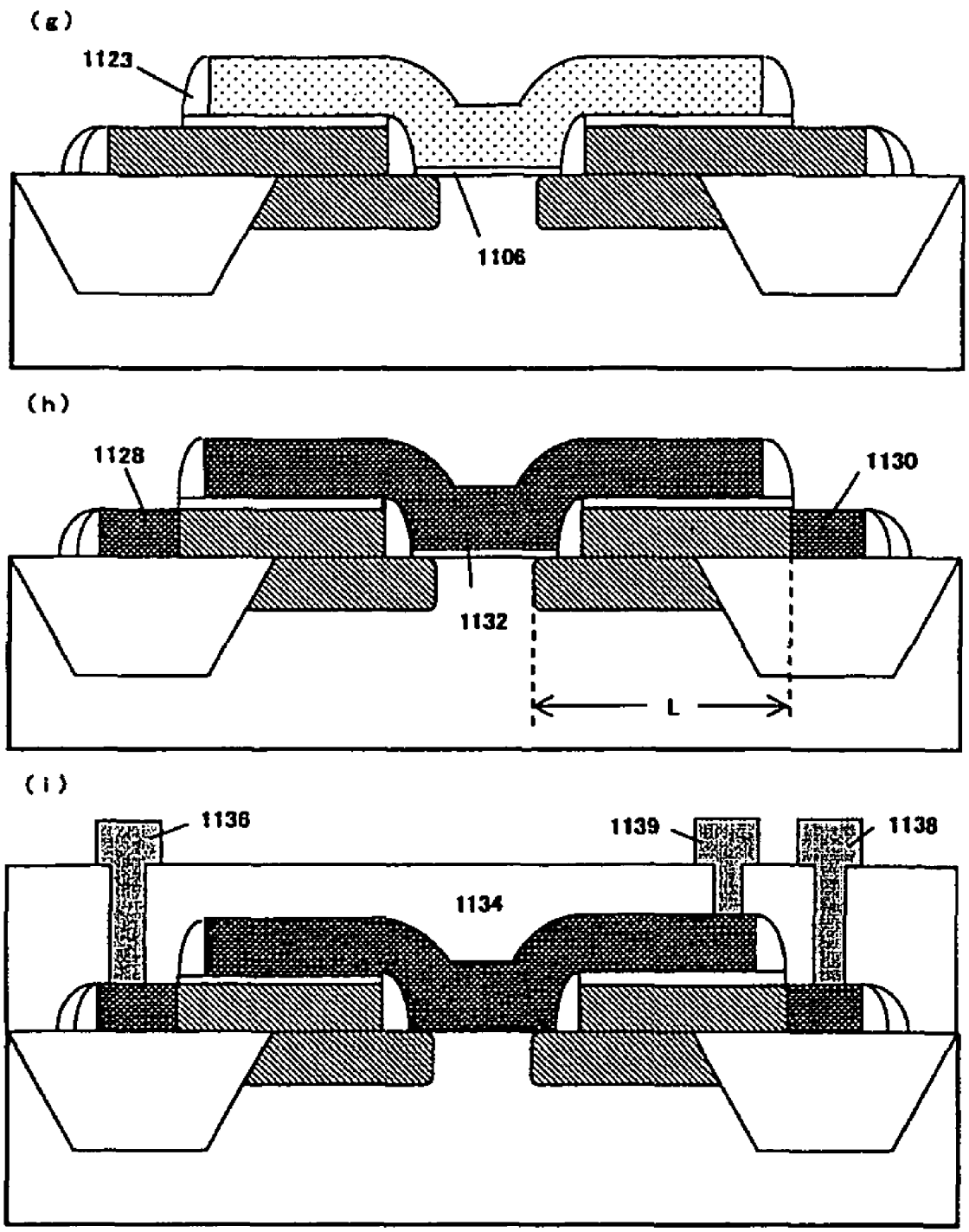

In this example, the source and drain regions and the partial drift regions connected thereto were made from a polysilicon film formed astride the isolation region and the active region, and the gate electrode was formed so that the gate length is determined in a self alignment manner (FIGS. 11(*a*) to 11(*g*)).

As shown in FIG. 11(*a*), isolation regions 1104 are formed on a P-type semiconductor substrate 1102 by known STI techniques. The active region is defined as being between the two isolation regions 1104.

Next, a polysilicon film 1110 with a thickness of 150 nm and a silicon oxide film 1125 with a thickness of 100 nm are formed deposited by a CVD method (FIG. 11(*b*)).

Then, as shown in FIG. 11(*c*), phosphorous ions are implanted into the polysilicon film 1110 and the semiconductor substrate 1102 at a dose amount of $1.0 \times 10^{13}$ ions/cm$^2$ and an energy of 50 KeV by known photolithography techniques with the channel region masked with a photoresist 1108, so as to form low concentration N-type diffusion layers 1112 and 1114 having an impurity concentration of about $3 \times 10^{17}$ cm$^{-3}$. The phosphorous ions may be implanted also in the polysilicon film 1110 under the photoresist 1108 if they do not reach the semiconductor substrate 1102.

Next, as shown in FIG. 11(*d*), portions of the polysilicon film 1110 and the silicon oxide film 1125 are removed on or over the channel region in the semiconductor substrate 1102 and on or over the isolation regions by known photolithography techniques, so as to divide the polysilicon film 1110 and the silicon oxide film 1125 into two parts (a source region-forming part 1118 and a drain region-forming part 1120). Here, over the channel region in the semiconductor substrate 1102, the polysilicon film 1110 and the silicon oxide film 1125 are removed in such a manner as to expose the channel region and parts of the two low concentration N-type diffusion layers 1112 and 1114 (their side portions toward the channel region). The two parts 1118 and 1120 are subsequently processed into the source region and the partial drift region connected thereto, and the drain region and the partial drift region connected thereto, respectively.

Next, as shown in FIG. 11(*e*), side wall spacers 1124 of SiO$_2$ film are formed on the both sides of each of the source region-forming part 1118 and the drain region-forming part 1120 by a CVD method and an etch back process.

A gate oxide film 1106 having a thickness of 40 nm is formed on the semiconductor substrate surface between the side wall spacers 1124 of the source region-forming part 1118 and the drain region-forming part 1120 by heat oxidation. A polysilicon film 1109 is deposited on the gate oxide film 1106, the side wall spacers 1124 continuing thereto and the silicon oxide film 1125. After that, the polysilicon film 1109 is removed over end portions of the source region-forming part 1118 and the drain region-forming part 1120, the end portions being located over the isolation regions, by known photolithography techniques (FIG. 11(*f*)). The end portions are subsequently processed into the source region and the drain region.

Next, side wall spacers 1123 are formed on both sides of the polysilicon film 1109. Simultaneously or subsequently, the silicon oxide film 1125 on the end portions of the source region-forming part 1118 and the drain region-forming part 1120 is removed, the source region-forming part and the drain region-forming part not being covered with the polysilicon film 1109 (FIG. 11(*g*)).

Next, arsenic ions are implanted into the polysilicon film 1109 and the end portions of the source region-forming part 1118 and the drain region-forming part 1120, which are uncovered with the polysilicon film 1109 at a dose amount of $3.0 \times 10^{15}$ ions/cm$^2$ and an energy of 40 KeV by known photolithography techniques. And then, the arsenic ions are activated by heat treatment so as to form high concentration N-type diffusion layers having an impurity concentration of about 0.3 to $1 \times 10^{21}$ cm$^{-3}$ (FIG. 11(*h*)). The high concentration N-type diffusion layers 1132, 1128 and 1130 will act as a gate electrode, a source region and a drain region respectively.

Lastly, a CVD oxide film 1134 is deposited and then contact holes are opened, and wiring metal material is patterned to form a source electrode 1036, a drain electrode 1038 and a gate electrode 1139 (FIG. 10(*g*)). The contact hole connecting with the gate electrode is formed onto a portion of the high concentration N-type diffusion layer 1132 functioning as a gate electrode, the portion being located on the isolation region.

According to Example 11, it is possible that the gate length is determined between the source region-forming part 1118 and the drain region-forming part 1120 in a self-aligning manner, and thus the alignment accuracy among the gate length and the source and drain regions improves. It is also possible to further downsize the chip size, since the gate electrode is integrally and extended over the isolation region in every transistor, and thus an additional step is not required for drawing a lead from the gate electrode on to the isolation region.

Example 12

This example describes a modification of Example 11.

Figure 12:
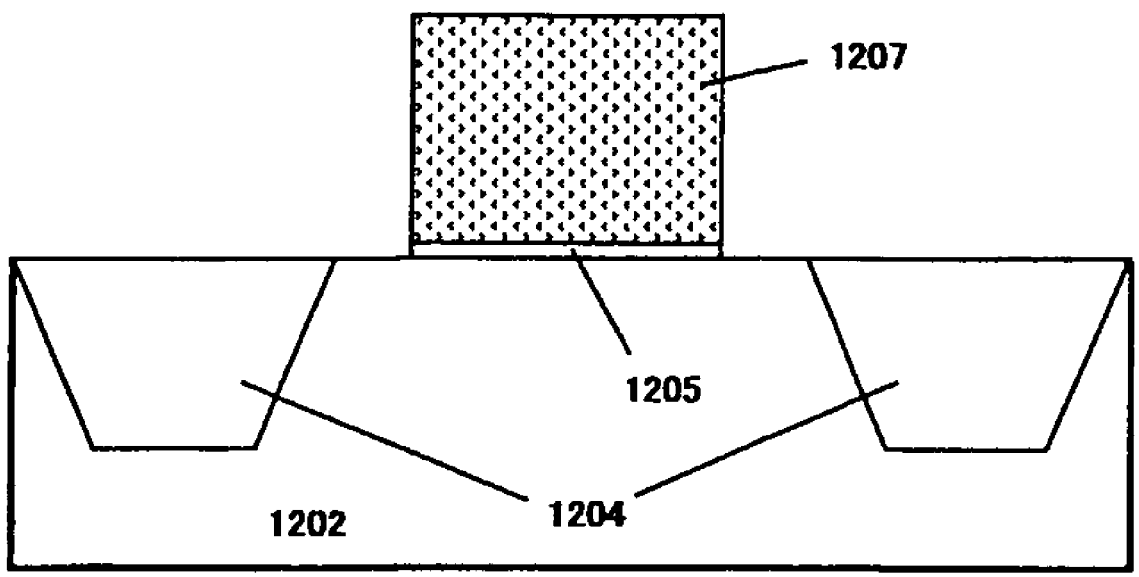
FIG. 12 is a set of cross-sectional views (a) and (b) at different process steps, which illustrate another embodiment (Example 12) of a semiconductor device and the manufacturing methods according to the present invention.
Figure 12:
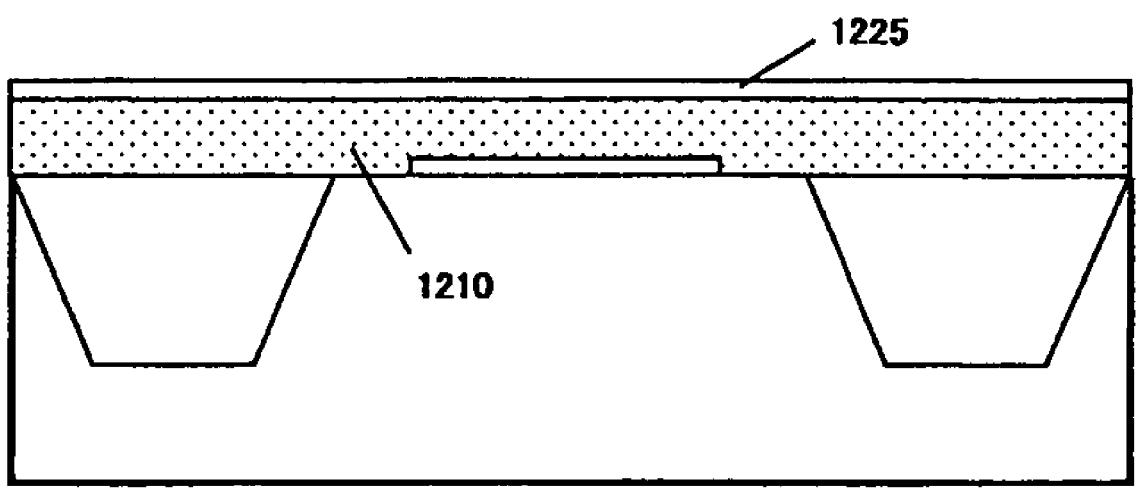

As shown in FIG. 12(a), a silicon oxide film 1205 is formed by known photolithography techniques using a photoresist 1207 on a P-type semiconductor substrate 1202 on which isolation regions 1204 have been formed by known STI techniques. The silicon oxide film 1205 is formed in such a manner that it covers at least the surface of the portion to be the channel region of the semiconductor substrate, and the semiconductor substrate surface is exposed in the vicinity of the isolation regions 1204.

Subsequently, a polysilicon film 1210 with a thickness of 150 nm and a silicon oxide film 1225 with a thickness of 100 nm are formed and deposited by a CVD method (FIG. 12(b)).

The subsequent steps are similar to those of Example 11 (cf. FIGS. 11(c) to 11(i)). The silicon oxide film 1205 can be removed after the polysilicon film 1210 and the silicon oxide film 1225 are divided into two parts (a source region-forming part and a drain region-forming part).

Example 12 can provide the same advantages described as for Example 11. In addition, according to Example 12, it is possible to avoid or reduce damage to the surface layer of the semiconductor substrate in dividing the polysilicon film 1210 and the silicon oxide film 1225.

Example 13

In this example, the source and drain regions and the partial drift regions connected thereto were formed, in a layered structure, in a semiconductor layer formed astride the isolation region and the active region (FIGS. 13(a) to 13(j)).

Figure 13:
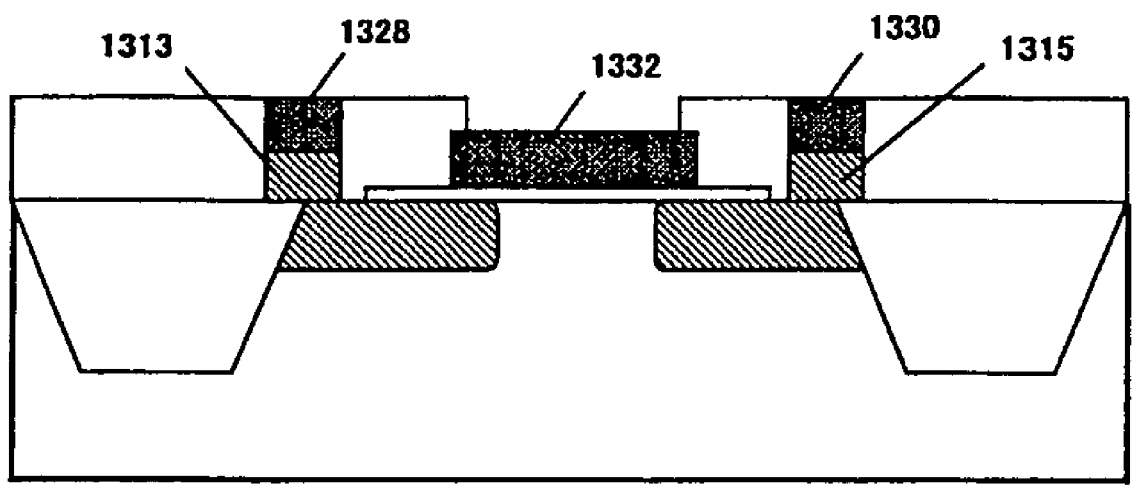
Figure 3:
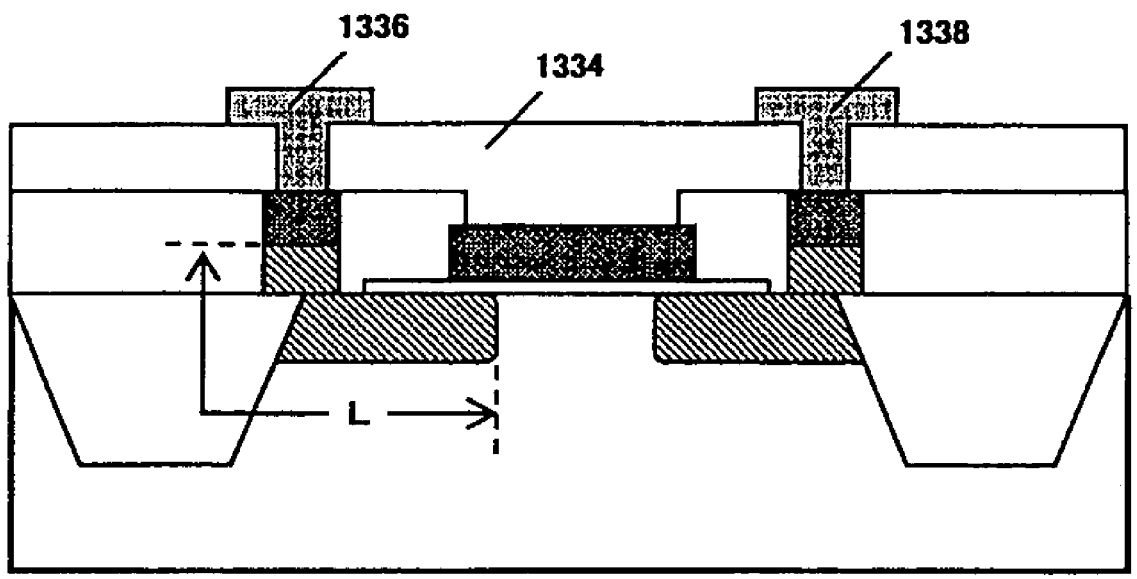

As shown in FIG. 13(a), isolation regions 1304 having a depth of 0.3 to 0.5 μm are formed on a P-type semiconductor substrate 1302 by known STI techniques.

Next, as shown in FIG. 13(b), phosphorous ions are implanted into P-type semiconductor substrate 1302 at a dose amount of $3.0 \times 10^{12}$ ions/cm² and an energy of 180 KeV, and at a dose amount of $3.0 \times 10^{12}$ ions/cm² and an energy of 80 KeV by known photolithography techniques with the channel region masked with a photoresist 1308, so as to form low concentration N-type diffusion layers 1312 and 1314 (drift regions in the semiconductor substrate) having an impurity concentration of about $3 \times 10^{17}$ cm⁻³.

Then, as shown in FIG. 13(c), after forming a gate oxide film 1306 having a thickness of 40 nm, polysilicon is deposited thereon by a CVD method so as to form a first polysilicon film 1309 having a thickness of 250 nm.

As shown in FIG. 13(d), a CVD oxide film 1333 as an insulating film having a thickness of 600 to 2000 nm is deposited over the semiconductor substrate.

Then, as shown in FIG. 13(e), the insulating film 1333 is etched by known photolithography techniques, so as to form openings 1342 and 1343 in such a manner as to expose the surface 1340 and the isolation regions 1304.

Then, as shown in FIG. 13(f), a second polysilicon film 1310 is deposited by a CVD method in such a manner as to fill the openings 1342 and 1343 with polysilicon.

Then, as shown in FIG. 13(g), planarization is conducted by a CMP method using the CVD oxide film 1333 as a stopper, and subsequently phosphorous ions are implanted at a dose amount of $8.0 \times 10^{12}$ ions/cm² and an energy of 120 KeV into the buried polysilicon film so as to form low concentration N-type diffusion layers 1313 and 1315.

Then, as shown in FIG. 13(h), the CVD oxide film 1333 is etched to expose the first polysilicon film by known photolithography techniques, so as to form an opening 1344 onto the first polysilicon film.

Next, as shown in FIG. 13(i), arsenic ions are implanted at a dose amount of $3.0 \times 10^{15}$ ions/cm² and an energy of 40 KeV, and then are activated by heat treatment so as to form high concentration N-type diffusion layers having an impurity concentration of about $1 \times 10^{21}$ cm⁻³ in the upper portions of the buried polysilicon film and also in the first polysilicon film. The high concentration N-type diffusion layers 1328 and 1330 in the buried polysilicon film will act as source region and drain region, the high concentration N-type diffusion layer 1332 in the first polysilicon film will act as gate electrode. The remaining low concentration N-type diffusion layers 1313 and 1315 in the buried polysilicon film will each act as a partial drift region.

Lastly, as shown in FIG. 13(j), a CVD oxide film 1334 is deposited and then contact holes are opened, and wiring metal material is patterned so as to form electrodes 1336 and 1338.

In the semiconductor device of Example 13, the source and drain regions and the (partial) drift regions are layered in the semiconductor layer so that the size including isolation regions is further miniaturized.

Also, it is possible to obtain the desired electrical properties (especially, voltage resistance) by setting the thickness of the buried semiconductor film appropriately.

Figure 15:
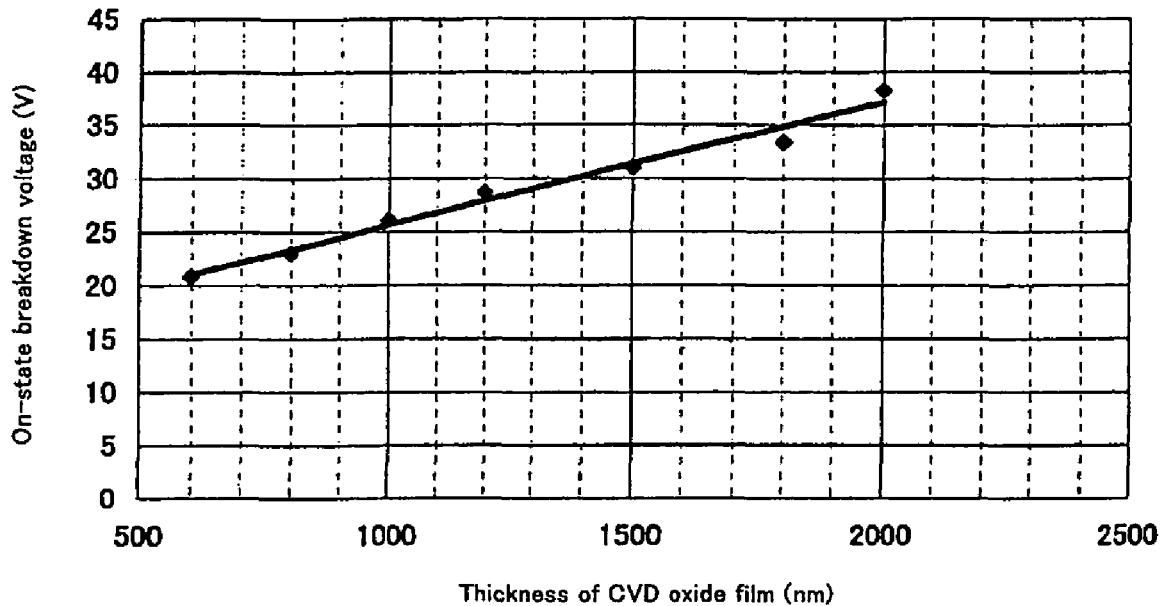
FIG. 15 shows (a) the relationship between the thickness of the CVD oxide film and the on-state breakdown voltage in one embodiment (Example 13) of the semiconductor devices according to the present invention, and (b) the relationship between the increment of the on-state breakdown voltage and the thickness of the CVD oxide film in a conventional device.
Figure 15:
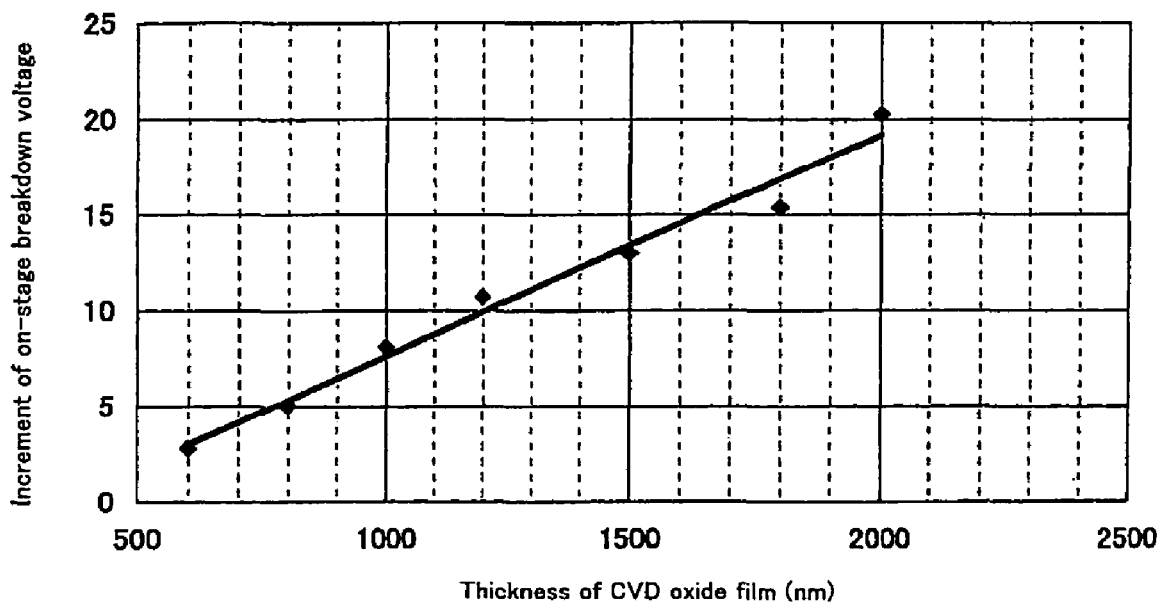

FIG. 15(a) shows the relationship between the thickness of the CVD oxide film (i.e., the thickness of the buried semiconductor film) and the on-state breakdown voltage of a transistor in the semiconductor device of Example 13. There is a tendency of the on-state breakdown voltage to increase the thickness of the CVD oxide film in the range of 600 to 2000 nm, when the semiconductor film having a contact diameter of 0.22 μm is buried.

FIG. 15(b) shows the increment of the on-state breakdown voltage over a conventional transistor having the same (horizontal) size. The on-state breakdown voltage of the conventional transistor is 18 V while that of the transistor of Example 13 having the same size (the CVD oxide film thickness: 2000 nm) is 38 V, and therefore an increment is 20 V.

In the conventional transistor, it is necessary that the transistor cell size is 8.6×50 μm² in order to obtain the drift length required for the 20 V increase in the on-state breakdown voltage when the drift length is provided only in its semiconductor substrate.

In contrast, according to Example 13, the transistor cell size is 4.1×50 μm², and thus a 52% downsizing is achieved.

Example 14

In this example, the source and drain regions were formed in a buried semiconductor layer which is deposited similar to that described in Example 13, in such a manner that their upper surface were on the same level as the upper surface of the gate electrode (FIGS. 14(a) to 14(i)).

As shown in FIG. 14(a), isolation regions 1404 having a depth of 0.3 to 0.5 μm are formed on a P-type semiconductor substrate 1402 by known STI techniques.

Next, as shown in FIG. 14(b), phosphorous ions are implanted into P-type semiconductor substrate 1402 at a dose amount of $3.0 \times 10^{12}$ ions/cm² and an energy of 180 KeV, and at a dose amount of $3.0 \times 10^{12}$ ions/cm² and an energy of 80 KeV by known photolithography techniques with the channel region masked with a photoresist 1408, so as to form low concentration N-type diffusion layers 1412 and 1414 (drift regions in the semiconductor substrate) having an impurity concentration of about $3\times10^{17}$ cm$^{-3}$.

Then, as shown in FIG. 14(*c*), after forming a gate oxide film 1406 having a thickness of 40 nm, polysilicon is deposited by a CVD method so as to form a first polysilicon film 1409 having a thickness of 250 nm.

As shown in FIG. 14(*d*), a CVD oxide film 1433 as an insulating film is deposited over the semiconductor substrate.

Then, as shown in FIG. 14(*e*), the CVD film 1433 is etched by known photolithography techniques, so as to form openings 1442 and 1443 in such a manner as to expose the surface 1440 and the isolation regions 1404.

Then, as shown in FIG. 14(*f*), a second polysilicon film 1410 is deposited by a CVD method in such a manner as to fill the openings 1442 and 1443 with polysilicon.

Then, as shown in FIG. 14(*g*), the buried second polysilicon film 1410 and the CVD film 1433 are polished by a CMP method to be planarized so that the upper surfaces of the second buried polysilicon film 1410 and the first polysilicon film are on the same level.

Next, as shown in FIG. 14(*h*), arsenic ions are implanted at dose amount of $3.0\times10^{15}$ ions/cm$^2$ and an energy of 40 KeV, and then are activated by heat treatment so as to form high concentration N-type diffusion layers having an impurity concentration of about $1\times10^{21}$ cm$^{-3}$ in the buried polysilicon film and the first polysilicon film. The high concentration N-type diffusion layers 1428 and 1430 in the buried polysilicon film will act as a source region and a drain region, the high concentration N-type diffusion layer 1432 in the first polysilicon film will act as gate electrode.

Lastly, as shown in FIG. 14(*i*), a CVD oxide film 1434 is deposited and then contact holes are opened, and wiring metal material is patterned to form electrodes 1436 and 1438.

In the semiconductor device of Example 14, the source and drain regions are layered in the semiconductor layer so that the size including isolation regions is further miniaturized. For example, in order to obtain the same drift length as in a conventional semiconductor device having a transistor cell size of $5.4\times50$ μm$^2$, the transistor cell size in the semiconductor device of Example 14 is required to be $4.1\times50$ μm$^2$, and thus a 24% downsizing is achieved.

According to Example 14, it is also possible to further downsize the chip area since the upper surfaces of the source and drain regions are formed in such a manner as to be on the same level as the upper surface of the gate electrode, and thus the wiring is made on the upper surfaces optimally and efficiently Although the present invention is described as above, it also can be modified obviously by use of a variety of means, and such modifications do not depart the sprit and scope of the present invention. It is intended that all or any of those modifications that are obvious to a person of ordinary skill in the art fall within the scope of the appended claims.

This application relates to Japanese Patent Application No. 2005-344660 filed on Nov. 29, 2005, and No. 2006-81407 filed on Mar. 23, 2006, the contents of which are incorporated herein in its entirety herein by reference.

The invention claimed is:

1. A semiconductor device, comprising:
    an isolation region formed in a semiconductor substrate;
    an active region defined by the isolation region;
    a gate electrode formed within the active region on the semiconductor substrate, with a gate insulator interposed between the gate electrode and the semiconductor substrate;
    a channel region provided in the semiconductor substrate under the gate electrode;
    a source region and a drain region located on both sides of the gate electrode; and
    a drift region located between the channel region and the source region or the drain region,
    wherein at least one of the source region and the drain region is located at least in part on the isolation region, and connected to the channel region through the drift region.

2. The semiconductor device according to claim 1, wherein the at least one of the source region and the drain region located on the isolation region is provided in a semiconductor layer formed astride the isolation region and the active region.

3. The semiconductor device according to claim 2, wherein the at least one of the source region and the drain region located on the isolation region is formed from the entire semiconductor layer, and the drift region is provided in a surface layer of the semiconductor substrate within the active region.

4. The semiconductor device according to claim 2, wherein the at least one of the source region and the drain region is located in a portion of the semiconductor layer, the portion being located on or over the isolation region, and the drift region is provided in the semiconductor layer and in a surface layer of the semiconductor substrate within the active region.

5. The semiconductor device according to claim 4, wherein the semiconductor layer, the at least one of the source region and the drain region located on the isolation region is provided on the drift region.

6. The semiconductor device according to claim 5, wherein the semiconductor layer is from 600 nm to 2,000 nm in thickness.

7. The semiconductor device according to claim 5, wherein the semiconductor layer is from 600 nm to 1,100 nm in thickness.

8. The semiconductor device according to claim 5, wherein the semiconductor layer is a polysilicon layer.

9. The semiconductor device according to claim 4, further comprising a low resistance region which is in contact with the drift region provided in the semiconductor layer, and with the drift region provided in the surface layer of the semiconductor substrate within the active region.

10. The semiconductor device according to claim 9, wherein the low resistance region is a layer of metal, or silicide or nitride thereof.

11. The semiconductor device according to claim 10, wherein the low resistance region is a layer of aluminium, cobalt, chromium, molybdenum, nickel, palladium, tantalum, tungsten, titanium, vanadium or zirconium, or a layer of cobalt silicide, chromium silicide, molybdenum silicide, nickel silicide, palladium silicide, tantalum silicide, tungsten silicide, titanium silicide, vanadium silicide or zirconium silicide, or a layer of molybdenum nitride, tantalum nitride, tungsten nitride, titanium nitride or zirconium nitride, or a multilayer of two or more of the aforesaid layers.

12. The semiconductor device according to claim 9, wherein the low resistance region is a high concentration impurity diffusion layer.

13. The semiconductor device according to claim 12, wherein the high concentration impurity diffusion layer constituting the low resistance region is formed by implanting impurities into the surface layer of the semiconductor substrate through the semiconductor layer.

14. The semiconductor device according to claim 12, wherein the high concentration impurity diffusion layer constituting the low resistance region is a high concentration impurity diffusion layer that is formed at least in the semiconductor substrate.

15. The semiconductor device according to claim 12, wherein the low resistance region is equal in impurity concentration to the at least one of the source region and the drain region located on the isolation region.

16. The semiconductor device according to claim 1, wherein the gate electrode is made of a semiconductor, and is equal in impurity concentration to the at least one of the source region and the drain region located on the isolation region.

17. The semiconductor device according to claim 1, wherein the at least one of the source region and the drain region located on the isolation region, and the gate electrode are formed by processing a single layer of a semiconductor film that is formed on the isolation region and the active region.

18. The semiconductor device according to claim 1, wherein the at least one of the source region and the drain region located on the isolation region has an upper surface on the same level as an upper surface of the gate electrode.

19. The semiconductor device according to claim 2, wherein the semiconductor layer covers at least one of both ends of the gate electrode, with an insulating film interposed therebetween.

20. The semiconductor device according to claim 1, wherein the at least one of the source region and the drain region located on the isolation region is formed by processing a single layer of a semiconductor film that is formed on the isolation region and the active region, with the gate electrode covered with the semiconductor film.

21. The semiconductor device according to claim 1, further comprising an interlayer insulator on the source region and the drain region, with a contact hold provided through the interlayer insulator.

22. The semiconductor device according to claim 21, wherein the contact hole is provided onto a portion of the at least one of the source region and the drain region, the portion being located on the isolation region.

23. The semiconductor device according to claim 4, wherein the gate electrode is formed on the semiconductor layer so as to be extended over at least one of the isolation regions in the gate length direction, with an insulating film interposed between the gate electrode and the semiconductor layer, and wherein the semiconductor device further comprises an interlayer insulator on the gate electrode, and a contact hole is provided onto the gate electrode on the isolation region.

24. The semiconductor device according to claim 1, wherein the at least one of the source region and the drain region on the isolation region is composed of a polysilicon layer.

25. The semiconductor device according to claim 1, wherein the gate electrode is composed of a polysilicon layer.

26. The semiconductor device according to claim 1, which further comprising a low voltage transistor on the semiconductor substrate.

* * * * *